(12) United States Patent
Kurosawa et al.

(10) Patent No.: US 7,675,153 B2
(45) Date of Patent: Mar. 9, 2010

(54) SEMICONDUCTOR DEVICE HAVING SEMICONDUCTOR CHIPS STACKED AND MOUNTED THEREON AND MANUFACTURING METHOD THEREOF

(75) Inventors: Tetsuya Kurosawa, Yokohama (JP); Junya Sagara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 11/344,063

(22) Filed: Feb. 1, 2006

(65) Prior Publication Data

US 2006/0175697 A1    Aug. 10, 2006

(30) Foreign Application Priority Data

Feb. 2, 2005   (JP)   .............. 2005-026698
Feb. 2, 2005   (JP)   .............. 2005-026699

(51) Int. Cl.
    *H01L 23/02*   (2006.01)
(52) U.S. Cl. .............. 257/686; 257/E25.006; 257/E25.013; 257/723
(58) Field of Classification Search ........ 257/685, 257/686
    See application file for complete search history.

(56) References Cited

U.S. PATENT DOCUMENTS

| 6,351,028 | B1 | 2/2002 | Akram |
| 6,383,837 | B1 | 5/2002 | Tsunashima |
| 6,759,745 | B2 | 7/2004 | Masumoto et al. |
| 6,777,797 | B2 * | 8/2004 | Egawa .................. 257/686 |
| 6,831,367 | B2 | 12/2004 | Sekine |
| 2003/0111720 | A1 * | 6/2003 | Tan et al. ............... 257/686 |
| 2004/0026768 | A1 * | 2/2004 | Taar et al. .............. 257/686 |
| 2004/0235234 | A1 | 11/2004 | Sawada et al. |
| 2005/0263869 | A1 * | 12/2005 | Tanaka et al. ............ 257/686 |

FOREIGN PATENT DOCUMENTS

| JP | 60-160645 | 8/1985 |
| JP | 10-70232 | 3/1988 |
| JP | 6-120419 | 4/1994 |
| JP | 5-63137 | 3/1999 |
| JP | 2953899 | 9/1999 |
| JP | 2004-303992 | 10/2004 |

OTHER PUBLICATIONS

Notice of Reasons for Rejection mailed Sep. 1, 2009 from the Japanese Patent Office, in counterpart Japanese Patent Application No. 2005-026698, and its English translation (4 pages).

* cited by examiner

*Primary Examiner*—Sue Purvis
*Assistant Examiner*—Krista Soderholm
(74) *Attorney, Agent, or Firm*—Finnegan, Henderson, Farabow, Garrett & Dunner, L.L.P.

(57) ABSTRACT

Chips are stacked and mounted on a circuit board having external connection electrodes and mounted thereon by wire bonding. At least one of the chips stacked on the chip includes overhung portions each of which has a start point inside bonding pads, is made thinner in a direction towards the outer periphery to an end point reaching the side wall and forms a space used to accommodate ball bonding portions between the overhung portion and the main surface of the chip arranged in the lower stage on a backside corresponding in position to the bonding pads, and insulating members formed to cover the overhung portions and prevent bonding wires of the chip arranged in the lower stage from being brought into contact with the upper-stage chip.

13 Claims, 66 Drawing Sheets

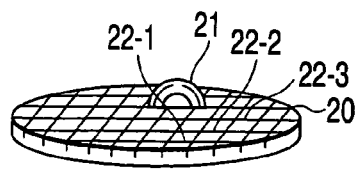 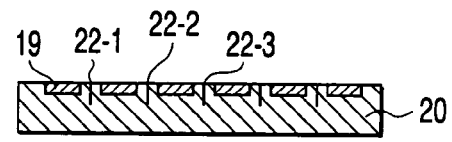
FIG. 4A　　　　　　FIG. 4B
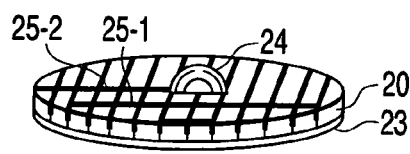 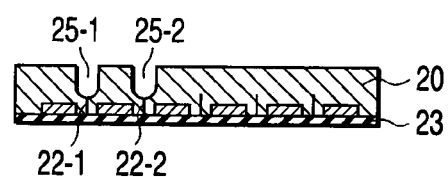
FIG. 5A　　　　　　FIG. 5B
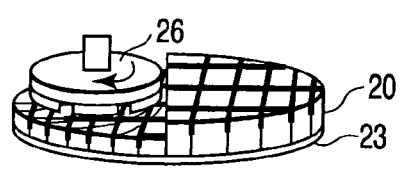 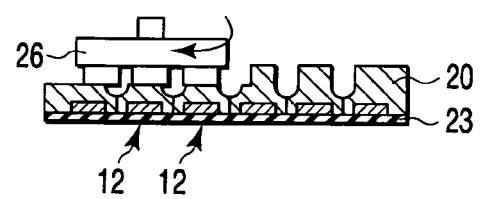
FIG. 6A　　　　　　FIG. 6B
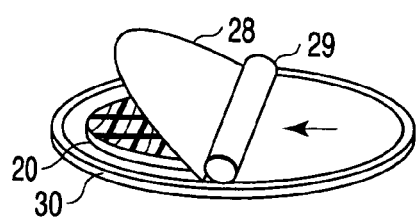 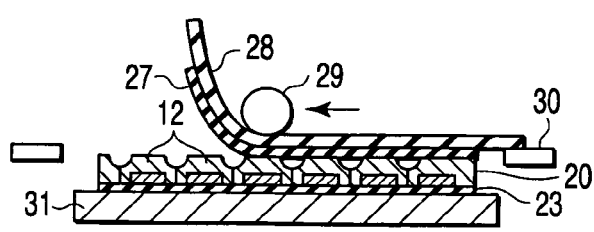
FIG. 7A　　　　　　FIG. 7B

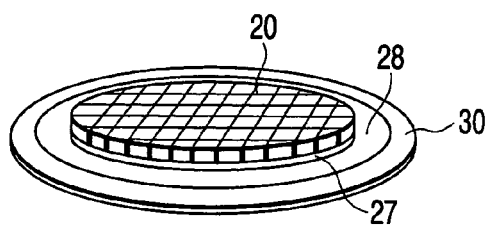
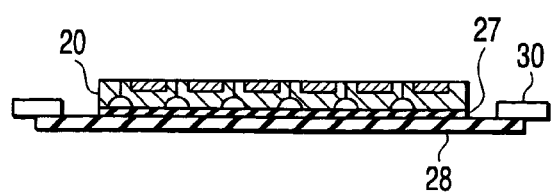
FIG. 8A  FIG. 8B
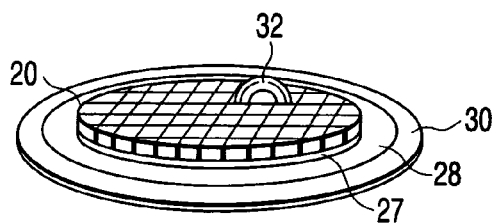
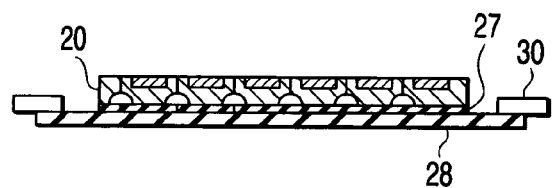
FIG. 9A  FIG. 9B
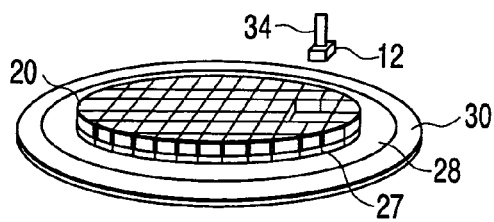
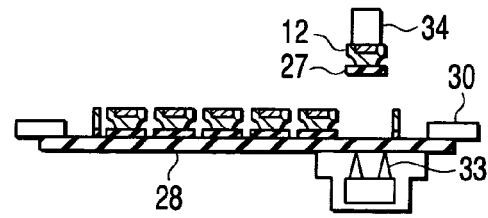
FIG. 10A  FIG. 10B
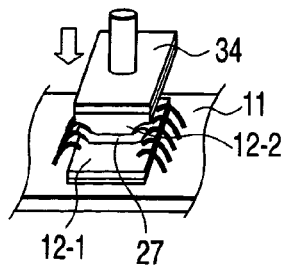
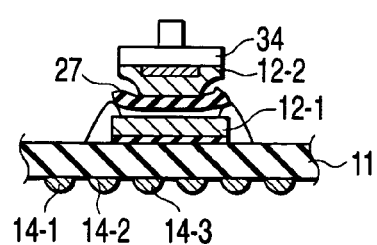
FIG. 11A  FIG. 11B

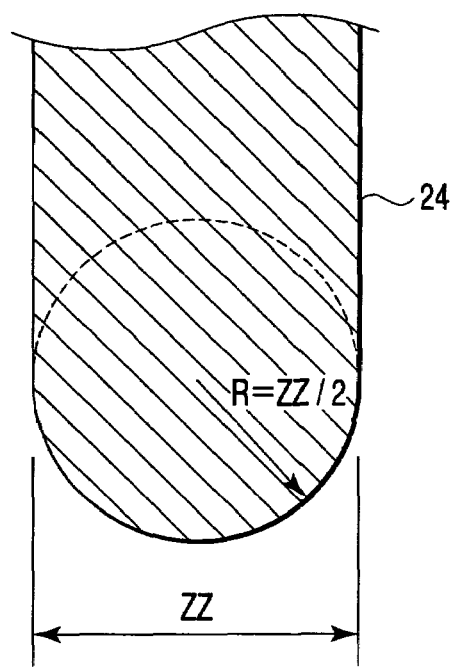
F I G. 14
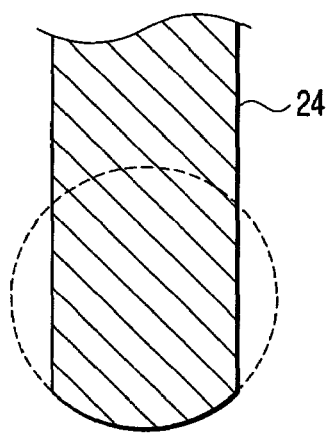
F I G. 15

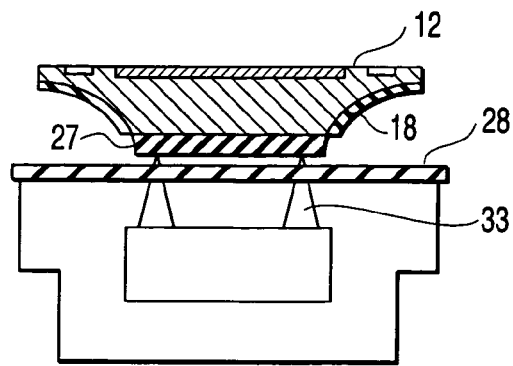
FIG. 18
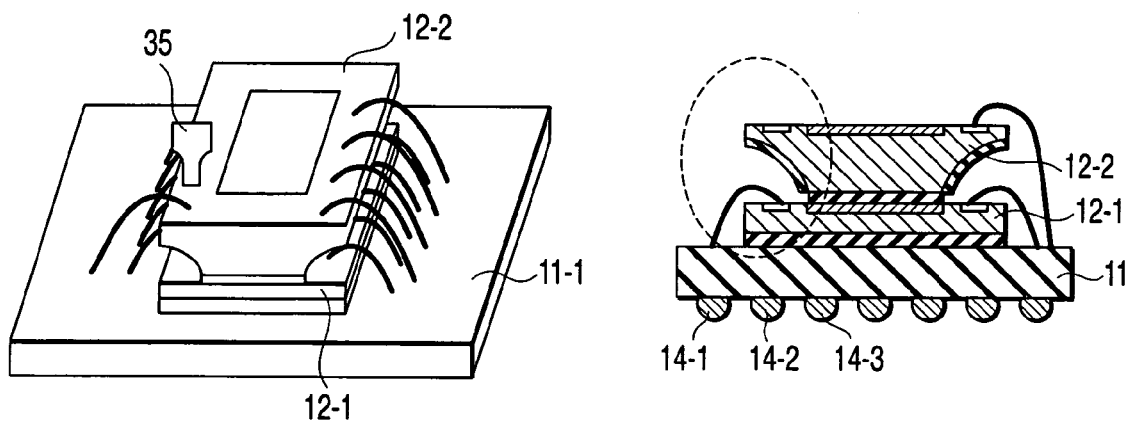
FIG. 19A
FIG. 19B
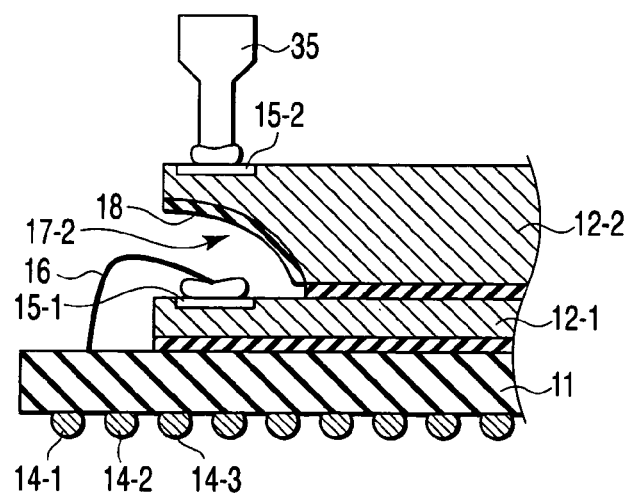
FIG. 19C

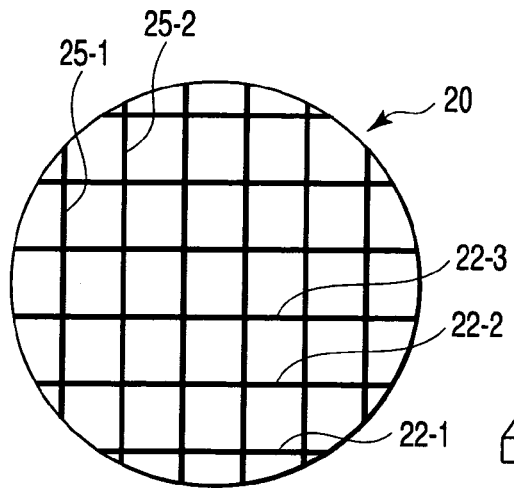
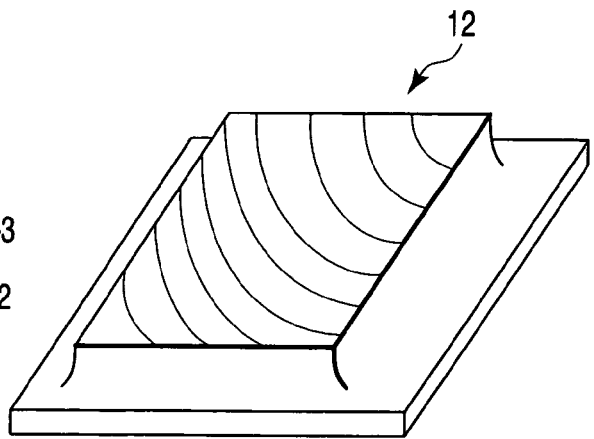
FIG. 33A    FIG. 33B
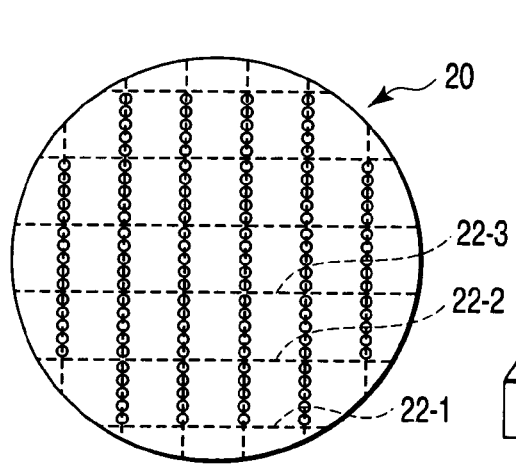
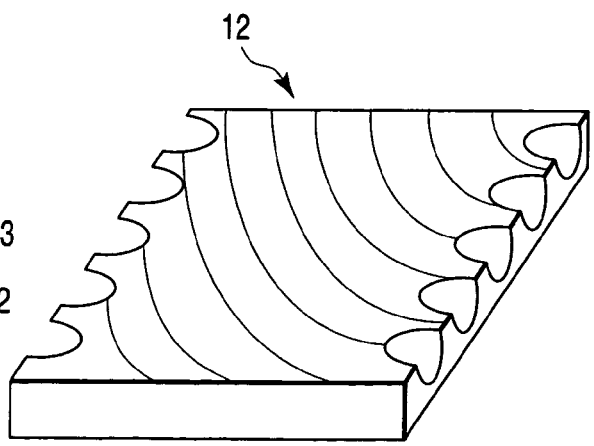
FIG. 34A    FIG. 34B

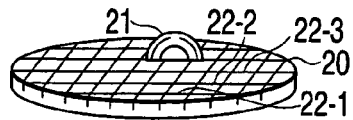 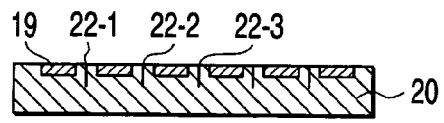
F I G. 4 2 A         F I G. 4 2 B
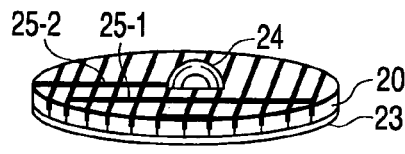 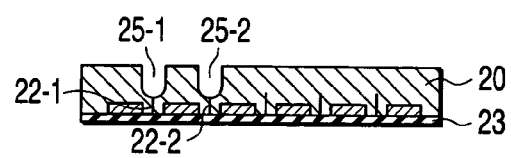
F I G. 4 3 A         F I G. 4 3 B
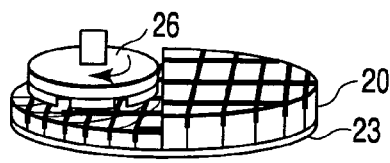 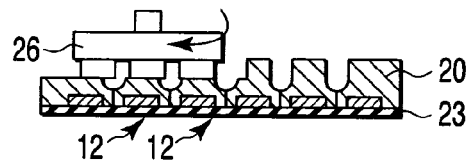
F I G. 4 4 A         F I G. 4 4 B
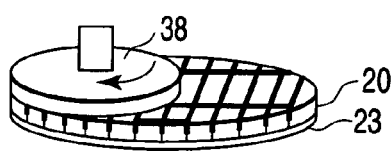 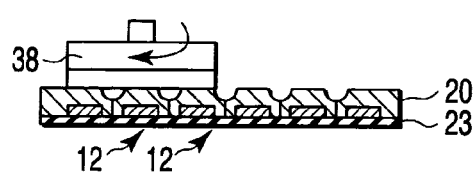
F I G. 4 5 A         F I G. 4 5 B
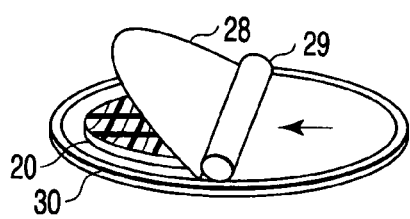 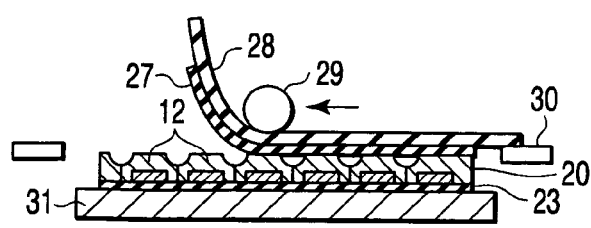
F I G. 4 6 A         F I G. 4 6 B

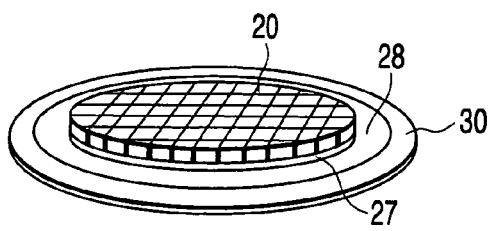 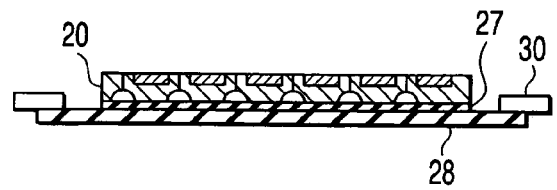
FIG. 47A    FIG. 47B
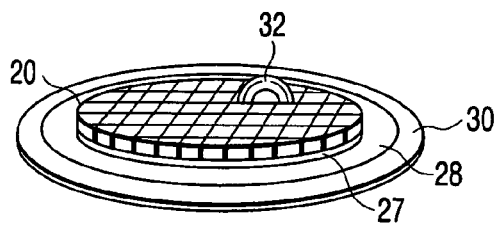 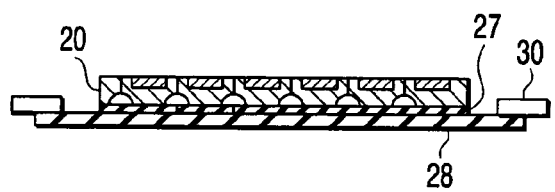
FIG. 48A    FIG. 48B
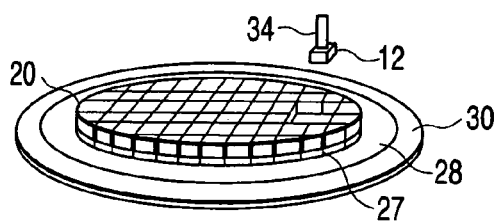 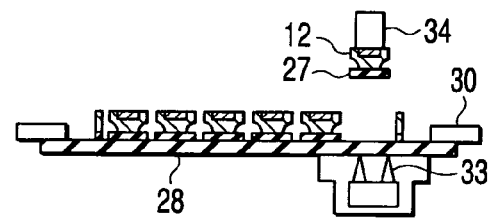
FIG. 49A    FIG. 49B
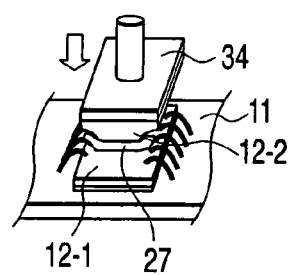 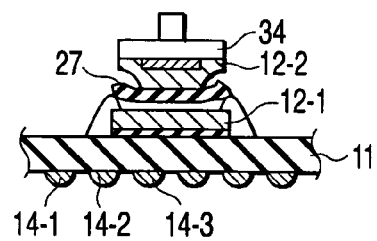
FIG. 50A    FIG. 50B

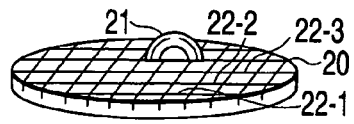
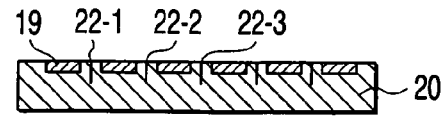
FIG. 51A   FIG. 51B
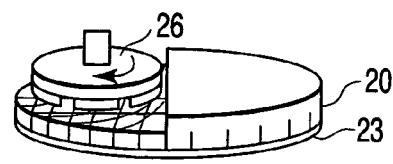
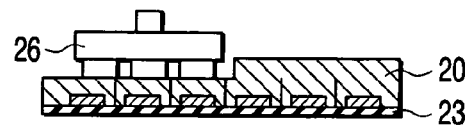
FIG. 52A   FIG. 52B
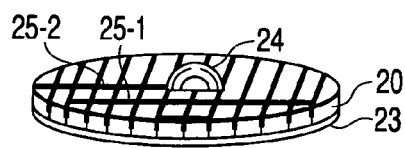
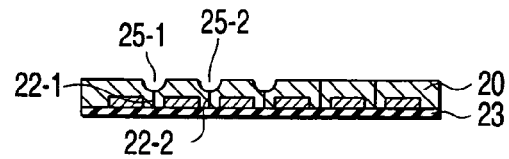
FIG. 53A   FIG. 53B
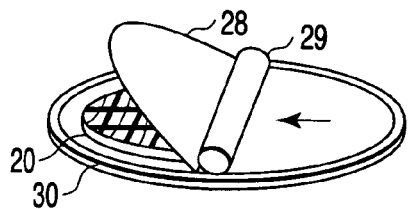
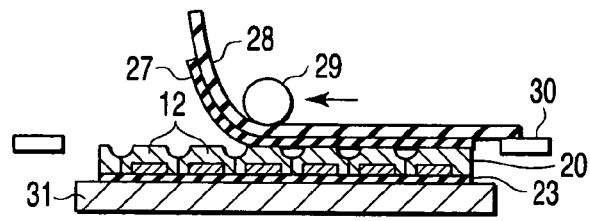
FIG. 54A   FIG. 54B

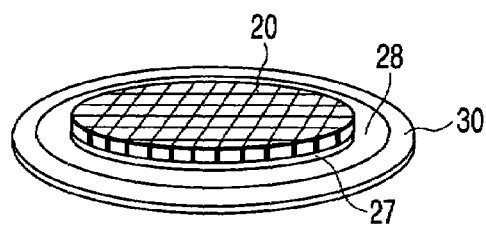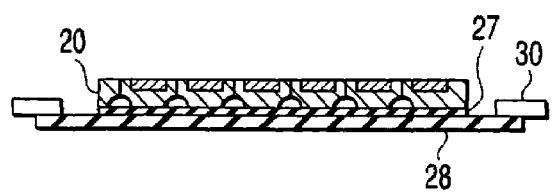
FIG. 55A  FIG. 55B
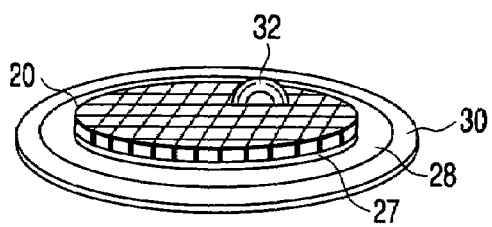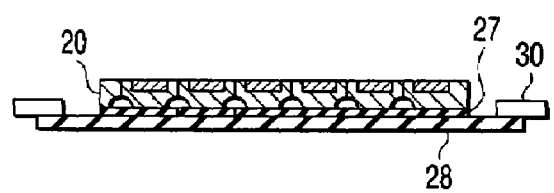
FIG. 56A  FIG. 56B
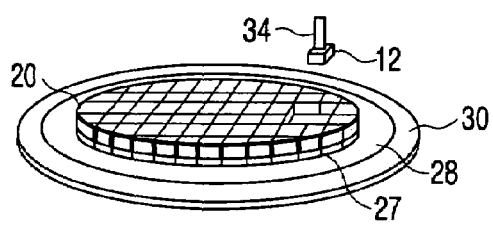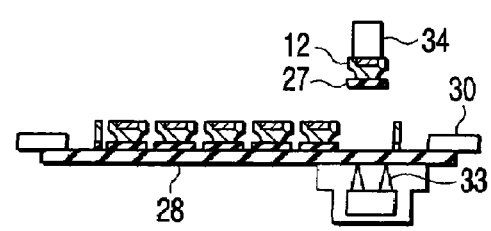
FIG. 57A  FIG. 57B
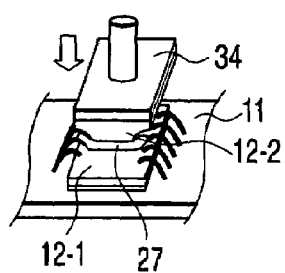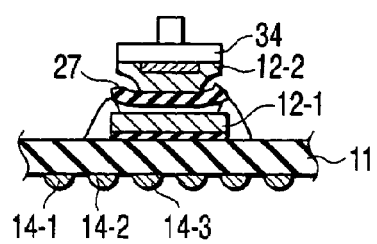
FIG. 58A  FIG. 58B

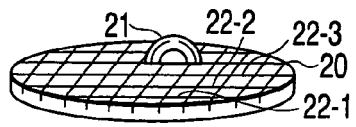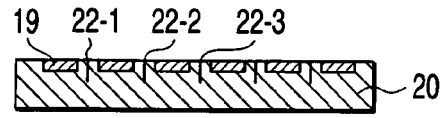
FIG. 59A    FIG. 59B
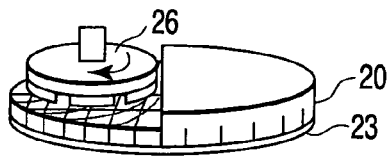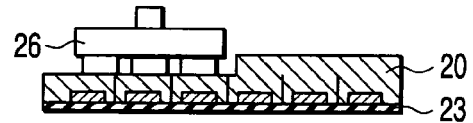
FIG. 60A    FIG. 60B
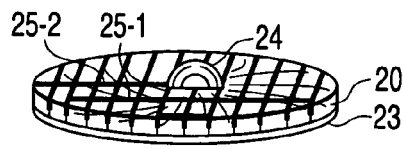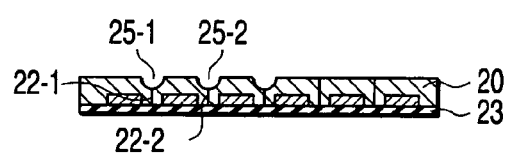
FIG. 61A    FIG. 61B
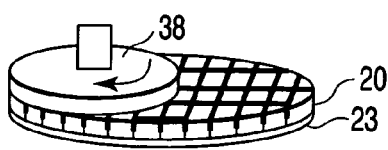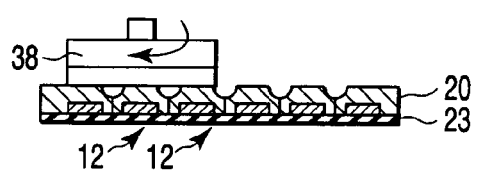
FIG. 62A    FIG. 62B
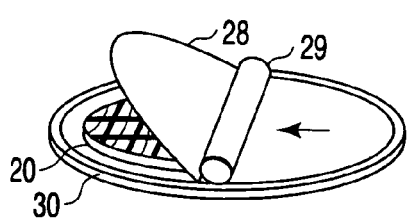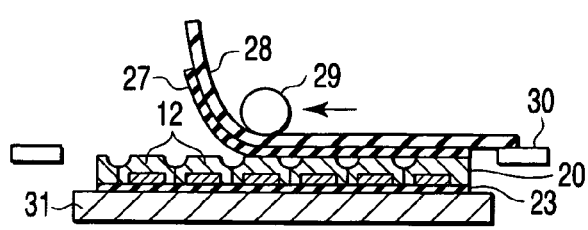
FIG. 63A    FIG. 63B

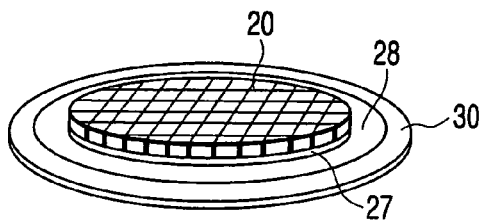 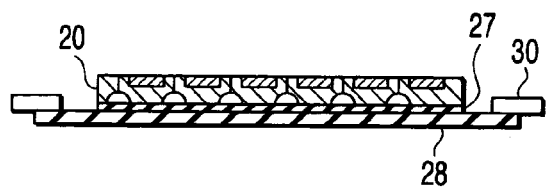
FIG. 64A  FIG. 64B
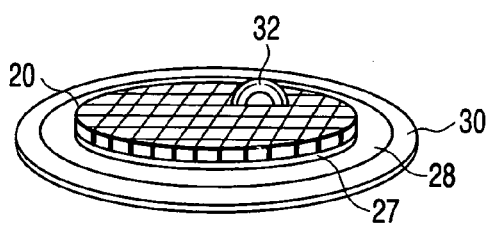 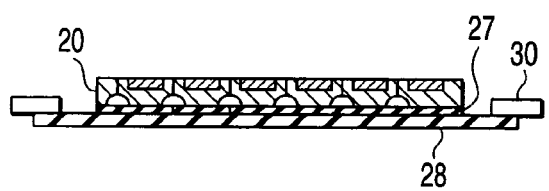
FIG. 65A  FIG. 65B
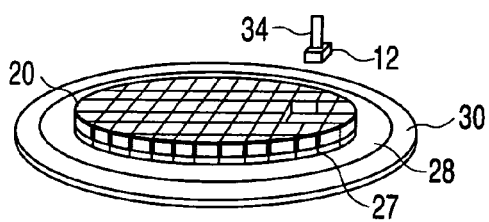 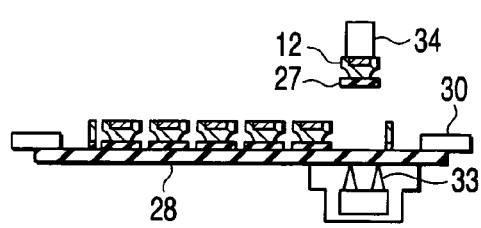
FIG. 66A  FIG. 66B
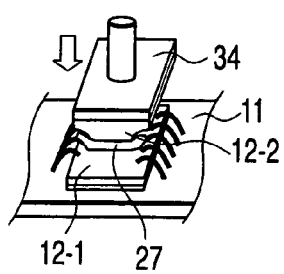 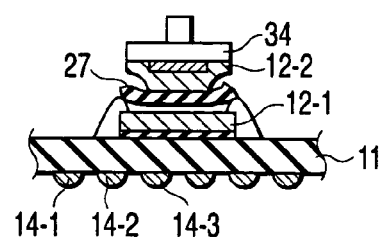
FIG. 67A  FIG. 67B

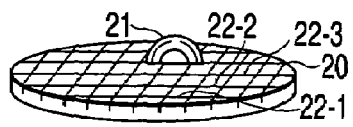 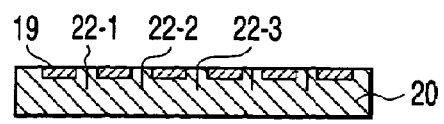
FIG. 68A　　　　　FIG. 68B
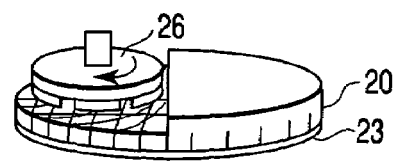 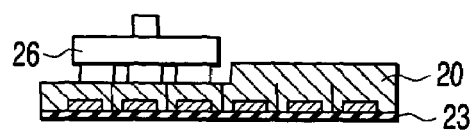
FIG. 69A　　　　　FIG. 69B
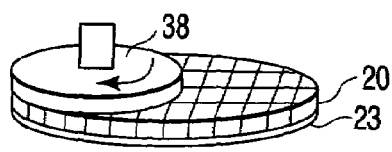 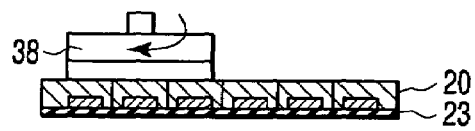
FIG. 70A　　　　　FIG. 70B
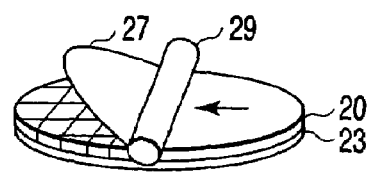 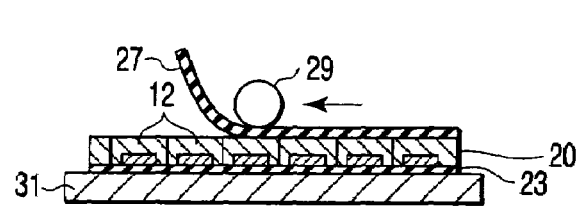
FIG. 71A　　　　　FIG. 71B
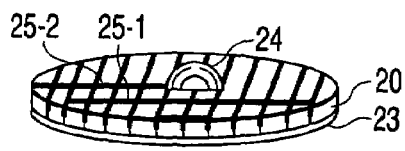 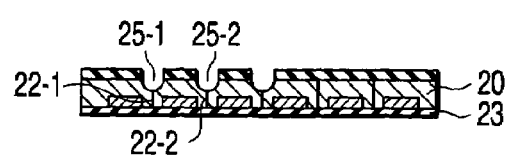
FIG. 72A　　　　　FIG. 72B

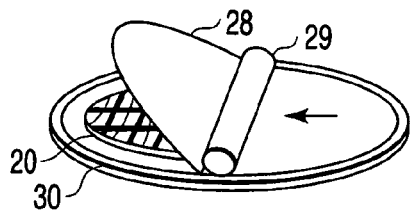
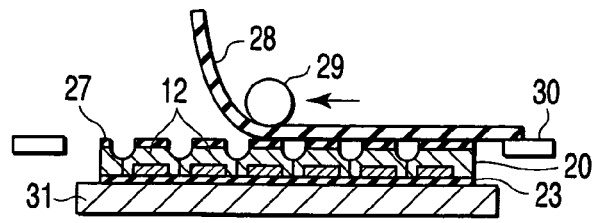
FIG. 73A  FIG. 73B
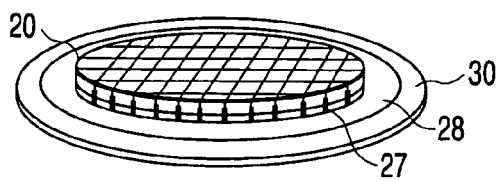
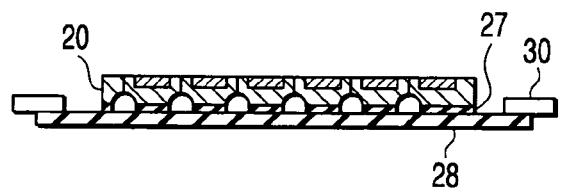
FIG. 74A  FIG. 74B
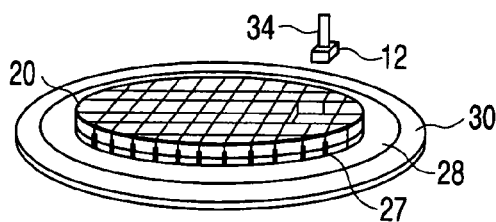
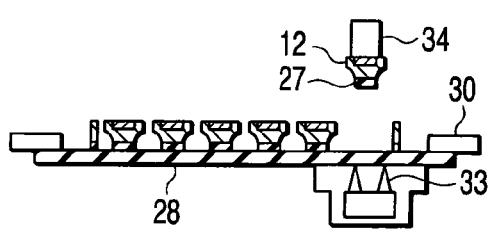
FIG. 75A  FIG. 75B
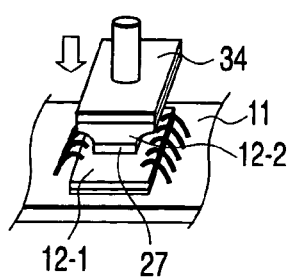
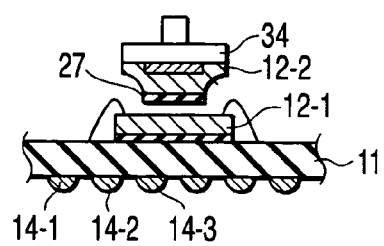
FIG. 76A  FIG. 76B

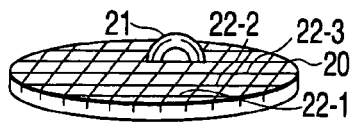
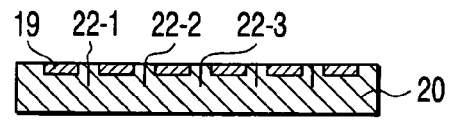
FIG. 77A   FIG. 77B
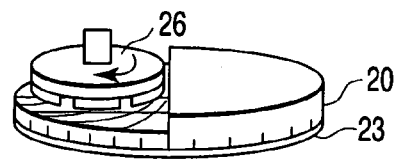
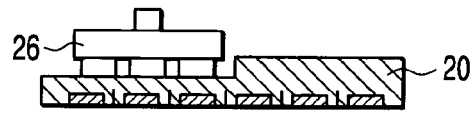
FIG. 78A   FIG. 78B
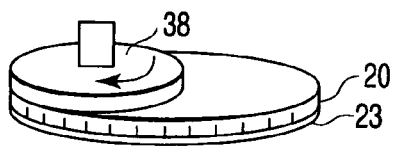
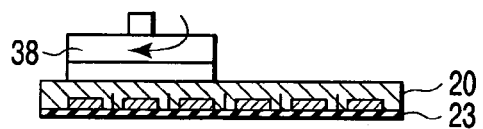
FIG. 79A   FIG. 79B
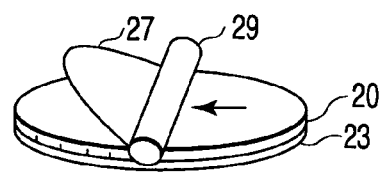
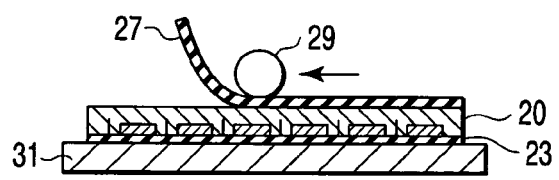
FIG. 80A   FIG. 80B
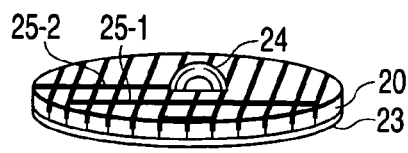
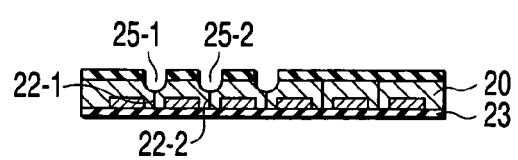
FIG. 81A   FIG. 81B

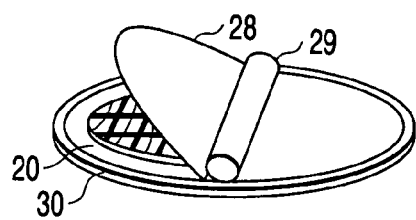
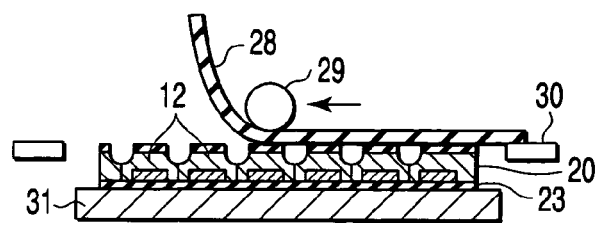
FIG. 82A  FIG. 82B
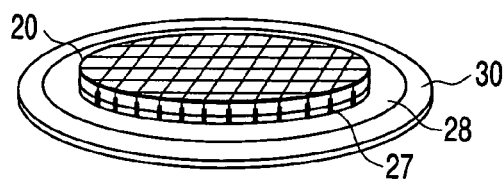
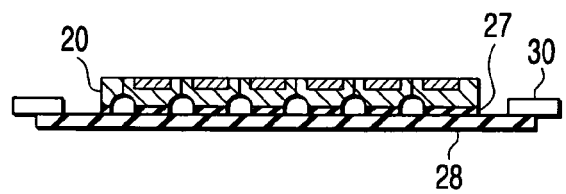
FIG. 83A  FIG. 83B
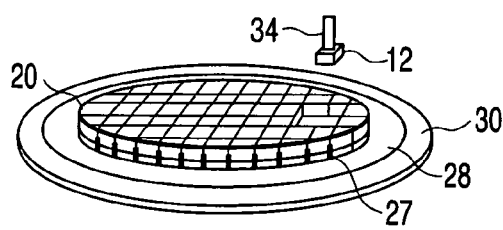
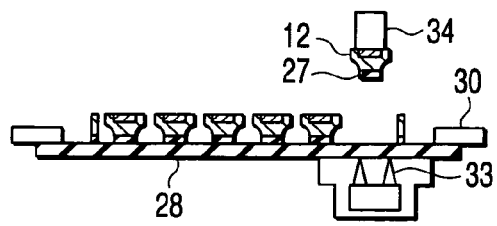
FIG. 84A  FIG. 84B
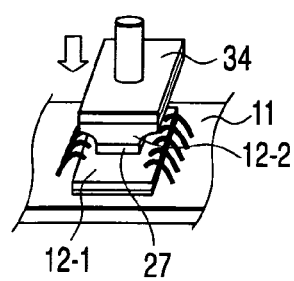
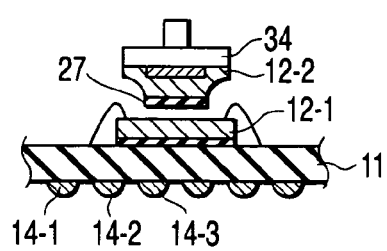
FIG. 85A  FIG. 85B

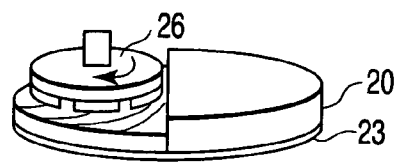
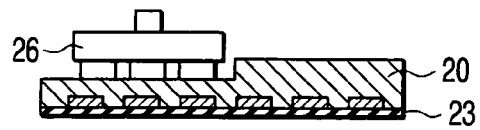
F I G. 8 6 A            F I G. 8 6 B
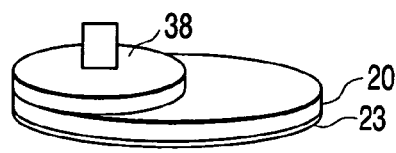
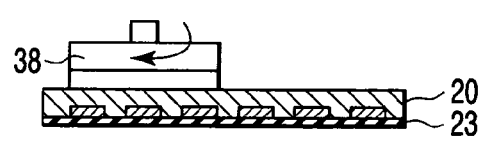
F I G. 8 7 A            F I G. 8 7 B
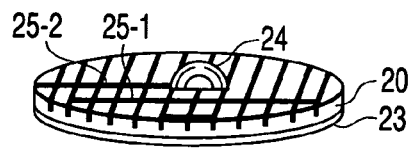
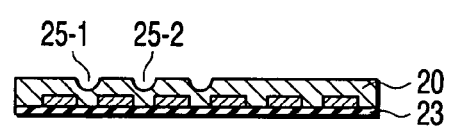
F I G. 8 8 A            F I G. 8 8 B
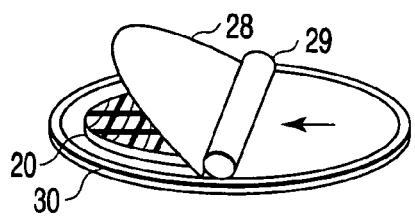
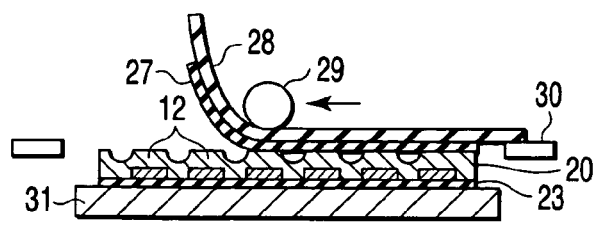
F I G. 8 9 A            F I G. 8 9 B

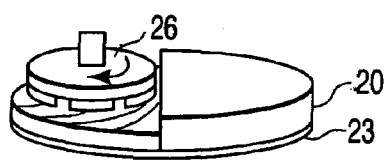 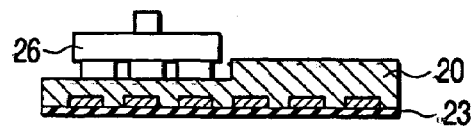
FIG.93A  FIG.93B
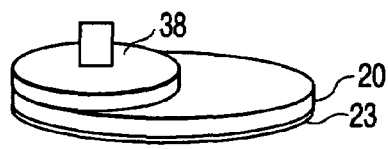 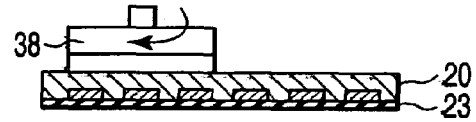
FIG.94A  FIG.94B
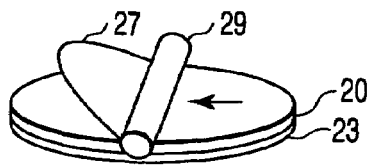 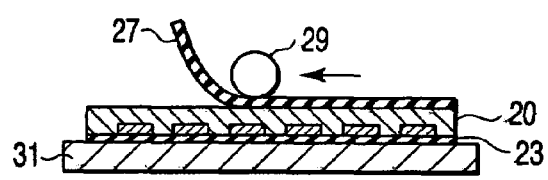
FIG.95A  FIG.95B
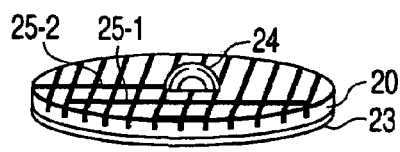 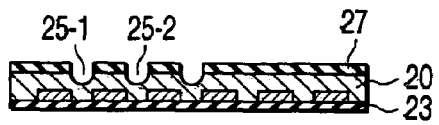
FIG.96A  FIG.96B

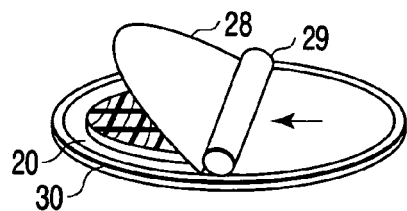 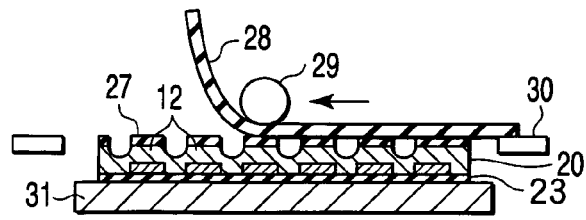
FIG. 97A                FIG. 97B
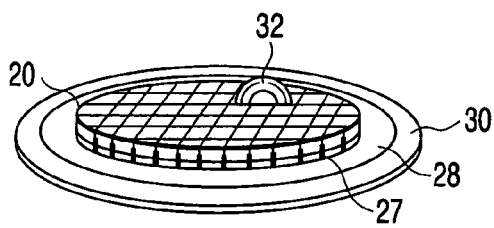 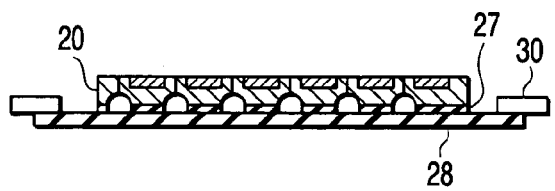
FIG. 98A                FIG. 98B
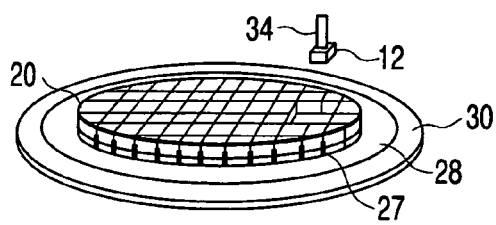 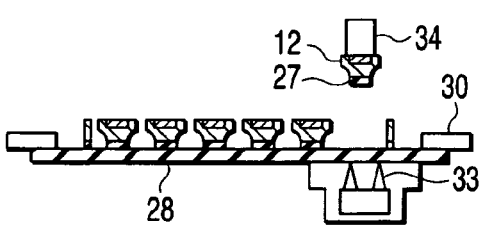
FIG. 99A                FIG. 99B
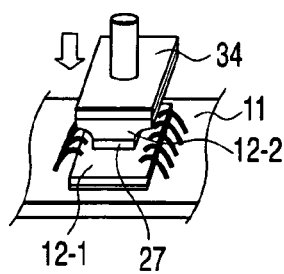 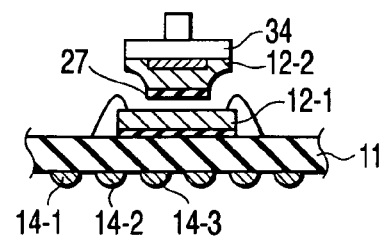
FIG. 100A               FIG. 100B

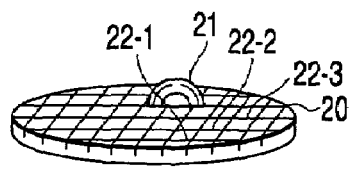
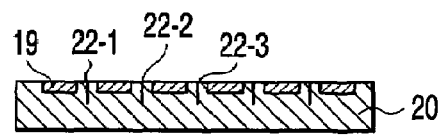
FIG. 101A        FIG. 101B
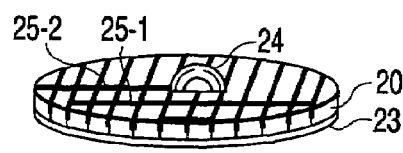
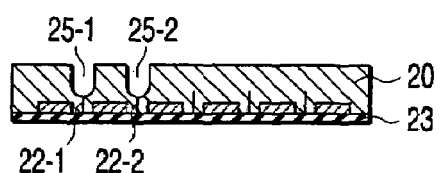
FIG. 102A        FIG. 102B
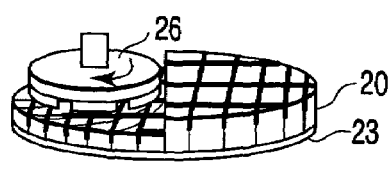
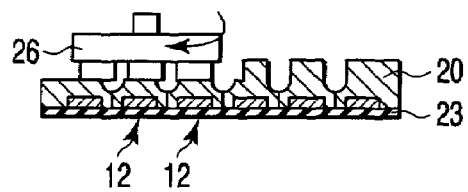
FIG. 103A        FIG. 103B
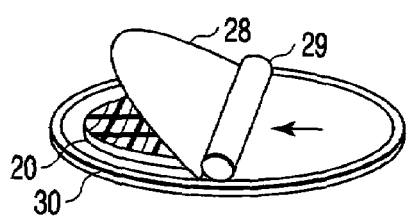
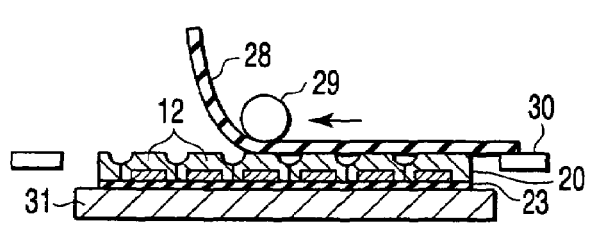
FIG. 104A        FIG. 104B

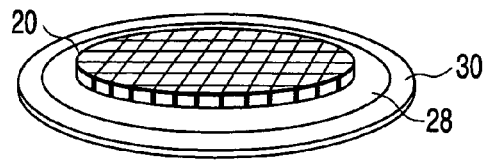
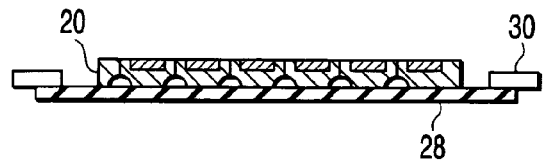
FIG.105A    FIG.105B
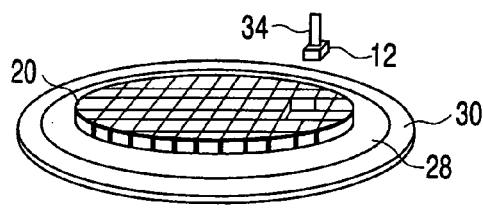
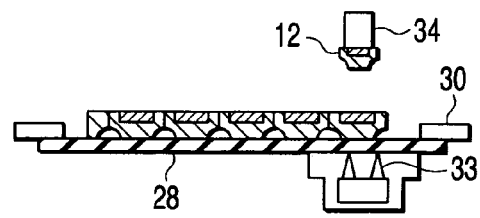
FIG.106A    FIG.106B
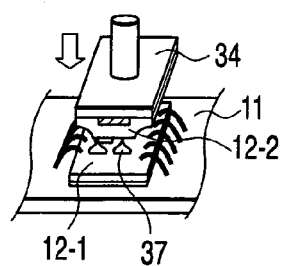
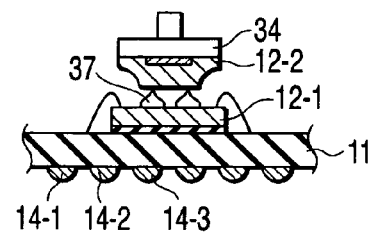
FIG.107A    FIG.107B

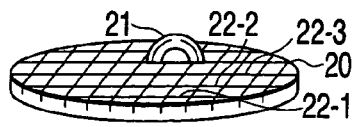
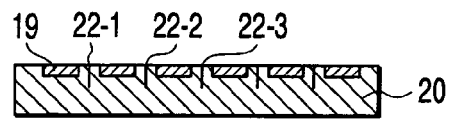
FIG. 108A  FIG. 108B
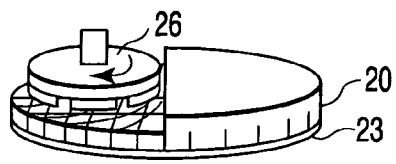
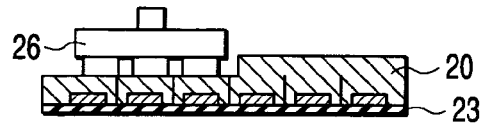
FIG. 109A  FIG. 109B
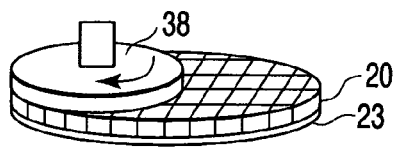
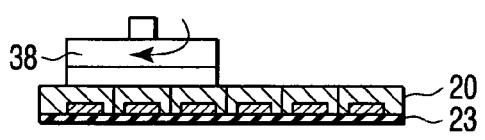
FIG. 110A  FIG. 110B
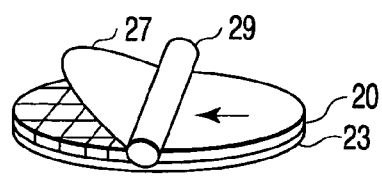
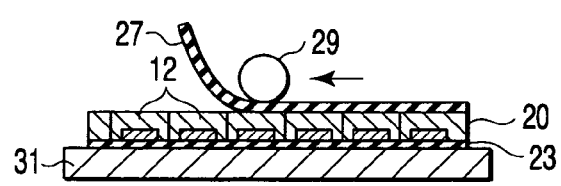
FIG. 111A  FIG. 111B
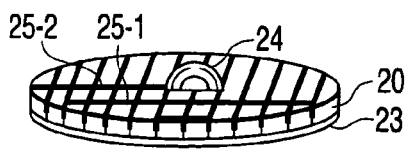
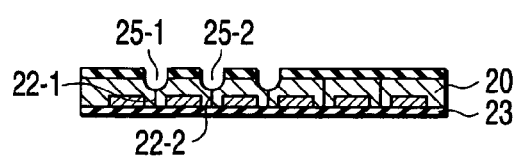
FIG. 112A  FIG. 112B

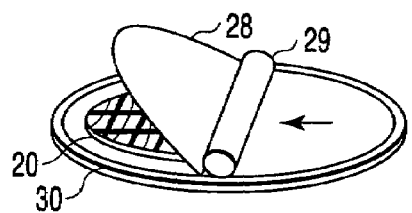
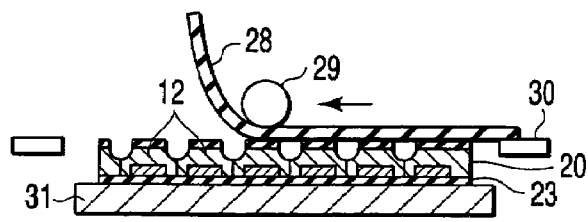
FIG. 113A    FIG. 113B
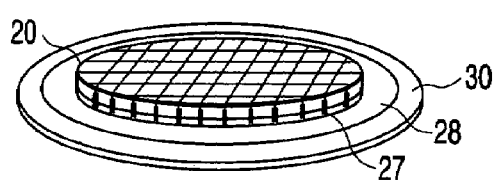
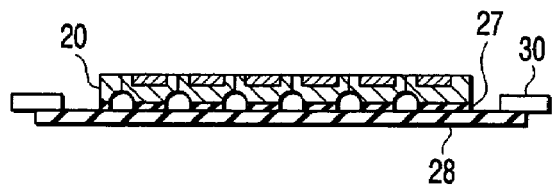
FIG. 114A    FIG. 114B
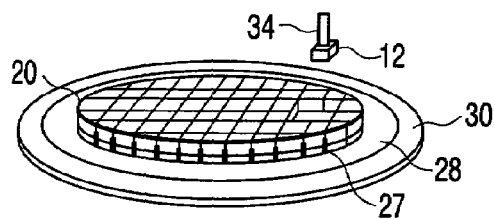
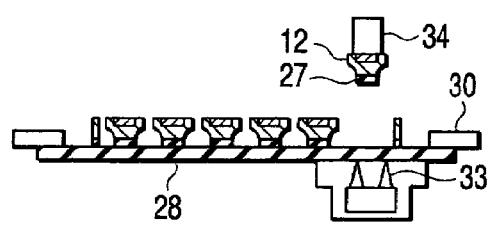
FIG. 115A    FIG. 115B
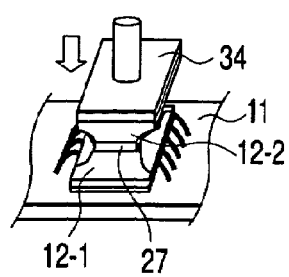
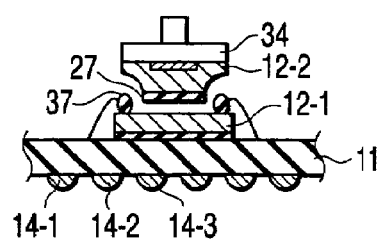
FIG. 116A    FIG. 116B

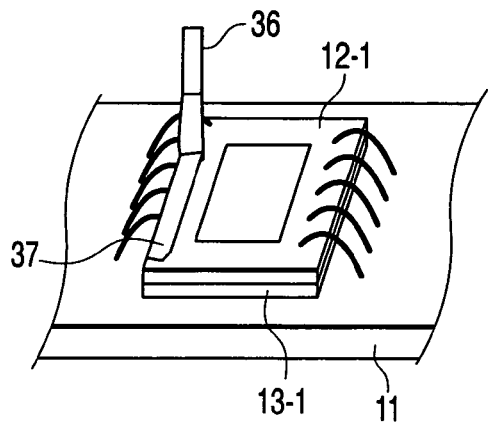
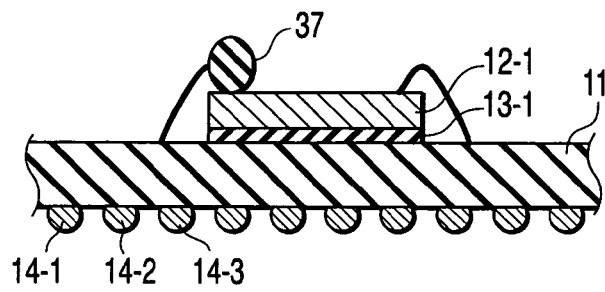
FIG. 117A          FIG. 117B
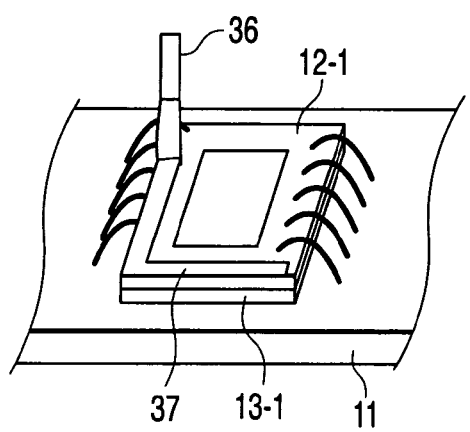
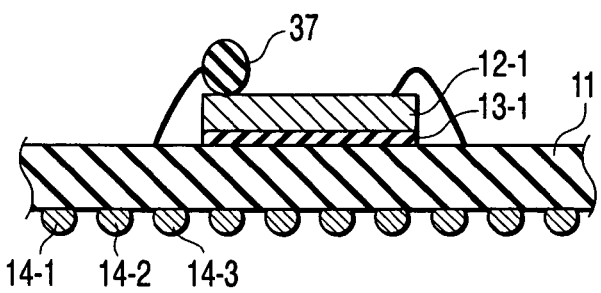
FIG. 118A          FIG. 118B

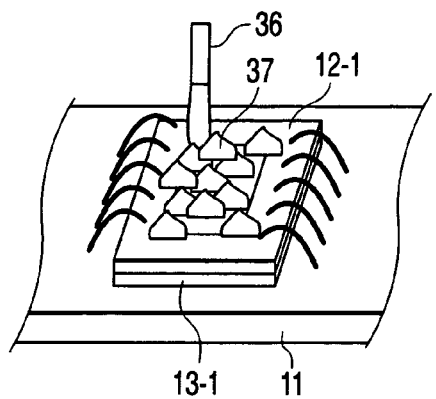 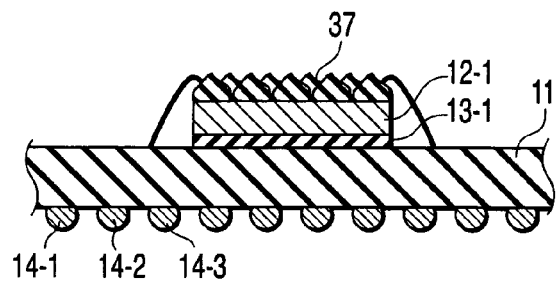
FIG. 119A  FIG. 119B
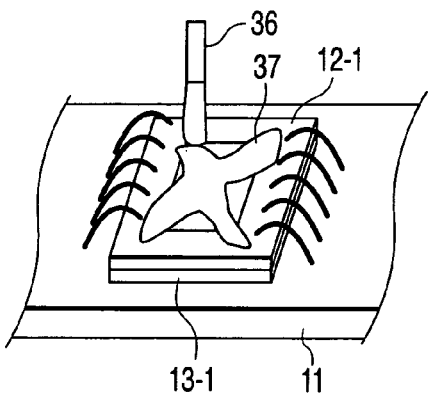 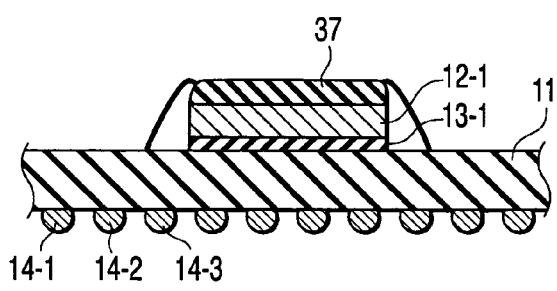
FIG. 120A  FIG. 120B
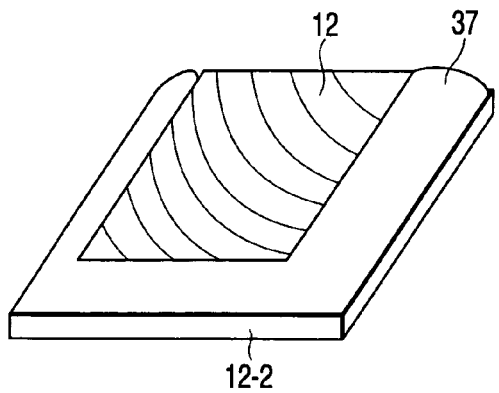 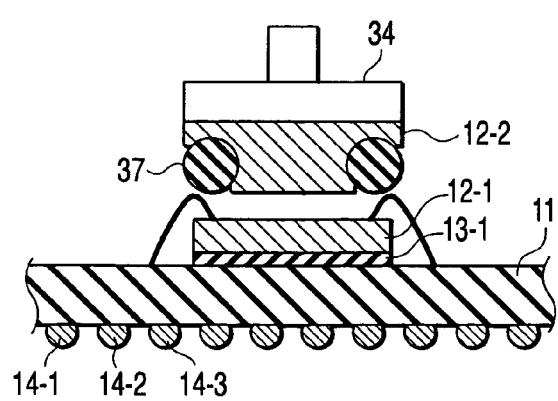
FIG. 121A  FIG. 121B

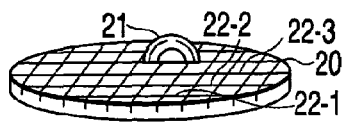
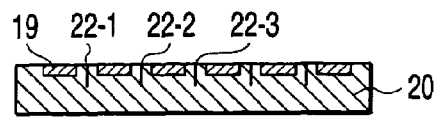
FIG.127A  FIG.127B
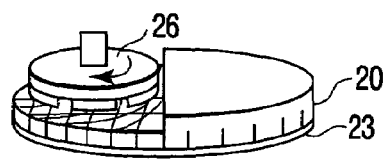
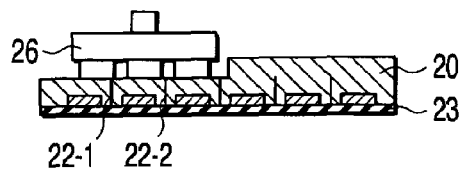
FIG.128A  FIG.128B
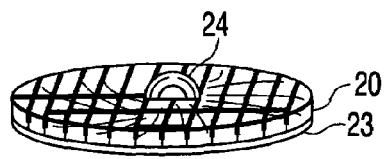
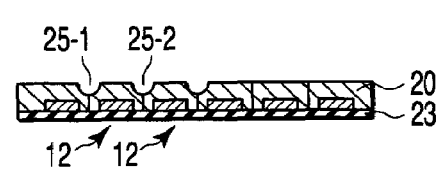
FIG.129A  FIG.129B
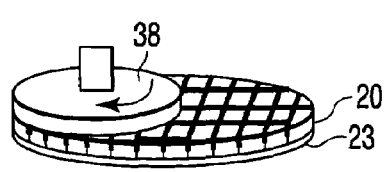
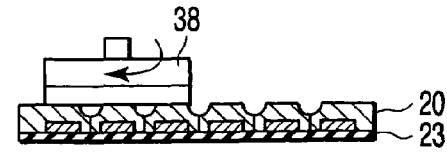
FIG.130A  FIG.130B

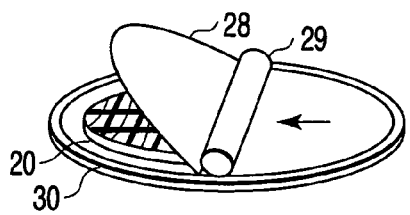 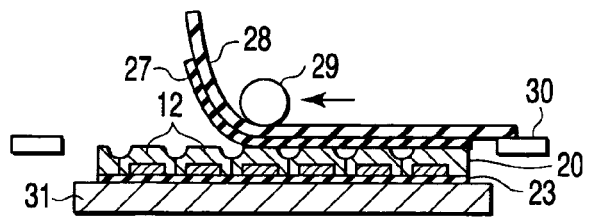
FIG. 131A  FIG. 131B
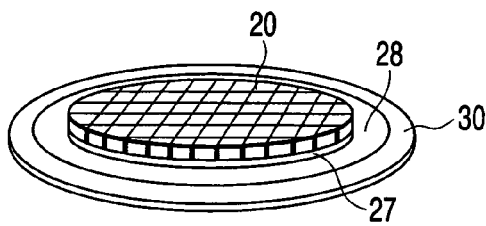 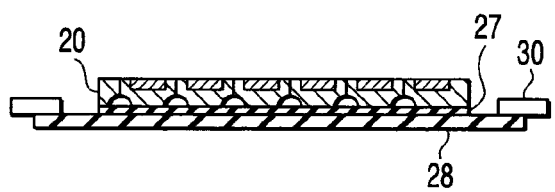
FIG. 132A  FIG. 132B
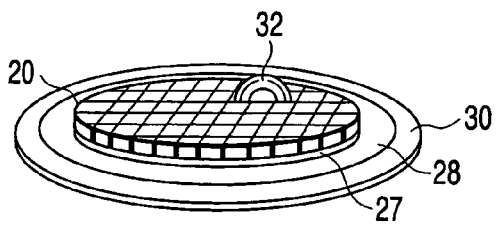 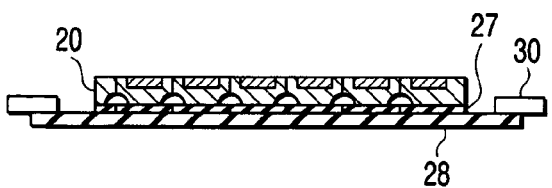
FIG. 133A  FIG. 133B
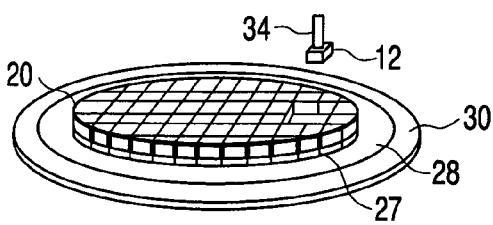 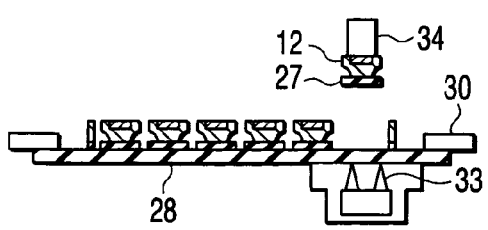
FIG. 134A  FIG. 134B

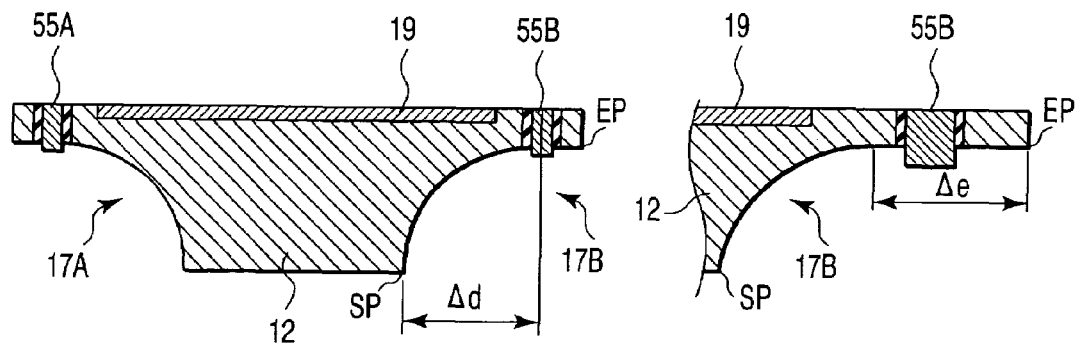
F I G. 137A     F I G. 137B
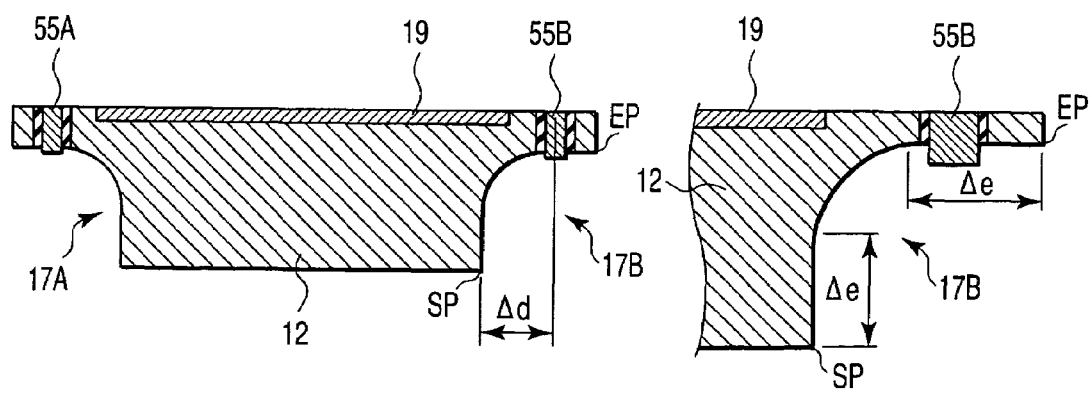
F I G. 138A     F I G. 138B

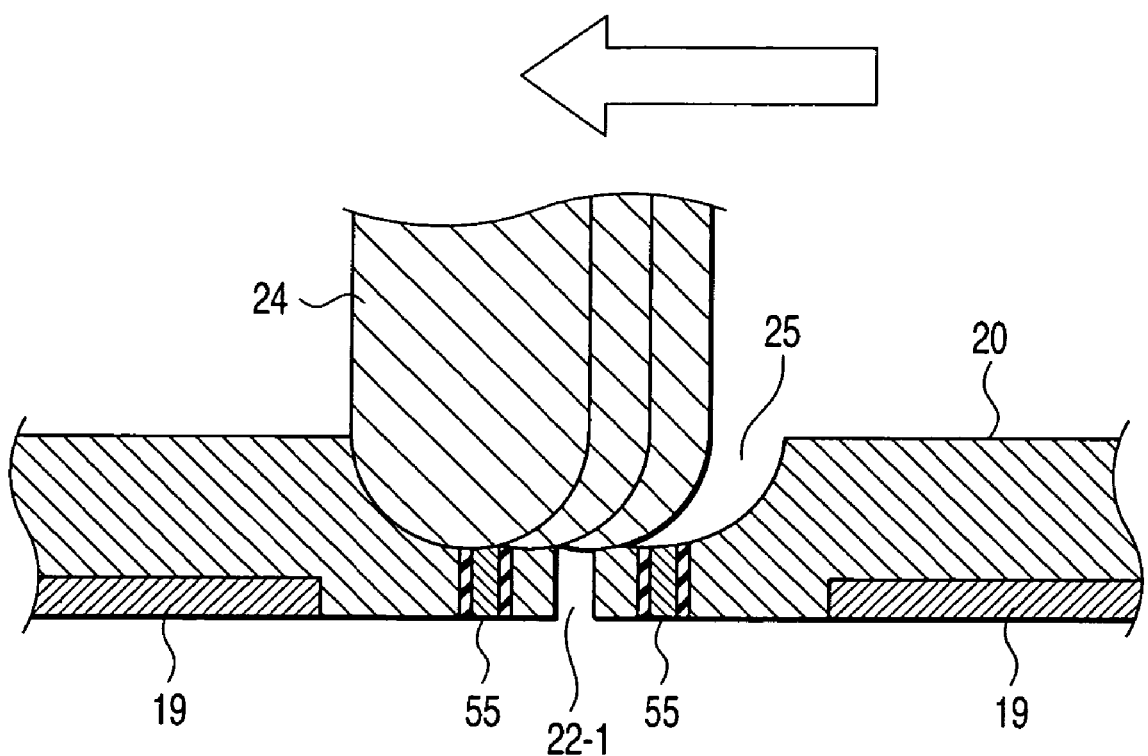
F I G. 1 3 9

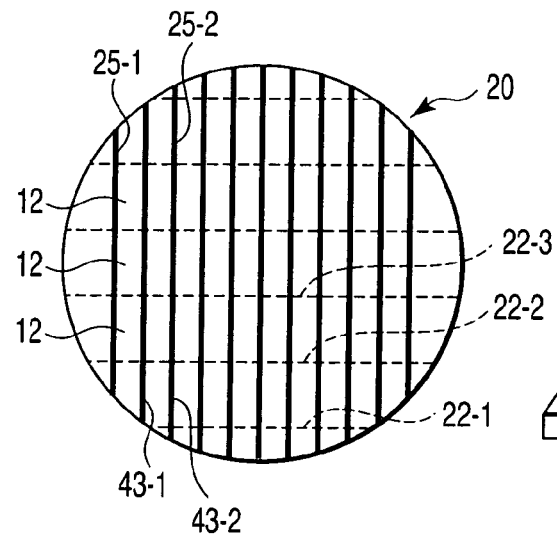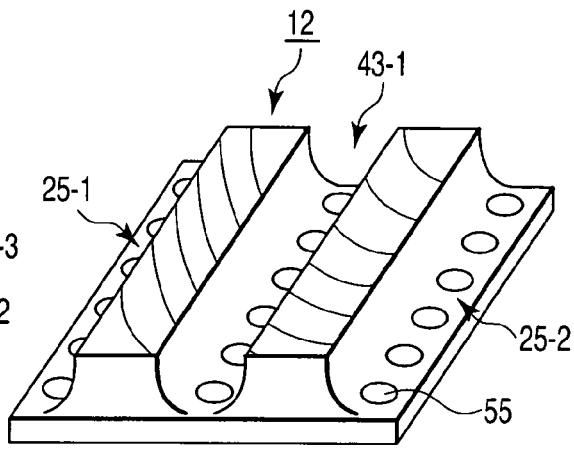
FIG. 142A  FIG. 142B
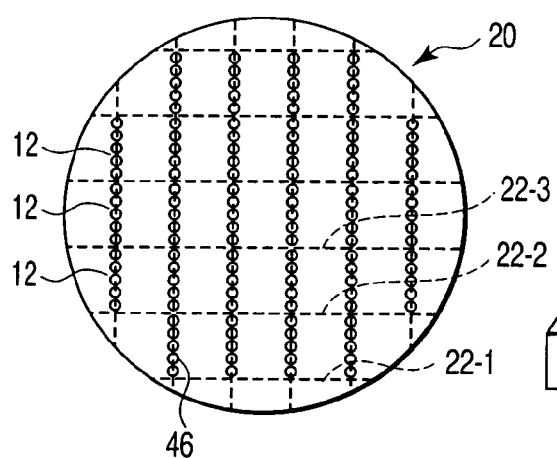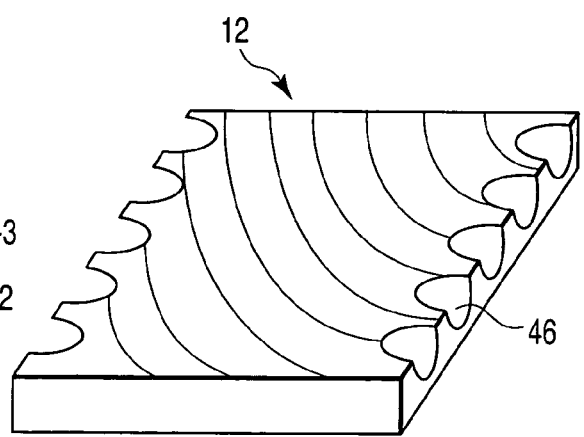
FIG. 143A  FIG. 143B

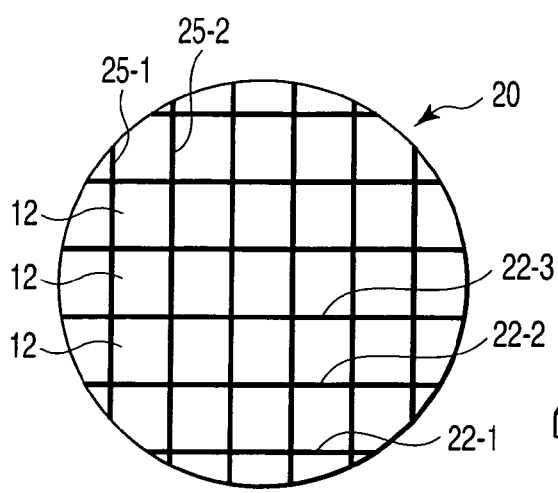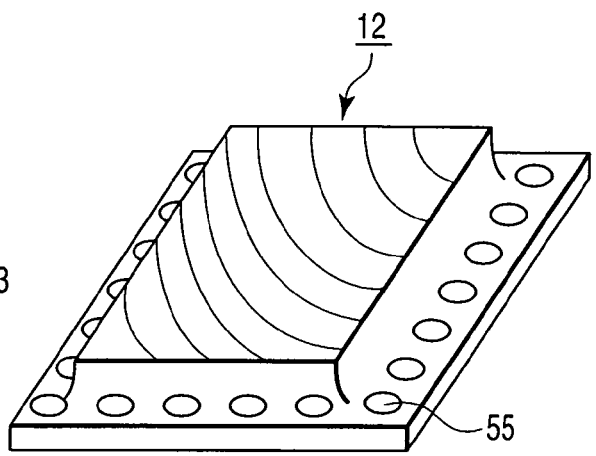
FIG.144A  FIG.144B
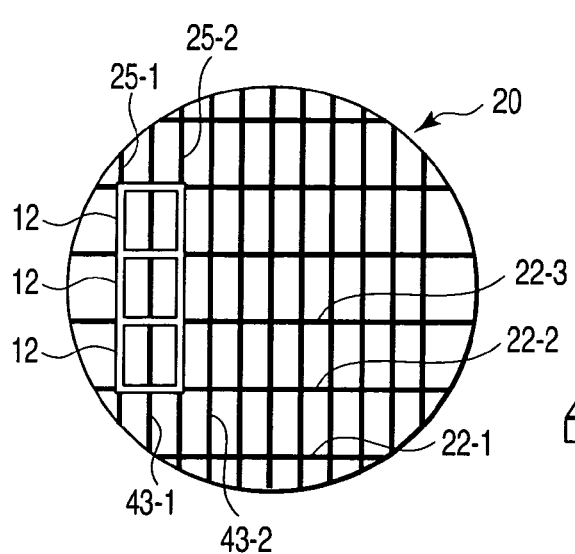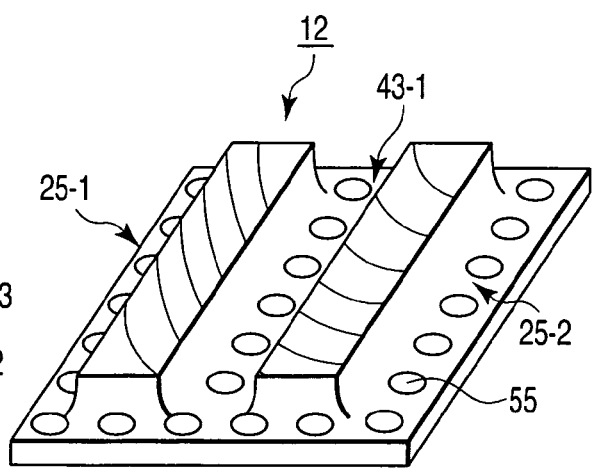
FIG.145A  FIG.145B

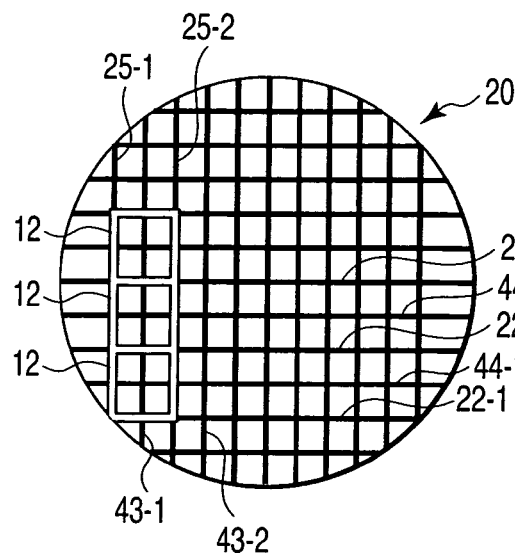 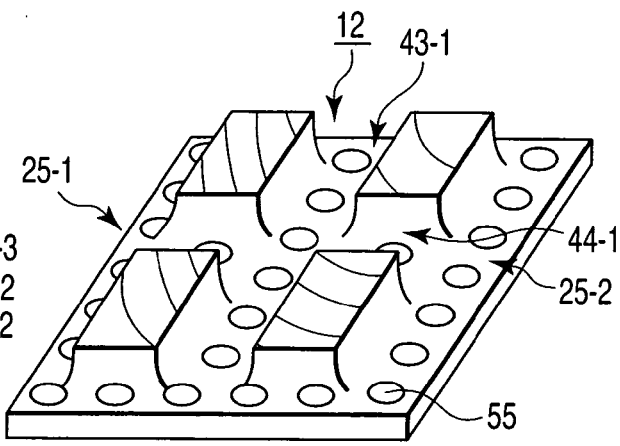
FIG. 146A  FIG. 146B
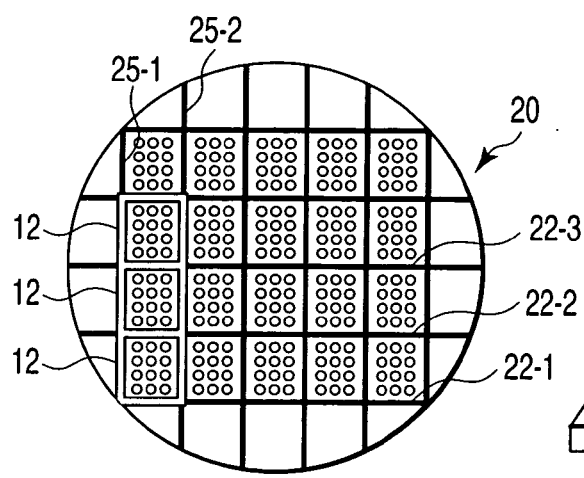 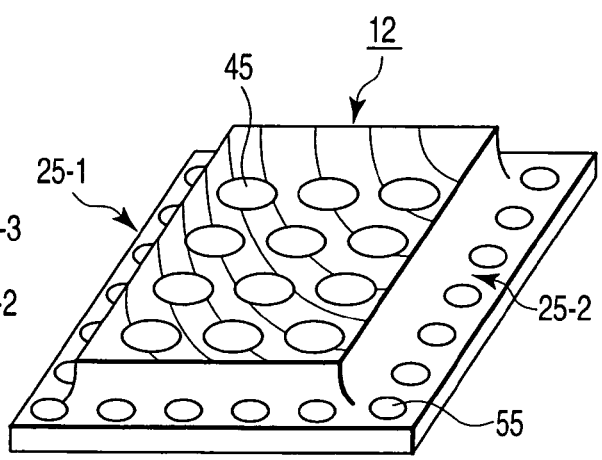
FIG. 147A  FIG. 147B

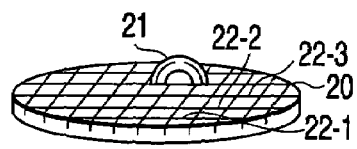 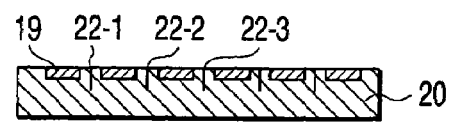
FIG. 173A  FIG. 173B
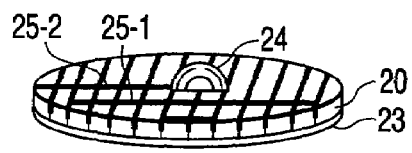 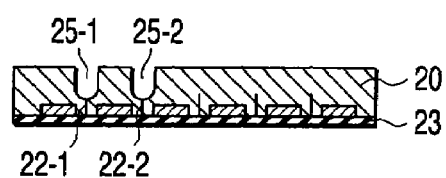
FIG. 174A  FIG. 174B
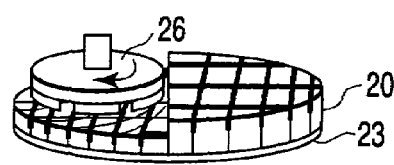 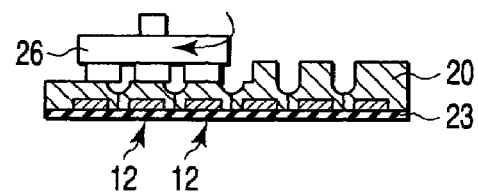
FIG. 175A  FIG. 175B
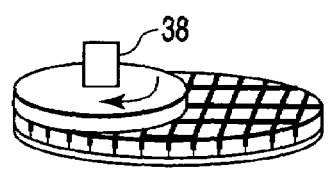 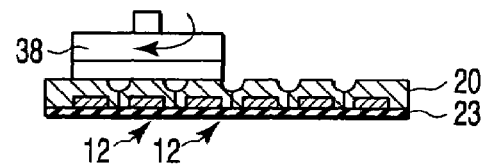
FIG. 176A  FIG. 176B

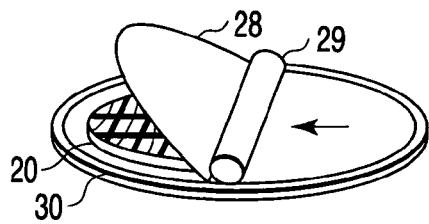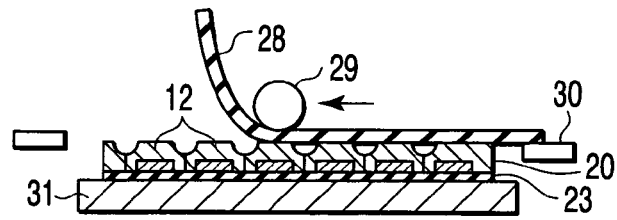
FIG. 177A  FIG. 177B
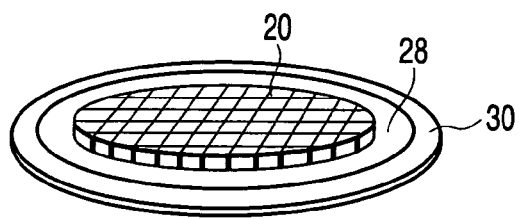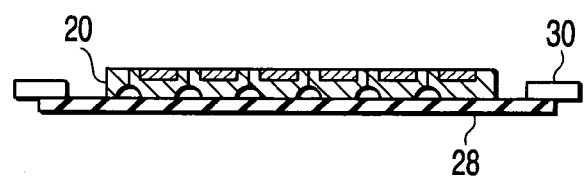
FIG. 178A  FIG. 178B
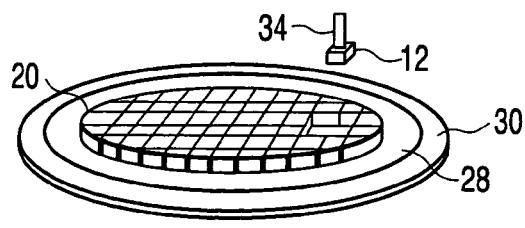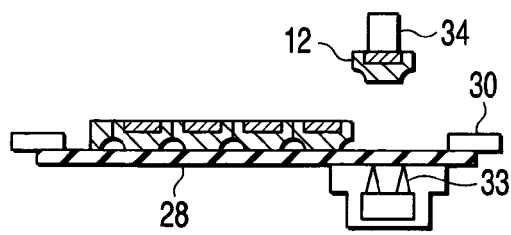
FIG. 179A  FIG. 179B

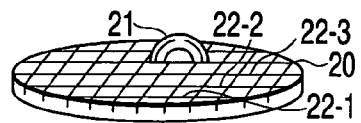
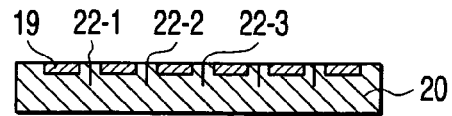
FIG. 180A
FIG. 180B
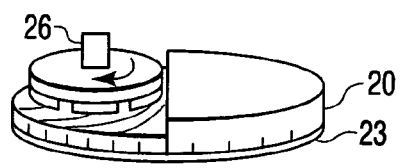
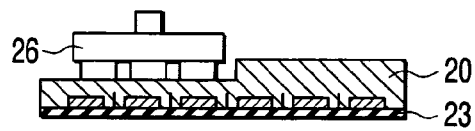
FIG. 181A
FIG. 181B
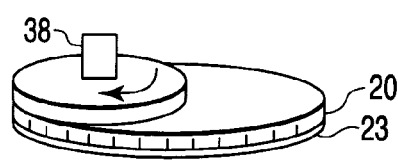
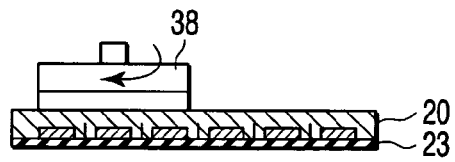
FIG. 182A
FIG. 182B
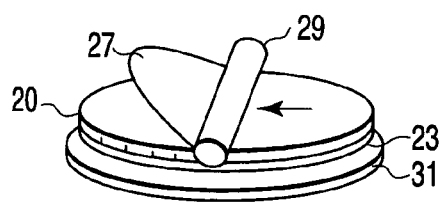
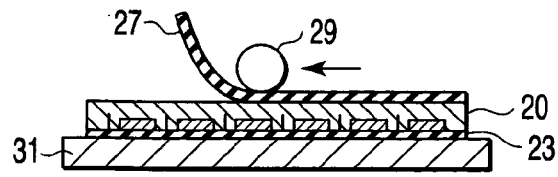
FIG. 183A
FIG. 183B

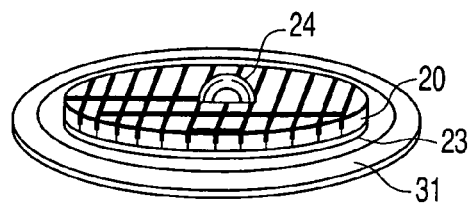 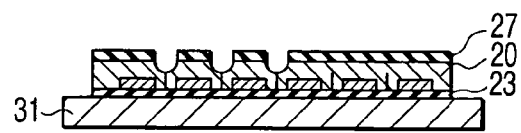
FIG.184A  FIG.184B
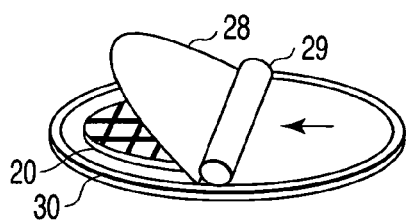 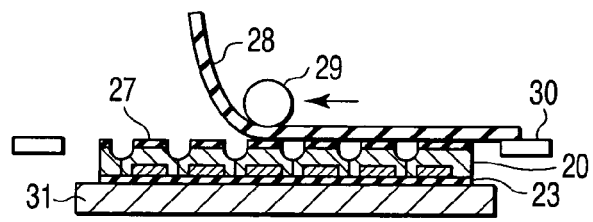
FIG.185A  FIG.185B
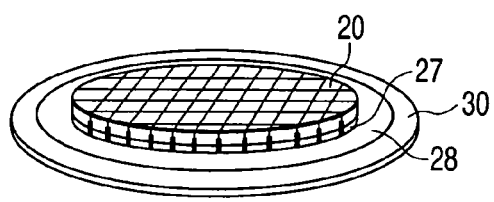 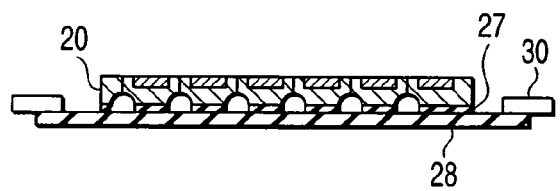
FIG.186A  FIG.186B
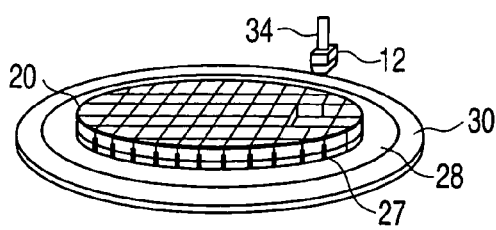 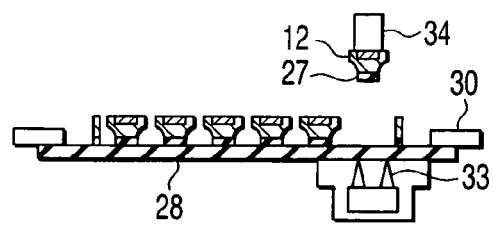
FIG.187A  FIG.187B

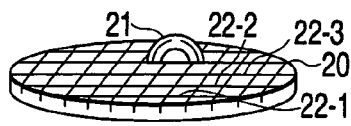
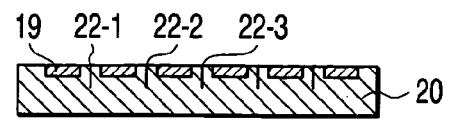
FIG.188A
FIG.188B
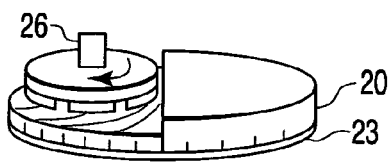
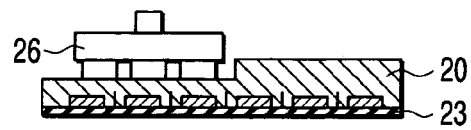
FIG.189A
FIG.189B
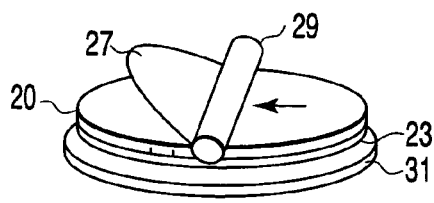
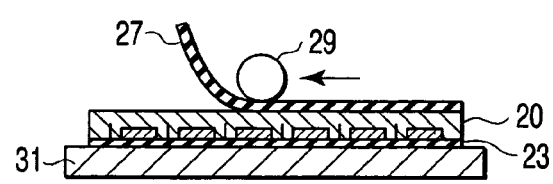
FIG.190A
FIG.190B
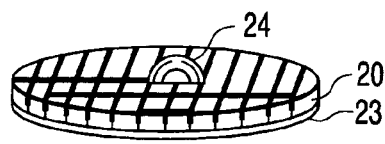
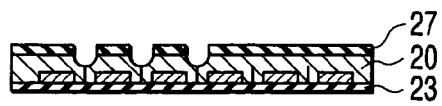
FIG.191A
FIG.191B

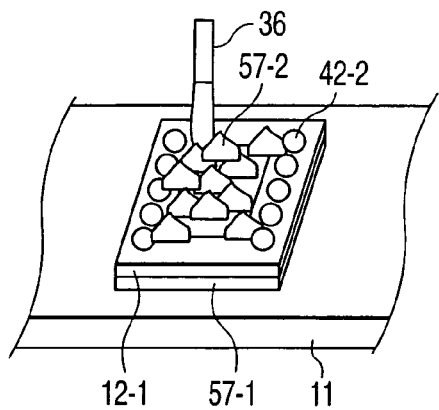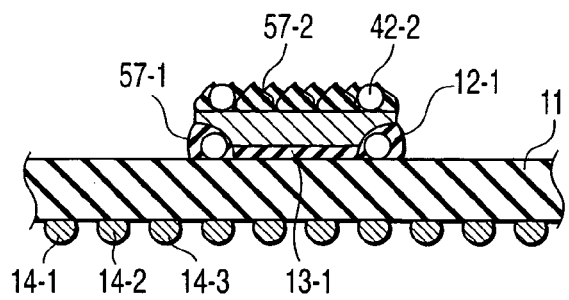
FIG.198A  FIG.198B
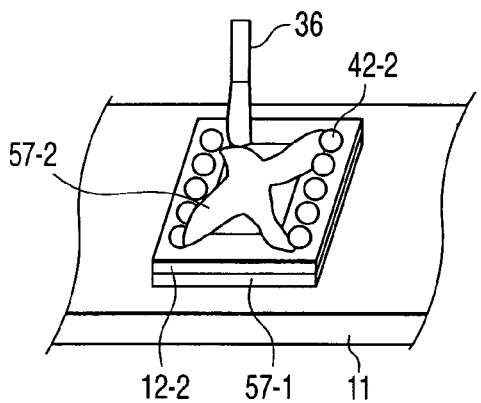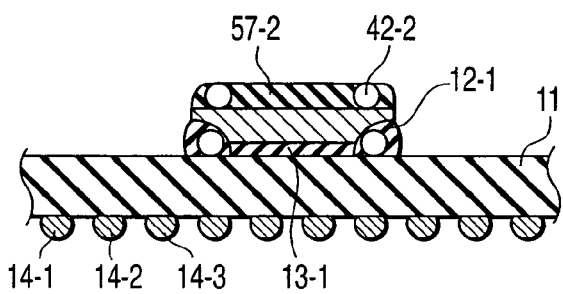
FIG.199A  FIG.199B
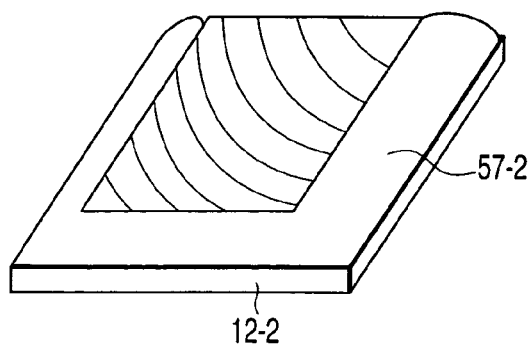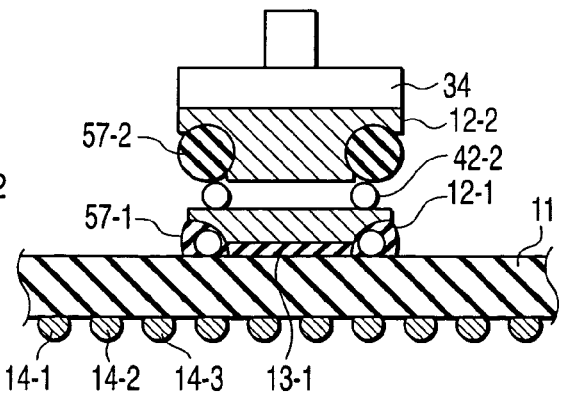
FIG.200A  FIG.200B

SEMICONDUCTOR DEVICE HAVING SEMICONDUCTOR CHIPS STACKED AND MOUNTED THEREON AND MANUFACTURING METHOD THEREOF

CROSS-REFERENCE TO RELATED APPLICATIONS

This application is based upon and claims the benefit of priority from prior Japanese Patent Applications No. 2005-026698, filed Feb. 2, 2005; and No. 2005-026699, filed Feb. 2, 2005, the entire contents of both of which are incorporated herein by reference.

BACKGROUND OF THE INVENTION

1. Field of the Invention

This invention relates to a semiconductor device having semiconductor chips stacked and mounted thereon and a manufacturing method thereof. More specifically, this invention relates to a package type semiconductor device of next generation called a COC (Chip On Chip) and a manufacturing method thereof and a semiconductor device called a stacked MCP (Multi-Chip Package) having the stacked and mounted semiconductor chips sealed in one package and a manufacturing method thereof.

2. Description of the Related Art

A stacked MCP in which the chip thickness and the package thickness are reduced is described in Jpn. Pat. Appln. KOAKAI Publication No. H10-70232, for example. This type of semiconductor device is formed by the following process. First, the backside of a semiconductor wafer which has been subjected to an element forming process is ground and etched and the wafer is reduced to desired thickness. Next, a DAF (Die attach film) or bonding agent such as epoxy resin is affixed to the backside of the semiconductor wafer and then the wafer is diced and cut apart into individual semiconductor chips. After this, the semiconductor chip is mounted on a printed circuit board or the like. Next, the semiconductor chip is electrically connected to printed wirings on the circuit board by wire bonding. Another semiconductor chip is stacked and mounted on the above semiconductor chip with a DAF disposed therebetween and the semiconductor chip is electrically connected to printed wirings on the circuit board by wire bonding. After this, the same process is repeatedly performed to sequentially stack semiconductor chips and a wire bonding process is performed for each chip. Then, the semiconductor chips stacked and mounted on the circuit board are sealed into a package of resin or the like.

When semiconductor chips with the same size are stacked on one another or a semiconductor chip larger than the semiconductor chip of the lower stage is stacked thereon, a spacer is affixed to the semiconductor chip of the lower stage with a DAF disposed therebetween in order to prevent the bonding wire from being brought into contact with the backside of the semiconductor chip of the upper stage. The spacer is smaller in size than the semiconductor chip of the lower stage, the outer peripheral portion thereof is set inside the bonding pads of the semiconductor chip of the lower stage and the spacer has thickness to provide a space which prevents the bonding wire of the chip of the lower stage from being brought into contact with the semiconductor chip of the upper stage when the semiconductor chip of the upper stage is mounted. Then, the semiconductor chip of the upper stage is mounted on the spacer with the DAF disposed therebetween and the bonding pads are electrically connected to the circuit board by wire bonding.

However, with the above structure and manufacturing method, the following problems (1) to (6) are provided.

(1) If the semiconductor wafer is diced with the DAF affixed thereon after the backside of the semiconductor wafer is ground, etched or the like to reduce the thickness thereof to desired thickness, chippings or cracks often occur on the backside of the chip.

(2) If the thickness of the semiconductor wafer is set to 70 μm or less, breakage of the wafer tends to occur and it becomes difficult to deal with the wafer. Further, since nothing is formed on the backside of the semiconductor chip while a protection film and wiring pattern are formed on the main surface thereof, a warp occurs due to a difference in the thermal expansion coefficient and the warp amount becomes several millimeters when the thickness is set to 30 μm. Therefore, it is not only difficult to deal with the chip, but also a recognition error occurs at the time of position detection by using an optical system such as a TV camera performed when the chip is stacked and mounted.

(3) Chip cracks often occur when individual semiconductor chips are picked up (separated) from a dicing tape after the semiconductor wafer is divided into the discrete chips. Further, when the thickness of the semiconductor chip becomes less than 100 μm, deflection (bending) occurs in the semiconductor chip when it is attracted by a collet and voids occur in the die-bonding (adhesion and pressure-connection) process.

(4) The semiconductor chip of the second stage or succeeding state is bent by pressurization at the ball bonding time because no rigid material is present under the bonding pad and the chip itself is thin and a lowering in the bonding property, for example, a loose connection and faulty connection position tend to occur. Further, if the bending amount of the chip is further increased, wire deformation and chip cracks occur in the semiconductor chip of the lower layer.

(5) When the semiconductor chips of the same size are stacked or the semiconductor chips of different sizes including a chip of the upper stage larger than the chip of the lower stage are stacked in the second and succeeding stages, it is necessary to dispose a spacer and DAF between the semiconductor chips and the package thickness cannot be made sufficiently small even if the semiconductor chip is made sufficiently thin. If the spacer and DAF are made thin, a short circuit or leak tends to occur between the bonding wire and the backside of the semiconductor chip stacked in the upper stage. Further, there occurs a possibility that the bonding wire flows to cause a short circuit at the time of resin-sealing.

(6) Costs for fabricating and bonding processes are necessary in addition to a material cost for the spacer and DAF, and as a result, the cost increases and the productivity is lowered.

The COC package type semiconductor device is described in Jpn. Pat. Appln. KOKAI Publication No. H05-063137 and Jpn. Pat. Appln. KOKAI Publication No. 06-120419. The semiconductor device of the above type is formed by the following process. First, semiconductor elements are formed on the main surface of a semiconductor wafer. Further, through electrodes electrically connected to the semiconductor elements are formed for the respective semiconductor chips. Next, the backside of the semiconductor wafer is ground and etched and the thickness of the wafer is reduced to desired thickness. After this, the backside of the semiconductor wafer is subjected to a CMP, plasma etching process and the like to cause the through electrodes to protrude. Next, a dicing process is performed to divide the wafer into discrete semiconductor chips. Then, the semiconductor chips formed by the above process are stacked and mounted in a multistage form on a printed circuit board having external connection electrodes. At this time, the through electrodes of the stacked semiconductor chips are electrically connected to one another via connection electrodes such as ball bumps or stud bumps inserted therebetween. After this, they are sealed into a package of resin or the like.

However, the above structure and manufacturing method have the following problems (7) to (10).

(7) If the semiconductor wafer is diced after the backside of the semiconductor wafer is ground and etched and the thickness of the wafer is reduced to desired thickness, chippings and cracks often occur on the backside of the chip.

(8) If the thickness of the semiconductor wafer is set to 70 µm or less, breakage tends to occur and it is difficult to deal with the wafer. Further, since nothing is formed on the backside of the semiconductor chip while a protection film and wiring pattern are formed on the main surface thereof, a warp occurs due to a difference in the thermal expansion coefficient and the warp amount becomes several millimeters when the thickness of the chip is set to 30 µm. Therefore, it is not only difficult to deal with the chip, but also a recognition error occurs at the time of position detection performed by using an optical system such as a TV camera when the chip is stacked and mounted.

(9) Chip cracks often occur when individual semiconductor chips are picked up (separated) from a dicing tape after the semiconductor wafer is divided into the discrete chips. Further, when the thickness of the semiconductor chip becomes less than 100 µm, deflection (bending) occurs in the semiconductor chip when it is attracted by a collet and voids occur in the die bonding process.

(10) When the semiconductor chips are stacked in a multistage form and mounted on a printed circuit board, the thicknesses of the connection electrodes of the respective chips are required in addition to the total sum of the thicknesses of the semiconductor chips to prevent a reduction in the thickness of the package.

BRIEF SUMMARY OF THE INVENTION

A semiconductor device according to an aspect of this invention comprises a plurality of semiconductor chips which are stacked and mounted on a circuit board having external connection electrodes and each of which is mounted on the circuit board by means of wire bonding, wherein at least one semiconductor chip stacked on the semiconductor chip includes bonding pads which are arranged on a main surface of the semiconductor chip along at least one side thereof and electrically connected to semiconductor elements, overhung portions formed in positions of a backside of the semiconductor chip corresponding to the bonding pads, having a start point inside the bonding pads, formed to become thinner in a direction toward an outer periphery to an end point which reaches a side wall thereof, and forming spaces to accommodate ball bonding portions between the overhung portions and a main surface of a semiconductor chip arranged in a lower stage, and insulating layers which are formed to cover the overhung portions and prevent the chip from being brought into contact with bonding wires of the semiconductor chip arranged in the lower stage.

A manufacturing method of a semiconductor device according to another aspect of this invention comprises forming semiconductor elements and bonding pads electrically connected to the semiconductor elements on a main surface of a semiconductor wafer, forming grooves having opening portions wider than regions between the bonding pads of adjacent semiconductor chips on a backside in positions corresponding to the bonding pads between the adjacent semiconductor chips along one of dicing lines and chip dividing lines of the semiconductor wafer, forming insulating layers in the grooves, dividing the semiconductor wafer along one of the dicing lines and chip dividing lines of the semiconductor wafer to form semiconductor chips having overhung portions each formed to have a start point inside the bonding pads and become thinner in a direction toward an outer periphery to an end point which reaches a side wall thereof and used to form spaces which accommodate ball bonding portions between the overhung portions and a main surface of a semiconductor chip arranged in a lower stage by using the inner walls of the grooves on at least one side of the outer periphery, and stacking and mounting a plurality of semiconductor chips including the semiconductor chip having the overhung portions formed with the overhung portions set to correspond in position to the ball bonding portions of the semiconductor chip arranged in a lower stage and connecting bonding pads formed on a main surface of each semiconductor chip to printed wirings on the circuit board by wire bonding each time the semiconductor chip is mounted.

A semiconductor device according to still another aspect of this invention comprises a plurality of semiconductor chips mounted on a circuit board having external connection electrodes, wherein the semiconductor chips are mounted on the circuit board via connection electrodes, and at least one of the semiconductor chips includes through electrodes formed in through holes which penetrate through the semiconductor chip with insulating films disposed therebetween and electrically connected to semiconductor elements, and overhung portions or grooves formed in positions corresponding to the through electrodes on a backside of the semiconductor chip and forming accommodating portions which accommodate the connection electrodes between the overhung portions or grooves and the circuit board or a main surface of the semiconductor chip arranged in a lower stage.

A manufacturing method of a semiconductor device according to another aspect of this invention comprises forming semiconductor elements and through electrodes electrically connected to the semiconductor elements on a main surface of a semiconductor wafer, forming grooves having opening portions wider than the through electrodes in positions corresponding to the through electrodes on a backside of the semiconductor wafer, dividing the semiconductor wafer along one of dicing lines and chip dividing lines of the semiconductor wafer to form semiconductor chips each having overhung portions or grooves which form accommodating portions to accommodate connection electrodes between the overhung portions or grooves and a chip mounting surface of a circuit board having external connection electrodes or a main surface of a semiconductor chip arranged in a lower stage, and mounting the plurality of semiconductor chips thus formed by arranging the overhung portions or grooves of the plurality of semiconductor chips to face electrode pads of the circuit board or the through electrodes of the semiconductor chip arranged in the lower stage and making electrical connections between the electrode pads and the through electrodes of the semiconductor chips and between the through electrodes of the semiconductor chips via the connection electrodes.

BRIEF DESCRIPTION OF THE SEVERAL VIEWS OF THE DRAWING

FIG. 4A to FIG. 11A are perspective views respectively showing first to eighth steps, for illustrating a manufacturing method of the COC package type semiconductor device shown in FIG. 1;

FIG. 4B to FIG. 11B are cross sectional views of FIG. 4A to FIG. 11A, for illustrating the manufacturing method of the COC package type semiconductor device shown in FIG. 1;

FIG. 14 is an enlarged cross sectional view of a portion near the tip portion of a blade used to form the second grooves;

FIG. 15 is an enlarged cross sectional view of a portion near the tip portion, for illustrating another example of a blade used to form the second grooves;

FIG. 18 is an enlarged cross sectional view of a portion near a pickup needle in a pickup device, for illustrating a pickup step;

FIG. 19A is a perspective view of the entire structure, for illustrating a wire bonding step;

FIG. 19B is a cross sectional view of FIG. 19A, for illustrating the wire bonding step;

FIG. 19C is an enlarged cross sectional view of a portion near the ball bonding portion, for illustrating the wire bonding step;

FIG. 33A is a plan view of a semiconductor wafer, for illustrating another forming position of the second grooves;

FIG. 33B is a perspective view of a semiconductor chip, for illustrating another forming position of the second grooves;

FIG. 34A is a plan view of a semiconductor wafer, for illustrating still another forming position of the second grooves;

FIG. 34B is a perspective view of a semiconductor chip, for illustrating still another forming position of the second grooves;

FIG. 42A to FIG. 50A are perspective views respectively showing first to ninth manufacturing steps, for illustrating another manufacturing process (modification 1) of the stack MCP;

FIG. 42B to FIG. 50B are cross sectional views of FIGS. 42A to 50A, for illustrating another manufacturing process (modification 1) of the stack MCP;

FIG. 51A to FIG. 58A are perspective views respectively showing first to eighth manufacturing steps, for illustrating another manufacturing process (modification 2) of the stack MCP;

FIG. 51B to FIG. 58B are cross sectional views of FIGS. 51A to 58A, for illustrating another manufacturing process (modification 2) of the stack MCP;

FIG. 59A to FIG. 67A are perspective views respectively showing first to ninth manufacturing steps, for illustrating another manufacturing process (modification 3) of the stack MCP;

FIG. 59B to FIG. 67B are cross sectional views of FIGS. 59A to 67A, for illustrating another manufacturing process (modification 3) of the stack MCP;

FIG. 68A to FIG. 76A are perspective views respectively showing first to ninth manufacturing steps, for illustrating another manufacturing process (modification 4) of the stack MCP;

FIG. 68B to FIG. 76B are cross sectional views of FIGS. 68A to 76A, for illustrating another manufacturing process (modification 4) of the stack MCP;

FIG. 77A to FIG. 85A are perspective views respectively showing first to ninth manufacturing steps, for illustrating another manufacturing process (modification 5) of the stack MCP;

FIG. 77B to FIG. 85B are cross sectional views of FIGS. 77A to 85A, for illustrating another manufacturing process (modification 5) of the stack MCP;

FIG. 86A to FIG. 92A are perspective views respectively showing first to seventh manufacturing steps, for illustrating another manufacturing process (modification 6) of the stack MCP;

FIG. 86B to FIG. 92B are cross sectional views of FIGS. 86A to 92A, for illustrating another manufacturing process (modification 6) of the stack MCP;

FIG. 93A to FIG. 100A are perspective views respectively showing first to eighth manufacturing steps, for illustrating another manufacturing process (modification 7) of the stack MCP;

FIG. 93B to FIG. 100B are cross sectional views of FIGS. 93A to 100A, for illustrating another manufacturing process (modification 7) of the stack MCP;

FIG. 101A to FIG. 107A are perspective views respectively showing first to seventh manufacturing steps, for illustrating another manufacturing process (modification 8) of the stack MCP;

FIG. 101B to FIG. 107B are cross sectional views of FIGS. 101A to 107A, for illustrating another manufacturing process (modification 8) of the stack MCP;

FIG. 108A to FIG. 116A are perspective views respectively showing first to ninth manufacturing steps, for illustrating another manufacturing process (modification 9) of the stack MCP;

FIG. 108B to FIG. 116B are cross sectional views of FIGS. 108A to 116A, for illustrating another manufacturing process (modification 9) of the stack MCP;

FIG. 117A is a perspective view showing a step example 1 of fixing and sealing the ball bonding portion shown in FIGS. 107A, 107B, 116A, 116B by use of an insulating member;

FIG. 117B is a cross sectional view of FIG. 117A showing the step example 1 of fixing and sealing the ball bonding portion shown in FIGS. 107A, 107B, 116A, 116B by use of the insulating member;

FIG. 118A is a perspective view showing a step example 2 of fixing and sealing the ball bonding portion shown in FIGS. 107A, 107B, 116A, 116B by use of an insulating member;

FIG. 118B is a cross sectional view of FIG. 118A showing the step example 1 of fixing and sealing the ball bonding portion shown in FIGS. 107A, 107B, 116A, 116B by use of the insulating member;

FIG. 119A is a perspective view showing a step example 3 of fixing and sealing the ball bonding portion shown in FIGS. 107A, 107B, 116A, 116B by use of an insulating member;

FIG. 119B is a cross sectional view of FIG. 119A showing the step example 3 of fixing and sealing the ball bonding portion shown in FIGS. 107A, 107B, 116A, 116B by use of the insulating member;

FIG. 120A is a perspective view showing a step example 4 of fixing and sealing the ball bonding portion shown in FIGS. 107A, 107B, 116A, 116B by use of an insulating member;

FIG. 120B is a cross sectional view of FIG. 120A showing the step example 4 of fixing and sealing the ball bonding portion shown in FIGS. 107A, 107B, 116A, 116B by use of the insulating member;

FIG. 121A is a perspective view showing a step example 5 of fixing and sealing the ball bonding portion shown in FIGS. 107A, 107B, 116A, 116B by use of an insulating member;

FIG. 121B is a cross sectional view of FIG. 121A showing the step example 5 of fixing and sealing the ball bonding portion shown in FIGS. 107A, 107B, 116A, 116B by use of the insulating member;

FIG. 127A to FIG. 134A are perspective views respectively showing first to eighth steps, for illustrating a manufacturing method of the COC package type semiconductor device shown in FIG. 124;

FIG. 127B to FIG. 134B are cross sectional views of FIG. 127A to FIG. 134A, for illustrating the manufacturing method of the COC package type semiconductor device shown in FIG. 124;

FIG. 137A is a cross sectional view of a semiconductor chip, for illustrating another example of the overhung shape of the semiconductor chip;

FIG. 137B is an enlarged cross sectional view of an overhung portion, for illustrating another example of the overhung shape of the semiconductor chip;

FIG. 138A is a cross sectional view of a semiconductor chip, for illustrating still another example of the overhung shape of the semiconductor chip;

FIG. 138B is an enlarged cross sectional view of an overhung portion, for illustrating still another example of the overhung shape of the semiconductor chip;

FIG. 139 is an enlarged cross sectional view of a groove forming region, for illustrating another forming step of the second grooves;

FIG. 142A is a plan view of a semiconductor wafer, for illustrating another forming position of second grooves;

FIG. 142B is a perspective view of a semiconductor chip, for illustrating another forming position of the second grooves;

FIG. 143A is a plan view of a semiconductor wafer, for illustrating still another forming position of second grooves;

FIG. 143B is a perspective view of a semiconductor chip, for illustrating still another forming position of the second grooves;

FIG. 144A is a plan view of a semiconductor wafer, for illustrating another forming position of second grooves;

FIG. 144B is a perspective view of a semiconductor chip, for illustrating another forming position of the second grooves;

FIG. 145A is a plan view of a semiconductor wafer, for illustrating still another forming position of second grooves;

FIG. 145B is a perspective view of a semiconductor chip, for illustrating still another forming position of the second grooves;

FIG. 146A is a plan view of a semiconductor wafer, for illustrating another forming position of second grooves;

FIG. 146B is a perspective view of a semiconductor chip, for illustrating another forming position of the second grooves;

FIG. 147A is a plan view of a semiconductor wafer, for illustrating still another forming position of second grooves;

FIG. 147B is a perspective view of a semiconductor chip, for illustrating still another forming position of the second grooves;

FIG. 164 is a cross sectional view showing a modification 17 of the stacked structure of semiconductor chips in a COC package type semiconductor device, for illustrating a semiconductor device according to another embodiment of this invention;

FIG. 165 is a cross sectional view showing a modification 18 of the stacked structure of semiconductor chips in a COC package type semiconductor device, for illustrating a semiconductor device according to another embodiment of this invention;

FIG. 166 is a cross sectional view showing a modification 19 of the stacked structure of semiconductor chips in a COC package type semiconductor device, for illustrating a semiconductor device according to another embodiment of this invention;

FIG. 167 is a cross sectional view showing a modification 20 of the stacked structure of semiconductor chips in a COC package type semiconductor device, for illustrating a semiconductor device according to another embodiment of this invention;

FIG. 168 is a cross sectional view showing a modification 21 of the stacked structure of semiconductor chips in a COC package type semiconductor device, for illustrating a semiconductor device according to another embodiment of this invention;

FIG. 169 is a cross sectional view showing a modification 22 of the stacked structure of semiconductor chips in a COC package type semiconductor device, for illustrating a semiconductor device according to another embodiment of this invention;

FIG. 170 is a cross sectional view showing a modification 23 of the stacked structure of semiconductor chips in a COC package type semiconductor device, for illustrating a semiconductor device according to another embodiment of this invention;

FIG. 171 is a cross sectional view showing a modification 24 of the stacked structure of semiconductor chips in a COC package type semiconductor device, for illustrating a semiconductor device according to another embodiment of this invention;

FIG. 172 is a cross sectional view showing a modification 25 of the stacked structure of semiconductor chips in a COC package type semiconductor device, for illustrating a semiconductor device according to another embodiment of this invention;

FIG. 173A to FIG. 179A are perspective views respectively showing first to seventh manufacturing steps, for illustrating another manufacturing process (modification 1) of a COC package type semiconductor device;

FIG. 173B to FIG. 179B are cross sectional views of FIG. 173A to FIG. 178A, for illustrating the other manufacturing process (modification 1) of the COC package type semiconductor device;

FIG. 180A to FIG. 187A are perspective views respectively showing first to eighth manufacturing steps, for illustrating another manufacturing process (modification 2) of a COC package type semiconductor device;

Figure 196A:
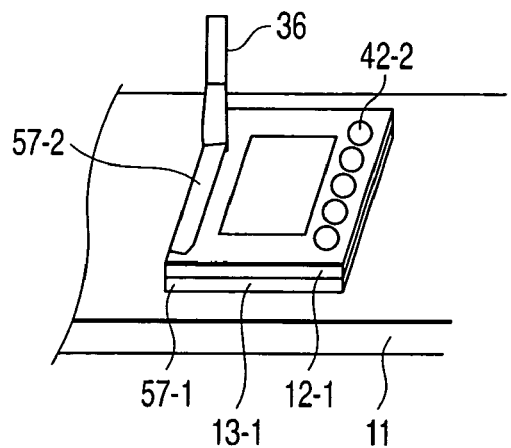
Figure 196B:
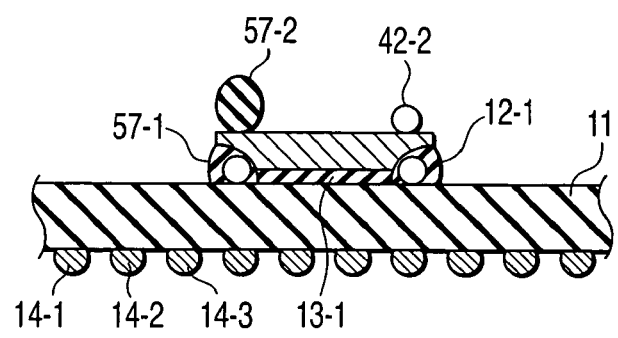
Figure 197A:
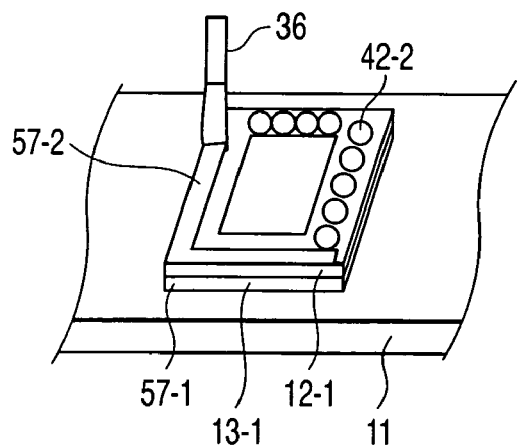
Figure 197B:
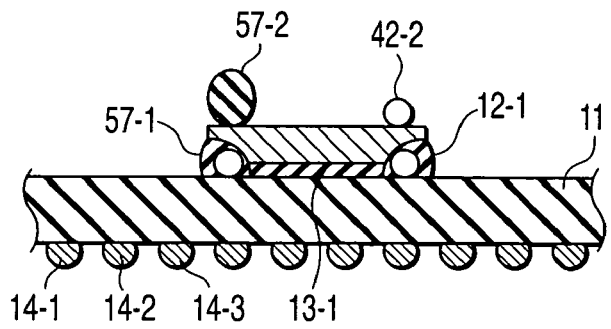

FIG. 180B to FIG. 187B are cross sectional views of FIG. 180A to FIG. 187A, for illustrating the other manufacturing process (modification 2) of the COC package type semiconductor device;

FIG. 188A to FIG. 195A are perspective views respectively showing first to seventh manufacturing steps, for illustrating another manufacturing process (modification 3) of a COC package type semiconductor device;

FIG. 188B to FIG. 195B are cross sectional views of FIG. 188A to FIG. 195A, for illustrating the other manufacturing process (modification 3) of the COC package type semiconductor device;

FIG. 196A is a perspective view showing a step example 1 of embedding spaces with insulating members;

FIG. 196B is a cross sectional view of FIG. 196A, for illustrating the step example 1 of embedding the spaces with the insulating members;

FIG. 197A is a perspective view showing a step example 2 of embedding spaces with insulating members;

FIG. 197B is a cross sectional view of FIG. 197A, for illustrating the step example 2 of embedding the spaces with the insulating members;

FIG. 198A is a perspective view showing a step example 3 of embedding spaces with insulating members;

FIG. 198B is a cross sectional view of FIG. 198A, for illustrating the step example 3 of embedding the spaces with the insulating members;

FIG. 199A is a perspective view showing a step example 4 of embedding spaces with insulating members;

FIG. 199B is a cross sectional view of FIG. 199A, for illustrating the step example 4 of embedding the spaces with the insulating members;

FIG. 200A is a perspective view when viewing a chip stacked in an upper stage from the backside thereof, for illustrating a step example 5 of embedding spaces with insulating members; and FIG. 200B is a cross sectional view of the mounting step, for illustrating the step example 5 of embedding the spaces with the insulating members.

DETAILED DESCRIPTION OF THE INVENTION

First Embodiment

Figure 1:
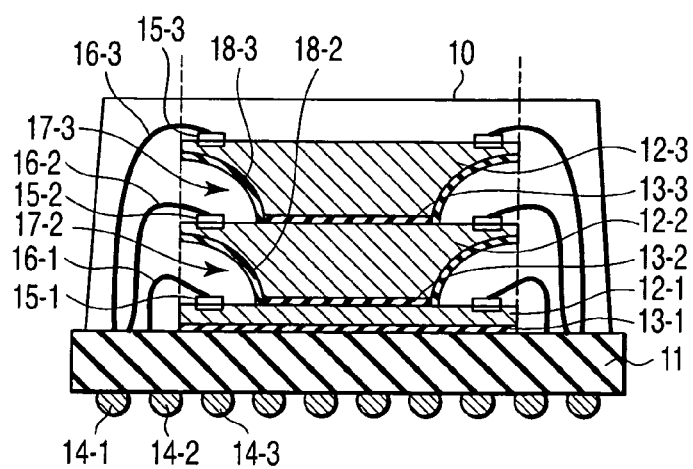
FIG. 1 is a cross sectional view showing an example of a stack MCP having three semiconductor chips with the same size stacked, for illustrating a semiconductor device according to a first embodiment of this invention.

FIG. 1 is a cross sectional view showing a semiconductor device according to a first embodiment of this invention. In this case, a stack MCP having three semiconductor chips with the same size stacked is dealt with as an example. That is, three semiconductor chips 12-1, 12-2, 12-3 with the same size are stacked and mounted on a printed circuit board (PCB) 11 with DAFs 13-1, 13-2, 13-3 disposed therebetween, respectively. For example, the circuit board 11 has a multi-layered wiring structure. Wirings to which bonding wires are connected are formed on the chip mounting surface of the circuit board 11 and external connection electrodes (external terminals) 14-1, 14-2, 14-3, . . . such as ball bumps (solder balls) and pins are arranged in an array form on the backside thereof to form a so-called ball grid array or pin grid array.

Bonding pads 15-1, 15-2, 15-3 formed on the main surfaces of the semiconductor chips 12-1, 12-2, 12-3 and the printed wirings formed on the chip mounting surface of the circuit board 11 are connected together via bonding wires 16-1, 16-2, 16-3, respectively. The bonding pads 15-1, 15-2, 15-3 are electrically connected to semiconductor elements formed on the main surfaces of the respective semiconductor chips 12-1, 12-2, 12-3. The printed wirings formed on the chip mounting surface of the circuit board 11 are connected to the external connection electrodes 14-1, 14-2, 14-3, . . . via a multi-layered wiring structure formed in the circuit board 11. Thus, the semiconductor chips 12-1, 12-2, 12-3 and the external connection electrodes 14-1, 14-2, 14-3, . . . are electrically connected.

The first-stage semiconductor chip 12-1 is formed to have the uniform and thin thickness of the whole chip portion. The second-stage and third-stage semiconductor chips 12-2, 12-3 are formed to be thicker than the first-stage semiconductor chip 12-1 and have overhung portions 17-2, 17-3 on two sides which face ball bonding portions of the lower-stage chips on the backsides. The overhung portions 17-2, 17-3 form spaces to accommodate the ball bonding portions between the chips and the main surfaces of the semiconductor chips arranged under them. The overhung portions 17-2, 17-3 are respectively covered with insulating layers 18-2, 18-3 to prevent short circuits and leaks between the bonding wires 16-1, 16-2 and the backsides of the upper-stage chips 12-2, 12-3.

Figure 2:
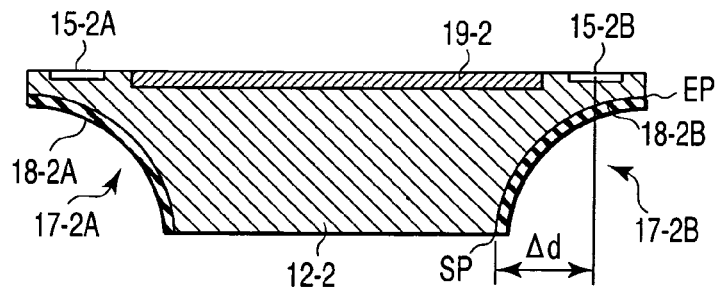
FIG. 2 is a view schematically showing a cross section of the second-stage semiconductor chip of the stack MCP shown in FIG. 1.
Figure 3:
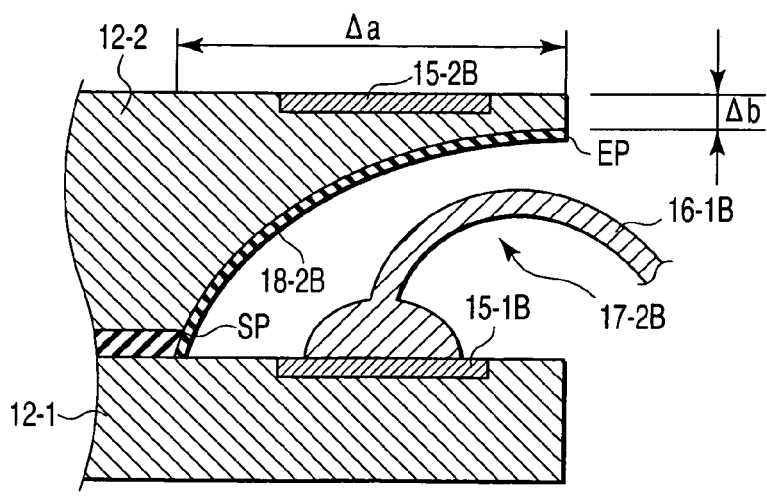
FIG. 3 is an enlarged cross sectional view showing a portion near ball bonding portions of the first-stage and second-stage semiconductor chips of the stack MCP shown in FIG. 1.

FIG. 2 schematically shows the cross section of the second-stage semiconductor chip 12-2 (or the third-stage semiconductor chip 12-3) of the stack MCP shown in FIG. 1. FIG. 3 is an enlarged cross sectional view showing a portion near the ball bonding portions of the first-stage and second-stage semiconductor chips of the stack MCP shown in FIG. 1.

As shown in FIG. 2, semiconductor elements 19-2 are formed on the main surface of the semiconductor chip 12-2 and bonding pads 15-2A, 15-2B for wire bonding are arranged along the two opposite sides of the chip 12-2. Further, overhung portions 17-2A, 17-2B are formed on the opposite two sides corresponding to the bonding pads 15-2A, 15-2B on the backside of the semiconductor chip 12-2. The overhung portions 17-2A, 17-2B are so formed that each thickness thereof will be gradually increased in a direction from the outer peripheral portion toward the inner portion. More specifically, the overhung portion 17-2B (17-2A) is formed to have a curved surface having a start point SP in a position at a distance $\Delta d$ (=0.05 mm) from the center of the bonding pad 15-2B (15-2A), become gradually thinner toward the outer periphery and have an end point EP which reaches the side wall of the chip 12-2. In this example, the curved surface of each of the overhung portions 17-2A, 17-2B has the radius of curvature of 0.05 mm to 2.5 mm. The degree of roughness of the curved surface of each of the overhung portions 17-2A, 17-2B is preferably set to #2000 or less in order to prevent concentration of the stress caused by application of pressure at the ball bonding time and the concentration of the stress can be effectively suppressed if the surface is mirror-finished.

As shown in FIG. 3, a space to accommodate a ball bonding portion is formed between the chip 12-2 and the main surface of the lower-stage chip 12-1 by the presence of the overhung portion 17-2B (17-2A). It is necessary to set the thickness (edge thickness) Lb of the side wall of the chip 12-2 to approximately 10 to 50 µm and set the height of the overhung portion of the chip 12-2 to approximately 70 µm in the case of a normal wire bonder although they are different depending on pressure applied at the time of ball bonding to the bonding pad 15-2B (15-2A). Further, it is preferable that the distance $\Delta a$ from the outer periphery of the chip (end point EP) to the start point SP do not exceed 5 mm and it is preferable to set the distance in a range of 200 µm to 1.3 mm.

Next, the manufacturing method of the stack MCP shown in FIG. 1 is explained in detail with reference to FIGS. 4A, 4B to FIGS. 11A, 11B. FIGS. 4A to 11A are perspective views and FIGS. 4B to 11B are cross sectional views of FIGS. 4A to 11A.

First, semiconductor elements are formed and bonding pads electrically connected to the semiconductor elements are formed on the main surface of the semiconductor wafer by a known manufacturing process.

Then, as shown in FIGS. 4A, 4B, first grooves 22-1, 22-2, 22-3, . . . are formed along dicing lines or chip dividing lines in the main surface of the semiconductor wafer 20 by use of a diamond blade 21 or the like (half-cut dicing).

Figures 12A, 12B:
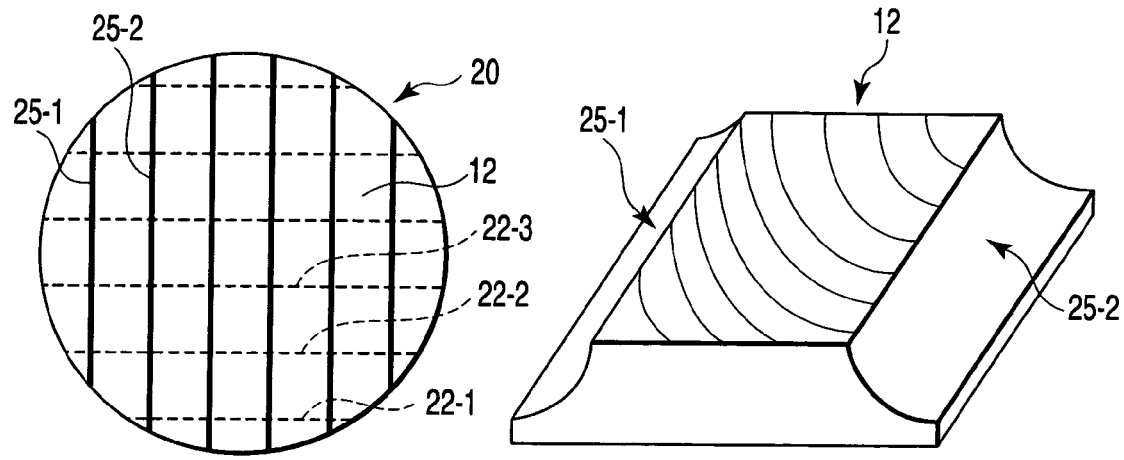
FIG. 12A is a plan view of a semiconductor wafer, for illustrating the forming position of second grooves.
FIG. 12B is a perspective view of a semiconductor chip, for illustrating the forming position of the second grooves.

Next, as shown in FIGS. 5A, 5B, a BSG tape (surface protection tape) 23 is affixed to the main surface of the semiconductor wafer 20 and second grooves 25-1, 25-2, . . . used to form the overhung portions are formed along the dicing lines or chip dividing lines in the backside of the semiconductor wafer 20 by use of a diamond blade 24. The second grooves 25-1, 25-2, . . . . are formed in positions corresponding to the two opposite sides of each semiconductor chip 12 as shown in FIGS. 12A, 12B or formed in positions corresponding to the four opposite sides of each semiconductor chip 12 as shown in FIGS. 33A, 33B. In the first embodiment, a case wherein they are formed on the four sides is shown as an example. The second grooves 25-1, 25-2, . . . are formed to have opening portions which are wider than regions between bonding pads of the adjacent semiconductor chips in portions on the backside corresponding to the bonding pads between the adjacent semiconductor chips and formed to depths to reach at least the first grooves 22-1, 22-2, 22-3, . . . .

Figure 13:
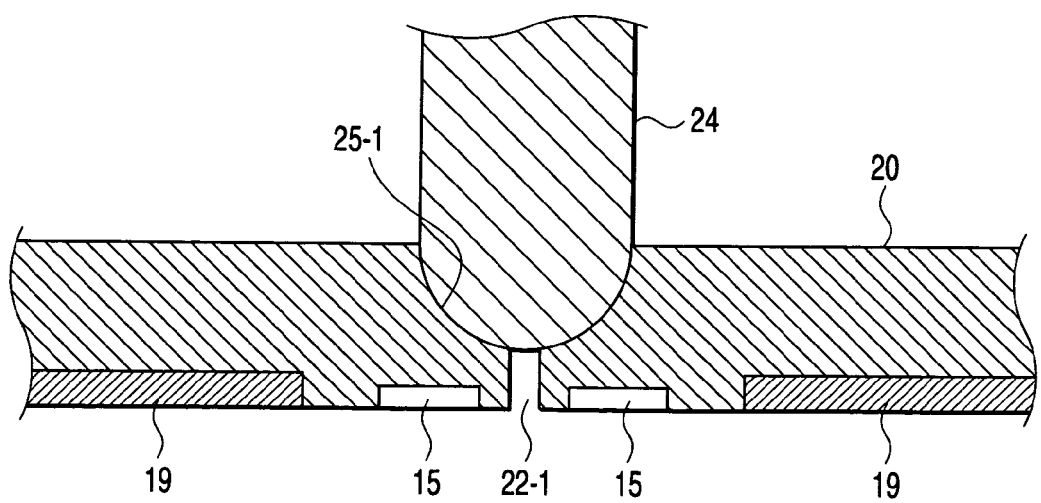
FIG. 13 is an enlarged cross sectional view of a groove forming region, for illustrating a second groove forming step.

At the time of formation of the second grooves 25-1, 25-2, . . . , for example, as shown in FIG. 13, a blade having a tip portion whose cross section is a curved surface is used. As shown in FIG. 14, if the tip portion is formed in a semi-circular form with the radius R (R=ZZ/2), an overhung portion with the width ZZ and the curvature of the radius R can be formed. Further, as shown in FIG. 15, if the cross section of the tip portion is part of a circle, an overhung portion with the curved surface can be formed in the same manner.

Next, as shown in FIGS. 6A, 6B, the backside of the semiconductor wafer 20 is ground and the wafer is finished to desired thickness by use of a grinding stone 26 or the like. Thus, the semiconductor wafer 20 is discretely divided to form semiconductor chips 12, 12, . . . .

Figure 16:
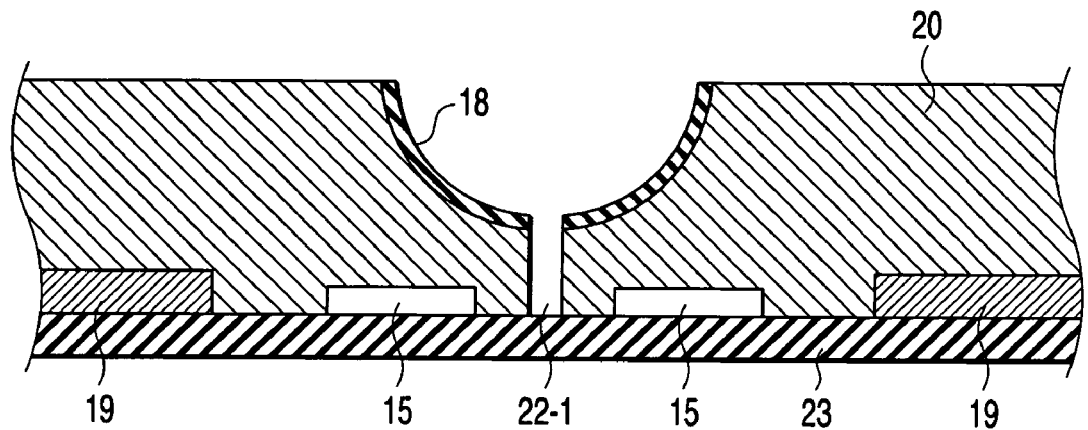
FIG. 16 is an enlarged cross sectional view of overhung portions formed by the second groove.
Figure 17:
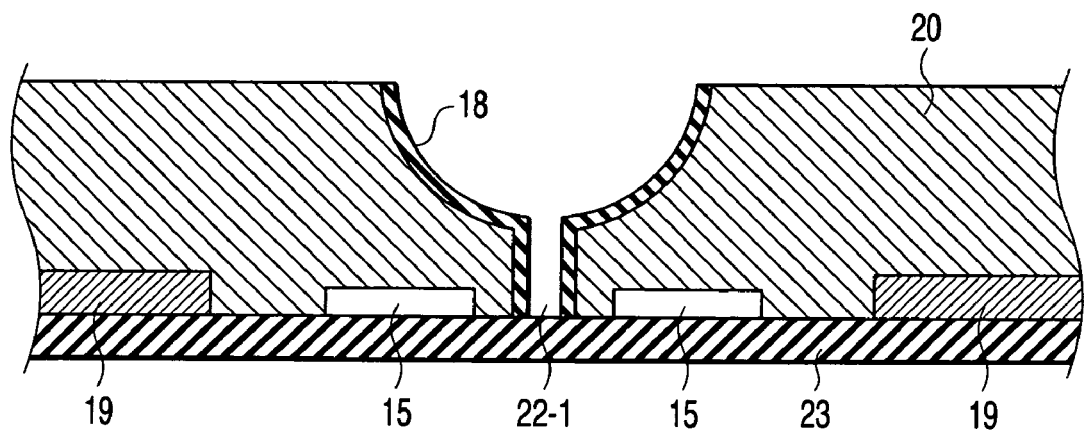
FIG. 17 is an enlarged cross sectional view for illustrating another configuration example of overhung portions formed by the second groove.

As shown in FIG. 16, insulating layers 18 are formed on the surfaces of the overhung portions thus formed. As the insulating layer 18, for example, a silicon oxide film or organic material such as polyimide can be used. Further, as shown in FIG. 17, if insulating layers 18 are formed not only on the surfaces of the overhung portions but also on the side walls of the groove 22-1 (side walls of the chip 12), a short circuit or leak due to contact with a bonding wire can be effectively prevented.

After this, as shown in FIGS. 7A, 7B, the discretely divided semiconductor chips 12, 12, . . . are placed on a stage 31 and a DAF (or a bonding agent) 27 and dicing tape 28 are affixed to the backside by use of a roller 29 and thus the wafer is mounted on a wafer ring 30. In this case, the DAF 27 and dicing tape 28 are affixed in an integral form, but there occurs no problem even if discretely divided DAFs and dicing tapes are affixed.

Then, as shown in FIGS. 8A, 8B, the surface protection tape 23 is separated.

Next, as shown in FIGS. 9A, 9B, a diamond blade 32 with the width smaller than gaps between the discretely divided semiconductor chips 12, 12, . . . is used to perform a dicing process again to cut apart the DAF 27. At this time, when a polyimide-series organic material is used to form the DAF 27, polyimide is scattered and attached to the inner walls of the second grooves 25-1, 25-2, . . . at the dicing time. Thus, the overhung portion of the backside of the chip and the bonding wire of the lower-stage chip can be effectively prevented from being short-circuited or causing a leak when the chips are stacked.

After this, as shown in FIGS. 10A, 10B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be brought into direct contact with the backside of the chip 12 and are further pushed upwardly to separate the chip 12 together with the DAF 27 from the dicing tape 28. At this time, as shown in FIG. 18, the pickup needles 33 are brought into contact with the thick portion of the chip 12 and pushed upward to separate the chip from the dicing tape 28. The DAF 27 is adhered to the backside of the thus separated chip 12 and the chip is fed in this state while the chip surface is attracted by a tool called a collet 34.

Next, the chips 12 thus fed by the collet 34 are stacked and mounted on the circuit board 11 having the external connection electrodes 14-1, 14-2, . . . and stacked in a multi-layered form by electrically connecting bonding pads formed on the main surface of each semiconductor chip to printed wirings formed on the chip mounting surface of the circuit board 11 by wire bonding each time the semiconductor chip is mounted.

In FIGS. 11A, 11B, a case wherein the first-stage chip 12-1 has uniform and small thickness is taken as an example and a state in which it is subjected to wire bonding is shown. The semiconductor chip 12-2 formed in the step described above is stacked and mounted on the chip 12-1 with the DAF 27 disposed therebetween and then a wire bonding process is performed to electrically connect the bonding pads of the chip 12-2 to printed wirings formed on the chip mounting surface of the circuit board 11. When the chip 12-2 is stacked and mounted on the chip 12-1, the overhung portions are arranged in correspondence to the ball bonding portions of the semiconductor chip 12-1 arranged in the lower stage. Thus, spaces to accommodate the ball bonding portions are formed between the chip 12-2 and the main surface of the chip 12-1 arranged in the lower stage. When the chip 12-2 is stacked, portions of the DAF 27 lying under the spaces are bent upwardly and placed between the bonding wires near the ball bonding portions of the chip 12-1 and the overhung portions to fix the bonding wires. In addition, occurrence of a short circuit or leak between the bonding wire and the overhung portion of the chip 12-2 is suppressed.

At the time of wire bonding of the chip 12-2, as shown in FIGS. 19A, 19B, 19C, after the bonding pad 15-2 of the chip 12-2 is subjected to ball bonding by use of a capillary 35, the capillary 35 is moved on the circuit board 11 to wedge-bond the printed wiring while the bonding wire is extended. At the ball bonding time, pressure is applied to the bonding pad 15-2, but the pressure is dispersed to the overhung portion 17-2 to reduce the bending amount of the chip 12-2.

Figure 20:
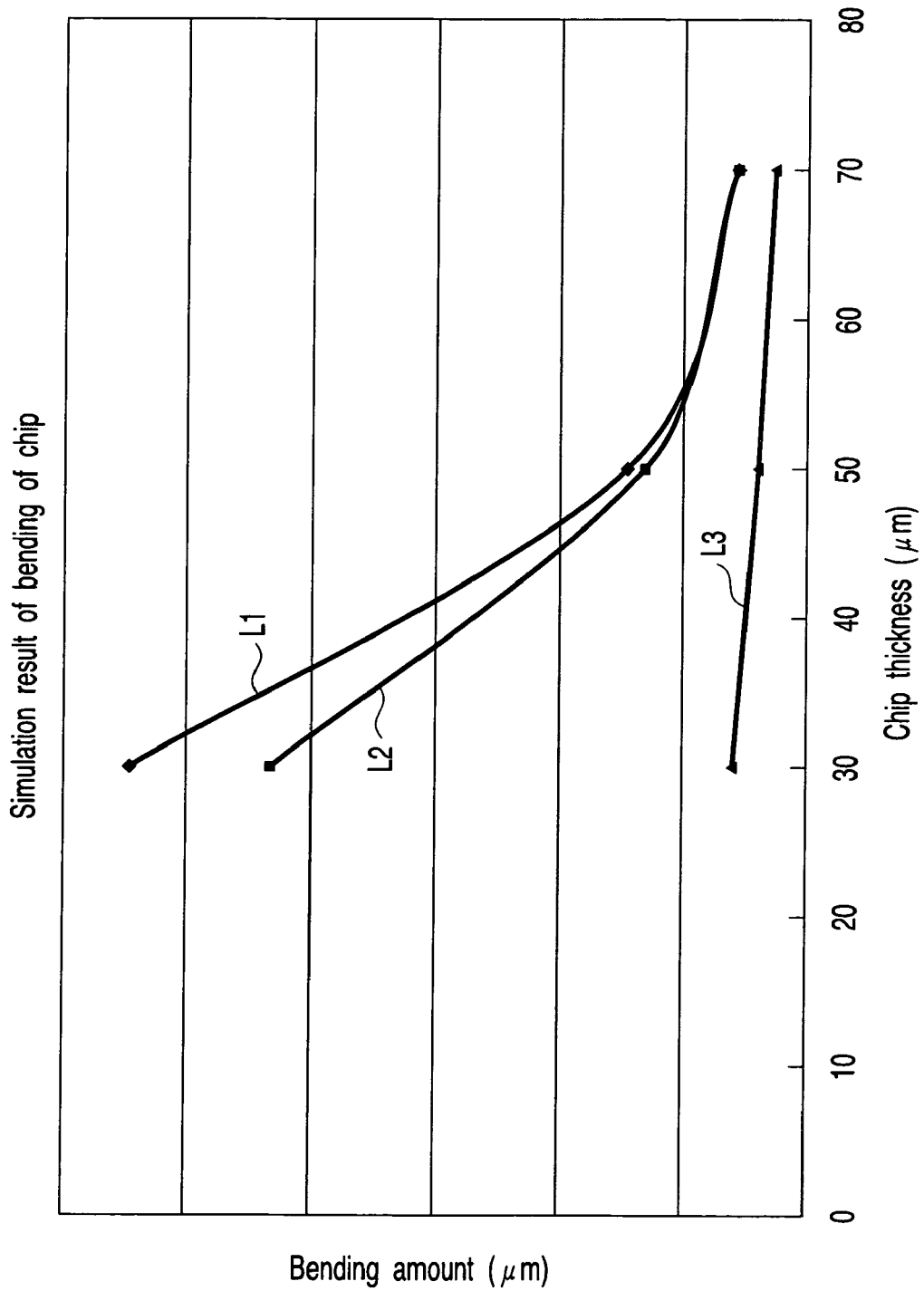
FIG. 20 is a diagram showing the simulation result of the bending of a chip at the ball bonding time and showing the relation between the thickness of the chip and the bending amount when the overhung portion is present and omitted and the shape of the overhung portion is changed.

FIG. 20 shows the simulation result of the bending of the chip at the ball bonding time. In the simulation, the bending amount when a step portion is formed in a vertical direction with respect to the overhung portion (solid line L1), the bending amount when the overhung shape is formed with the radius of curvature 85 µm (solid line L2) and the bending amount when the overhung shape is formed with the radius of curvature 2000 µm (solid line L3) in a case where the chip thickness is set to 30 µm, 50 µm, 70 µm are shown. As is clearly seen from FIG. 20, the bending amount of the chip can be significantly reduced by selecting the shape of the overhung portion.

After this, the process of stacking a plurality of semiconductor chips and the wire bonding process are repeatedly performed according to the package structure.

Then, the stacked semiconductor chips, bonding wires and the chip mounting surface of the circuit board 11 are covered with a resin mold or the like to form a package 10.

With the above structure, the semiconductor chips with the same size or with different sizes in which the upper-stage chip is larger than the lower-stage chip can be stacked without using spacers and DAFs between the semiconductor chips. Further, since the bonding wire of the semiconductor chip arranged in the lower stage can be prevented from being brought into contact with the backside of the upper-stage chip by use of the insulating layer formed to cover the overhung portion, the thickness of the package can be reduced. In this case, the central portion of the semiconductor chip is substantially made thicker by approximately the thickness of a spacer, but the thickness can be reduced since the DAF (10 µm thickness) is made unnecessary. Therefore, when the number of chips to be stacked becomes larger, the effect attained by reducing the thickness becomes significant and the number of stacked stages of the chips can be increased if the thickness of the package is kept unchanged.

Further, with the above manufacturing method, since the semiconductor wafer is diced in the thick state and divided by grinding and etching, occurrence of chippings on the backside of the chip can be suppressed.

Since the central portion of the semiconductor chip is thick and the peripheral portion thereof is thin, the warp can be made small in comparison with a case wherein the whole portion is made thin and it becomes easy to deal with the semiconductor chip. Thus, occurrence of a recognition error at the time of position detection performed by using an optical system such as a TV camera when the chip is mounted can be reduced.

Occurrence of chip cracks can be reduced by applying pressure to the thick portion of the chip by use of pickup needles when each semiconductor chip is picked up from the dicing tape after the semiconductor wafer is discretely divided. Further, the deflection (bending) of the semiconductor chip is reduced when it is attracted by the collet and occurrence of voids in the adhering and pressure-bonding process for die bonding can be suppressed.

Since the semiconductor chips to be stacked in the second and succeeding stages can be suppressed from being bent by applying pressure at the ball bonding time, the bonding characteristic can be improved and occurrence of chip cracks can be suppressed. According to the simulation of the inventor of this application and others, it is confirmed that the element bending can be improved by 4% to 55% in comparison with the conventional case.

When the semiconductor chips with the same size or with different sizes in which the upper-stage chip is larger than the lower-stage chip are stacked, it is not necessary to dispose spacers and DAFs between the chips. Therefore, the material costs of the spacers and DAFs can be omitted, the costs for the processing and bonding steps are made unnecessary, and a lowering in the cost and enhancement of the productivity can be attained. In addition, even if the semiconductor chip is made thin, a short circuit and leak between the bonding wire and the backside of the semiconductor chip arranged in the upper stage can be prevented by use of the insulating layer.

It is possible to use a low-cost bonding agent in a paste state or liquid state instead of the DAF because the bonding agent will not creep up to the main surface of the chip due to the fact that the bonding area between the semiconductor chips is made small, the chip itself can be made thick and the overhung portion exists in the chip peripheral portion.

This invention is not limited to the first embodiment described above and can be variously modified and embodied. Next, various modifications are explained.

[Modifications 1, 2 of the Overhung Shape of the Semiconductor Chip in the First Embodiment and the Forming Method thereof]

FIGS. 21A, 21B and FIGS. 22A, 22B show other examples of the overhung shape of the semiconductor chip 12. In the semiconductor chip 12 shown in FIGS. 21A, 21B, regions ranging from the start points SP to portions below the bonding pads 15A, 15B are curved surfaces and regions ranging from the portions below the bonding pads 15A, 15B to the chip end portions (end portions EP) are planes. The radius of curvature of the above curved surface is 0.01 mm to 2.5 mm and the distance $\Delta e$ of the plane is 80 μm. That is, the semiconductor chip 12 has the overhung portions 17A, 17B which are each formed of a combination of the curved surface and one plane.

In the semiconductor chip 12 shown in FIGS. 22A, 22B, regions extending from the start points SP are vertical planes, regions ranging from the intermediate portions of the vertical planes to portions below the bonding pads 15A, 15B are curved surfaces and regions ranging from the portions below the bonding pads 15A, 15B to the chip end portions (end portions EP) are planes. The radius of curvature of the above curved surface is 0.01 mm to 2.5 mm and the distance $\Delta e$ of each of the vertical plane and horizontal plane is 80 μm. That is, the semiconductor chip 12 has the overhung portions 17A, 17B which are each formed of a combination of the curved surface and two planes.

Figures 21A, 21B:
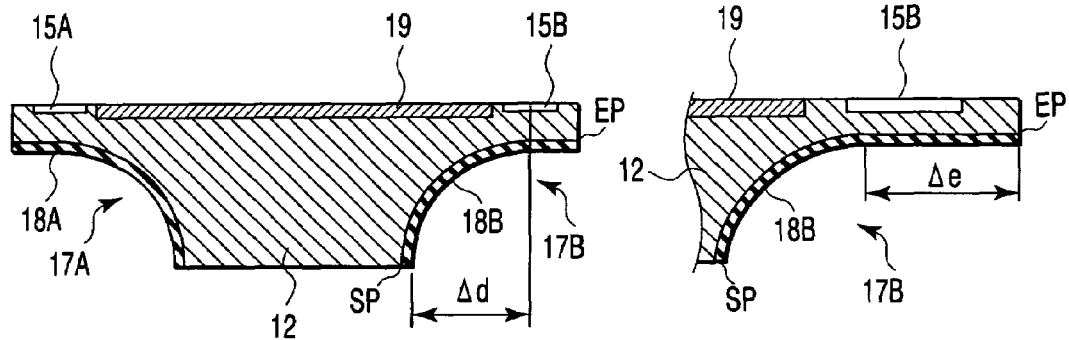
FIG. 21A is a cross sectional view of a semiconductor chip, for illustrating another example of the overhung shape of the semiconductor chip.
FIG. 21B is an enlarged cross sectional view of an overhung portion, for illustrating another example of the overhung shape of the semiconductor chip.
Figures 22A, 22B:
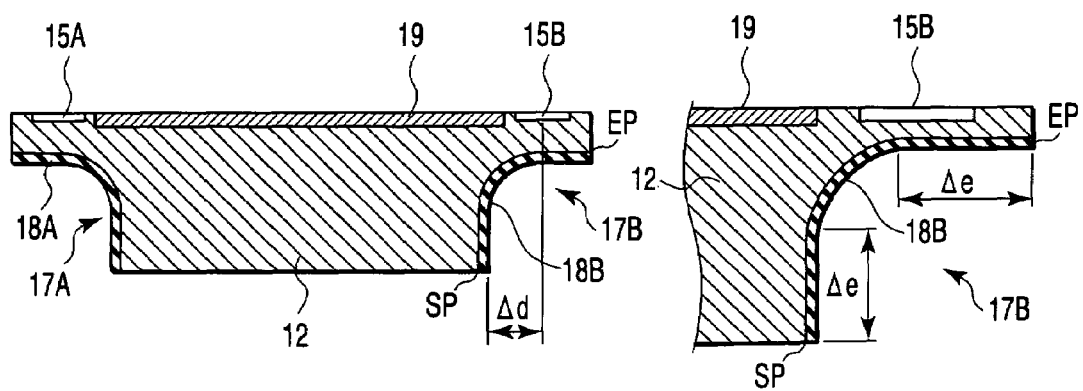
FIG. 22A is a cross sectional view of a semiconductor chip, for illustrating still another example of the overhung shape of the semiconductor chip.
FIG. 22B is an enlarged cross sectional view of an overhung portion, for illustrating still another example of the overhung shape of the semiconductor chip.
Figure 23:
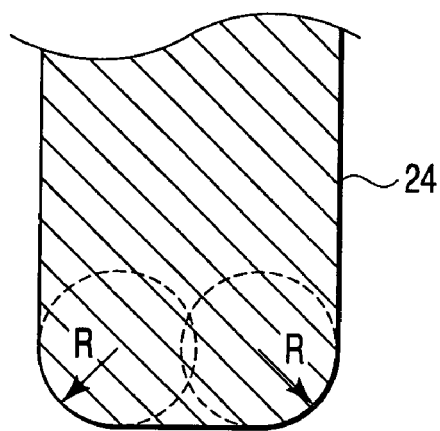
FIG. 23 is an enlarged cross sectional view of a portion near the tip portion of a blade, for illustrating still another example of the blade used to form the second grooves.

FIG. 23 shows a cross sectional shape of the blade 24 used to form the overhung portions 17A, 17B shown in FIGS. 21A, 21B and FIGS. 22A, 22B. As shown in FIG. 23, each of the front end corner portions has the radius of curvature R. If the grooves 25 are formed by use of the portion with the radius of curvature R of the blade 24, the overhung portions 17A, 17B as shown in FIGS. 21A, 21B can be formed. Further, if the grooves 25 are formed by use of a portion which is deeper than the portion with the radius of curvature R of the blade 24, the overhung portions 17A, 17B as shown in FIGS. 22A, 22B can be formed.

Figure 24:
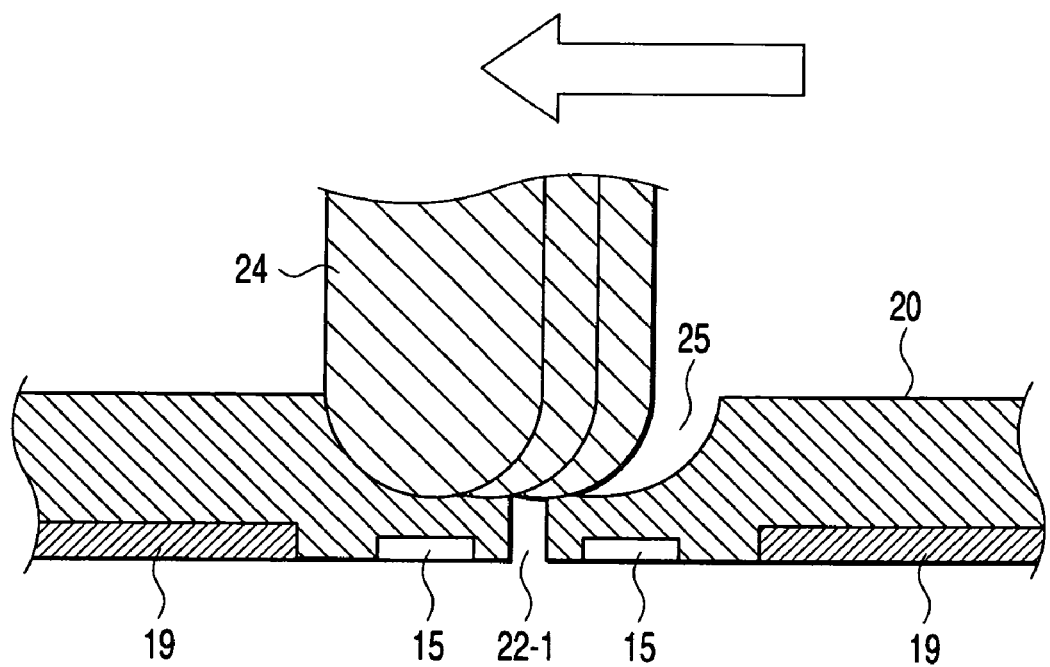
FIG. 24 is an enlarged cross sectional view of a groove forming region, for illustrating another forming step of the second grooves.

As shown in FIG. 24, the overhung portions 17A, 17B with the same shape can be formed by forming a plurality of grooves 25 by use of a blade having the front end portion whose cross section is the curved surface as shown in FIGS. 13 and 14 while shifting the blade position as indicated by an arrow.

Figure 25:
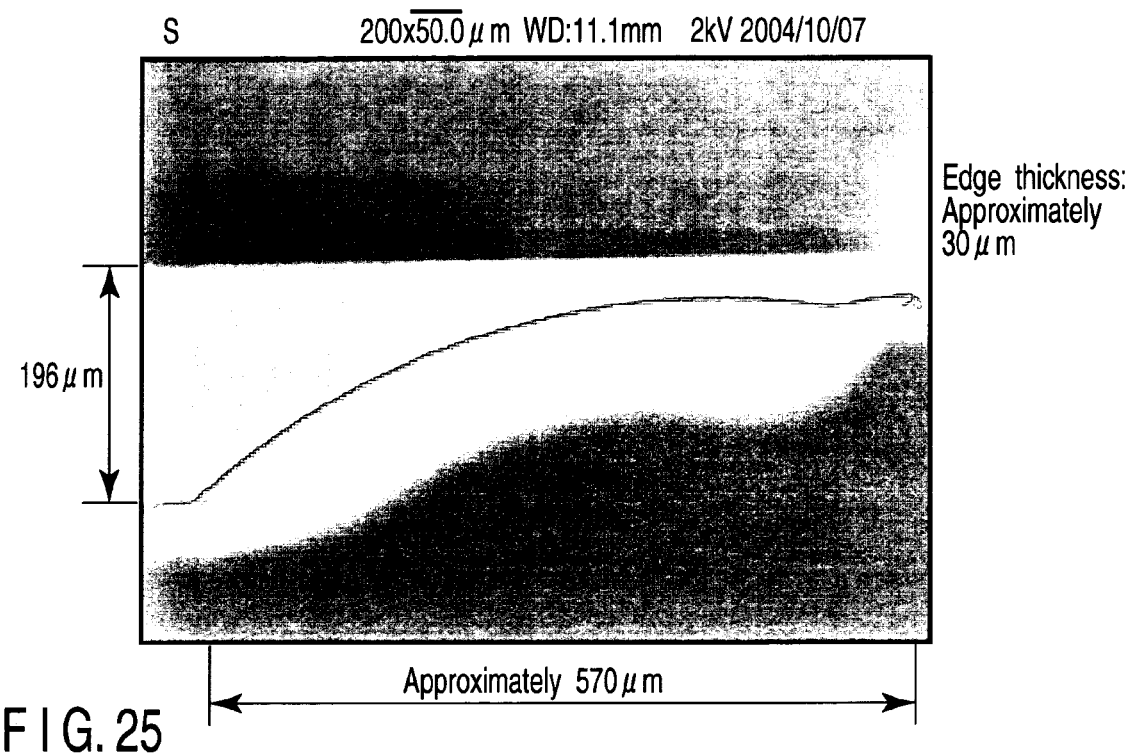
FIG. 25 is a photomicrograph of the overhung portion in the semiconductor chip having the overhung portion formed in the step shown in FIG. 24.
Figure 26:
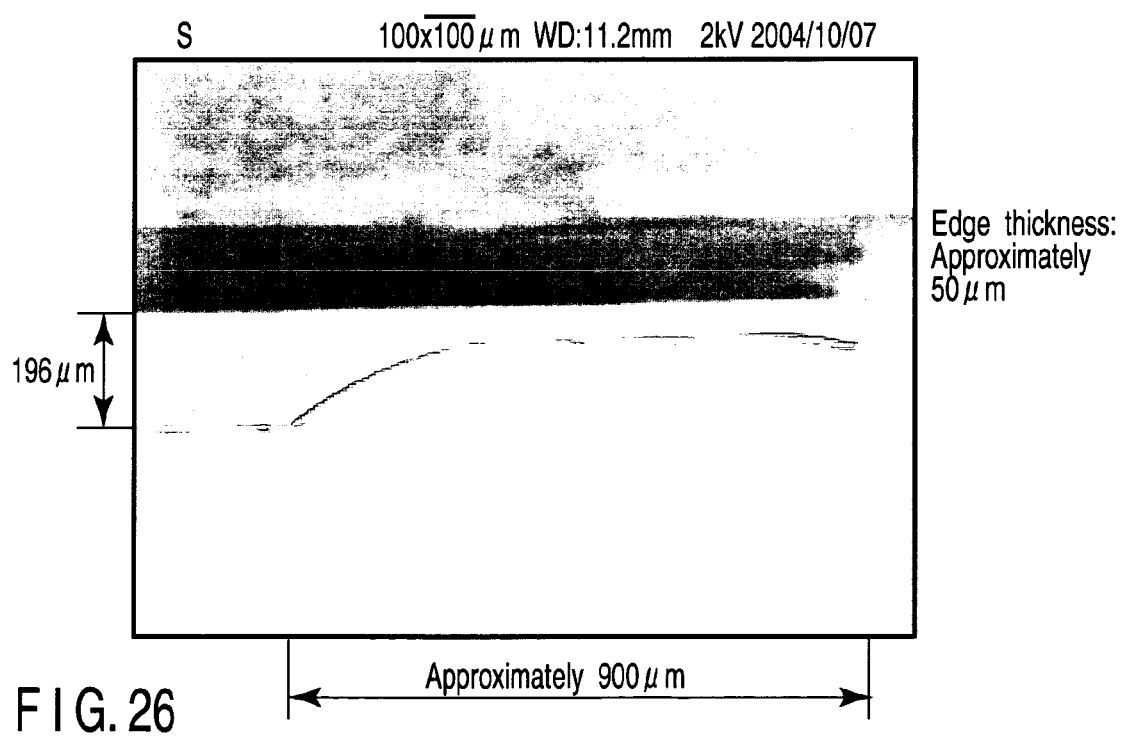
FIG. 26 is a photomicrograph of the overhung portion in another semiconductor chip having the overhung portion formed in the step shown in FIG. 24.

FIGS. 25 and 26 are photomicrographs of the semiconductor chip 12 having the overhung portions 17A, 17B formed by forming a plurality of grooves 25 while shifting the blade position as shown in FIG. 24. In FIG. 25, the thickness of the semiconductor chip is 196 μm, the distance from the start point SP of the overhung portion to the end point EP is approximately 570 μm and the thickness (edge thickness) $\Delta b$ of the chip end portion is approximately 30 μm. In FIG. 26, the thickness of the semiconductor chip is 196 μm, the distance from the start point SP of the overhung portion to the end point EP is approximately 900 μm and the thickness (edge thickness) $\Delta b$ of the chip end portion is approximately 50 μm.

Figure 27:
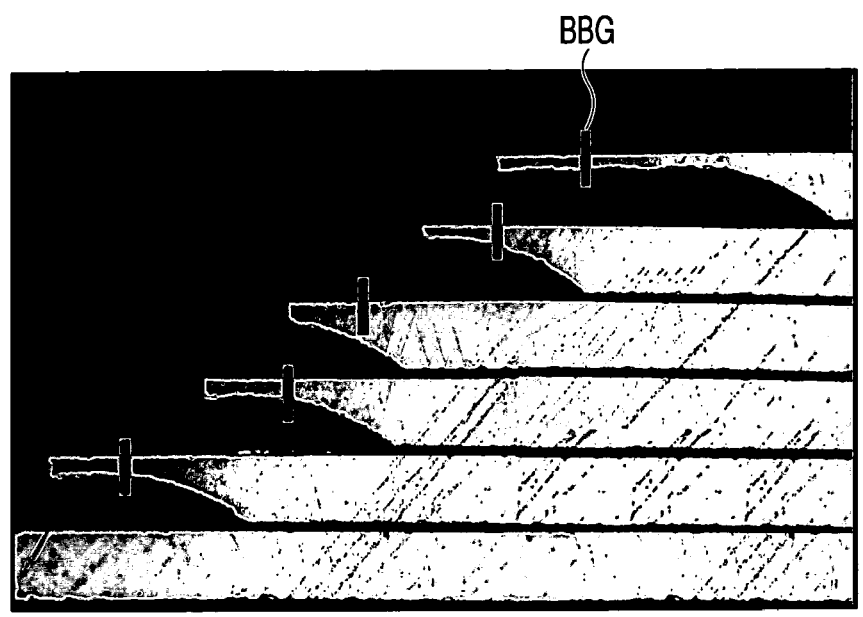
FIG. 27 is a photomicrograph of a state in which semiconductor chips having overhung portions with various sizes formed are stacked.
Figure 28:
FIG. 28 is a photomicrograph of a state in which other semiconductor chips having overhung portions with various sizes formed are stacked.

FIGS. 27 and 28 are photomicrographs of states in which semiconductor chips having overhung portions with various sizes formed are stacked. In FIGS. 27 and 28, BBG (represented by the uppermost semiconductor chip) of the overhung portion of each semiconductor chip shows a portion in which ball bonding is performed. It is understood that sufficiently large spaces used to accommodate the ball bonding portions can be formed between the semiconductor chip and the main surface of the semiconductor chip arranged in the lower stage owing to the overhung portions.

The example in which the chips with the same size or including the upper-stage chip which is larger than the lower-stage chip are stacked is explained in the first embodiment. However, as shown in FIGS. 27 and 28, even when the chip of the upper stage with the smaller size is stacked, the effect can be attained if chips including an upper-stage chip whose outer peripheral portion does not lie inside the bonding position indicated by a vertical short line are stacked and connected by wire bonding.

[Modifications 3, 4 of the Overhung Shape of the Semiconductor Chip in the First Embodiment and the Forming Method thereof]

FIGS. 29A, 29B and FIGS. 30A, 30B show still other examples of the overhung shape of the semiconductor chip 12. In the semiconductor chip 12 shown in FIGS. 29A, 29B, regions starting from the start points SP are vertical planes with respect to the main surface of the chip, regions ranging from the vertical planes to portions below the bonding pads 15A, 15B are planes with large inclination angles and regions ranging from the portions below the bonding pads 15A, 15B to the chip end portions (end points EP) are planes. The distance $\Delta e1$ of the plane is 40 μm, the distance $\Delta e2$ of the plane is 60 μm and the distance $\Delta e3$ of the plane is 100 μm. The planes are set in contact with each other at angles $\Delta f1$, $\Delta f2$ lying between 90 degrees and 180 degrees. That is, the overhung portions 17A, 17B of the semiconductor chip 12 are each formed of a combination (composite plane) of three planes whose inclination angles are different.

Figures 30A, 30B:
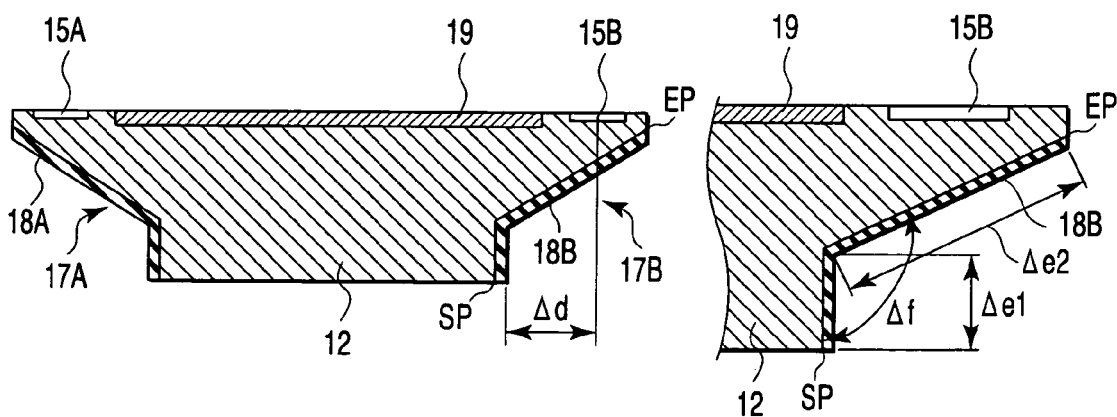
FIG. 30A is a cross sectional view of a semiconductor chip, for illustrating still another example of the overhung shape of the semiconductor chip.
FIG. 30B is an enlarged cross sectional view of an overhung portion, for illustrating still another example of the overhung shape of the semiconductor chip.

In the semiconductor chip shown in FIGS. 30A, 30B, regions starting from the start points SP vertically extend with respect to the main surface of the chip and regions extending from the intermediate portions of the vertical planes and reaching the chip side walls (end points EP) are planes with constant inclination angles. The distance $\Delta e1$ of the plane is 40 μm and the distance $\Delta e2$ of the plane is 330 μm. The planes are set in contact with each other at an angle $\Delta f$ lying between 90 degrees and 180 degrees. That is, the overhung portions 17A, 17B of the semiconductor chip 12 are each formed of a combination of two planes.

Of course, the region extending from the start point SP to the chip side wall (end point EP) may be formed of one plane which becomes thinner in a direction towards the outer periphery and having a constant inclination angle.

Figures 29A, 29B:
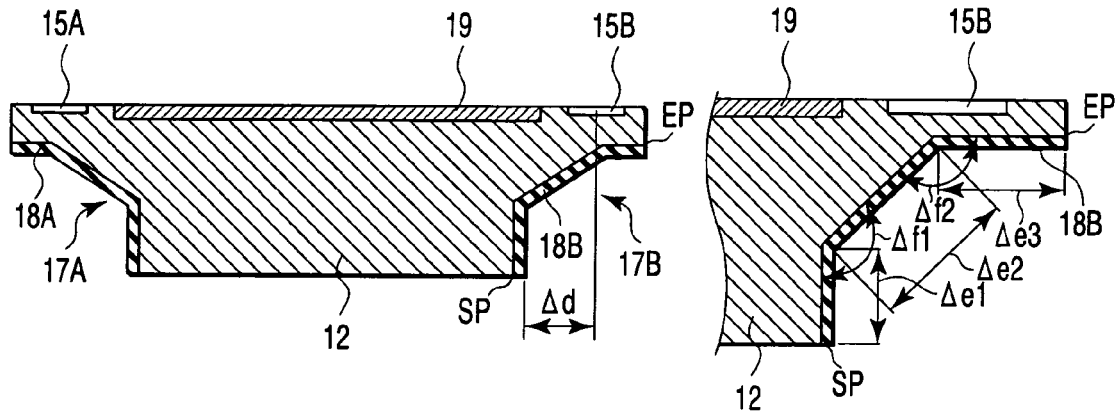
FIG. 29A is a cross sectional view of a semiconductor chip, for illustrating another example of the overhung shape of the semiconductor chip.
FIG. 29B is an enlarged cross sectional view of an overhung portion, for illustrating another example of the overhung shape of the semiconductor chip.
Figure 31:
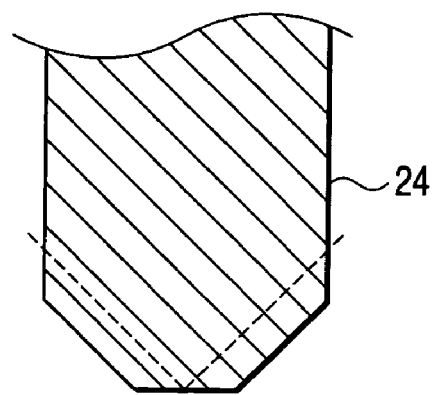
FIG. 31 is an enlarged cross sectional view of a portion near the tip portion, for illustrating still another example of the blade used to form the second grooves.

FIG. 31 shows a cross sectional shape of the blade 24 used to form the overhung portions 17A, 17B shown in FIGS. 29A, 29B. As shown in FIG. 31, the corner portions of the tip have inclination angles corresponding to the angles $\Delta f1$, $\Delta f2$. If the groove 25 is formed by use of the blade 24, the overhung portions shown in FIGS. 29A, 29B can be formed.

Further, if the inclination angle of the blade 24 is set to an inclination angle corresponding to the angle $\Delta f$ as shown by broken lines, the overhung portions 17A, 17B shown in FIGS. 30A, 30B can be formed.

Figure 32:
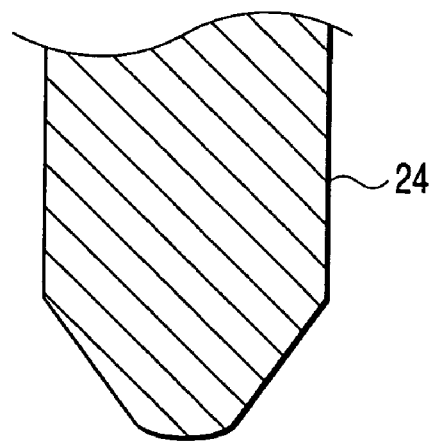
FIG. 32 is an enlarged cross sectional view of a portion near the tip end portion, for illustrating still another example of the blade used to form the second grooves.

As shown in FIG. 32, if a blade having plane corner portions with certain inclination angles and a tip portion of a curved surface is used, overhung portions having curved surfaces which extend from portions lying below the bonding pads 15A, 15B to the end points EP can be formed.

[A Modification 1 of the Forming Position of Grooves Used to Form the Overhung Portions in the First Embodiment]

In the first embodiment described above, a case wherein the overhung portions are formed in one direction along the dicing lines or chip dividing lines (along the two opposite sides of the chip) of the semiconductor wafer as shown in FIGS. 12A, 12B and a case wherein the overhung portions are formed along the four sides of the chip as shown in FIGS. 33a, 33B are explained.

The formation position of the overhung portion is not necessarily determined according to the arrangement of the bonding pads of the chip arranged in the lower stage. It is possible to form overhung portions along the two opposite sides as shown in FIGS. 12A, 12B when the bonding pads of the lower-stage chip are formed on one side of the chip. Further, it is possible to form overhung portions along all of the dicing lines or chip dividing lines (four opposite sides of the chip) of the semiconductor wafer as shown in FIGS. 33A, 33B when the bonding pads of the lower-stage chip are formed on one side, two sides or three sides of each chip.

[A Modification 2 of the Forming Position of Grooves Used to Form the Overhung Portions in the First Embodiment]

The same operation and effect can be attained by forming the overhung portions by cutting away only portions corresponding to the bonding wires as shown in FIGS. 34A, 34B.

In FIGS. 34A, 34B, the cut-away portions are formed along the two opposite sides of the chip, but it is of course possible to form the cut-away portions along one side, three sides or four sides of the chip.

[A Modification of a Method of Forming Grooves in the First Embodiment]

After the second grooves 25-1, 25-2, . . . are formed to form the overhung portions in the step shown in FIGS. 5A, 5B and before the insulating layers 18 are formed, portions in the second grooves 25-1, 25-2, are etched. For the etching process, a plasma etching or wet etching process can be applied and a CMP process can be used. Thus, processing distortion such as cutting distortion or cutting scratches by the diamond blade 24 can be eliminated.

Next, various modifications of the stacked structure of the semiconductor chips shown in FIG. 1 are explained with reference to FIGS. 35 to 41. The basic structures of FIGS. 35 to 41 are the same as that of FIG. 1 and only the portions different from the structure shown in FIG. 1 are explained below.

[A Modification 1 of the Stacked Structure of the Semiconductor Chips in the First Embodiment]

Figure 35:
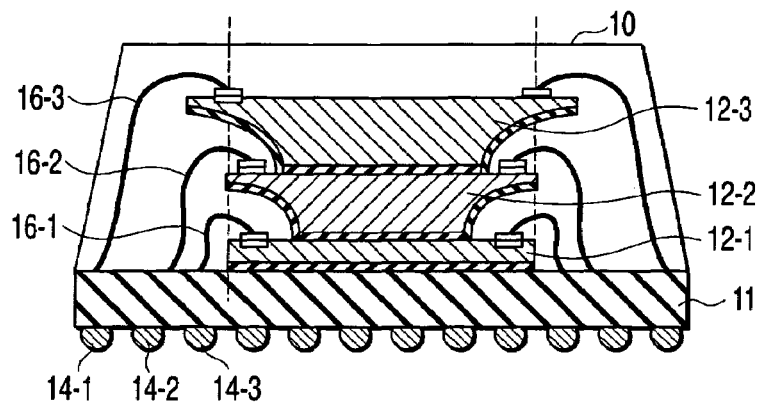
FIG. 35 is a cross sectional view showing a modification 1 of the stacked structure of semiconductor chips in the stack MCP, for illustrating a semiconductor device according to another embodiment of this invention.

FIG. 35 shows another example of the stacked structure of the semiconductor chips in the stack MCP. In this example, the sizes of first-stage and second-stage semiconductor chips 12-1, 12-2 are the same and the size of a third-stage semiconductor chip 12-3 is larger than that of the semiconductor chip 12-1, 12-2.

[A Modification 2 of the Stacked Structure of the Semiconductor Chips in the First Embodiment]

Figure 36:
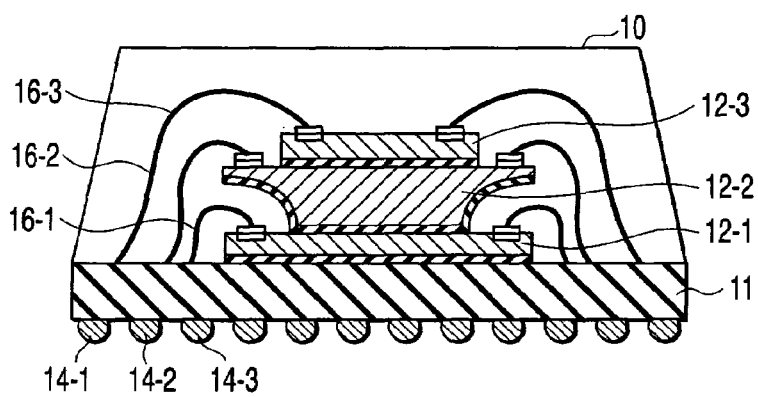
FIG. 36 is a cross sectional view showing a modification 2 of the stacked structure of semiconductor chips in the stack MCP, for illustrating a semiconductor device according to another embodiment of this invention.

In an example shown in FIG. 36, the sizes of first-stage and second-stage semiconductor chips 12-1, 12-2 are the same, the size of a third-stage semiconductor chip 12-3 is smaller than that of the semiconductor chips 12-1, 12-2, and the outer periphery thereof is set inside the wire bonding portions.

[A Modification 3 of the Stacked Structure of the Semiconductor Chips in the First Embodiment]

Figure 37:
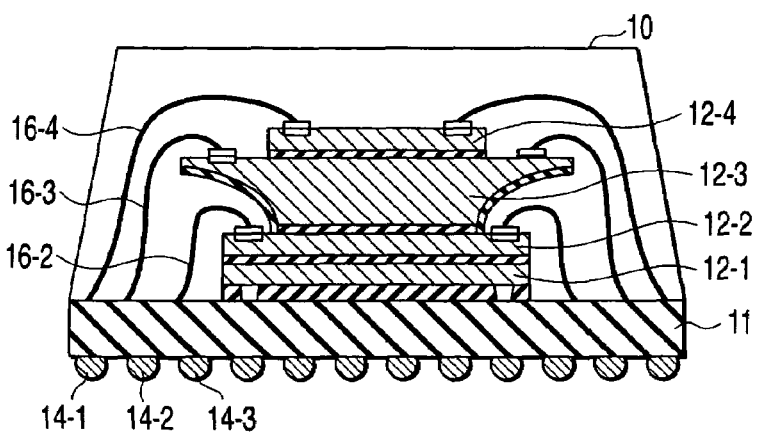
FIG. 37 is a cross sectional view showing a modification 3 of the stacked structure of semiconductor chips in the stack MCP, for illustrating a semiconductor device according to another embodiment of this invention.

In an example shown in FIG. 37, a first-stage semiconductor chip 12-1 is mounted on the surface of the circuit board 11 by use of a flip chip and a second-stage semiconductor chip 12-2 of the same size is mounted on the backside of the chip 12-1 with a DAF disposed therebetween. The chip 12-2 is connected to printed wirings formed on the chip mounting surface of the circuit board 11 via bonding wires 16-2. On the chip 12-2, a third-stage semiconductor chip 12-3 with the size larger than the first-stage and second-stage semiconductor chips 12-1, 12-2 is mounted with a DAF disposed therebetween and overhung portions thereof are arranged to form spaces which accommodate ball bonding portions between the overhung portions and the main surface of the chip 12-2.

The chip 12-3 is connected to printed wirings formed on the chip mounting surface of the circuit board 11 via bonding wires 16-3. On the chip 12-3, a fourth-stage semiconductor chip 12-4 is mounted with a DAF disposed therebetween. The size of the chip 12-4 is smaller than that of the chip 12-3 and the outer periphery thereof is set inside the wire bonding portions.

In FIG. 37, the first-stage chip 12-1 is mounted (pressure-bonded) on the circuit board 11 by use of a flip chip method, but the chip stacked in the upper stage can be mounted on the lower-stage chip by use of the flip chip method if the sizes thereof (the positions of the bonding pads) are the same.

[A Modification 4 of the Stacked Structure of the Semiconductor Chips in the First Embodiment]

Figure 38:
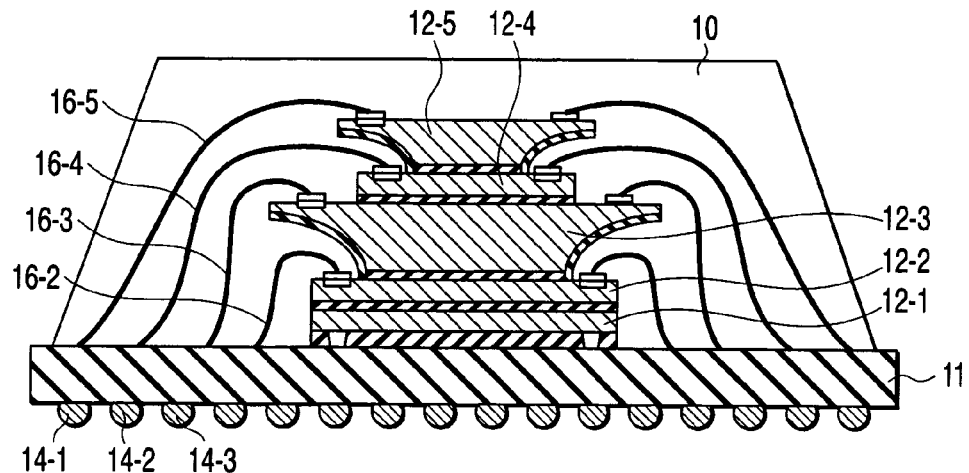
FIG. 38 is a cross sectional view showing a modification 4 of the stacked structure of semiconductor chips in the stack MCP, for illustrating a semiconductor device according to another embodiment of this invention.

In an example shown in FIG. 38, a fifth-stage semiconductor chip 12-5 is further stacked on the fourth-stage semiconductor chip 12-4 shown in FIG. 37. The fifth-stage semiconductor chip 12-5 is mounted on the chip 12-4 with a DAF disposed therebetween so that the overhung portions thereof may be arranged to form spaces which accommodate ball bonding portions between the overhung portions and the main surface of the chip 12-4. The chip 12-5 is connected to printed wirings formed on the chip mounting surface of the circuit board 11 via bonding wires 16-5.

[A Modification 5 of the Stacked Structure of the Semiconductor Chips in the First Embodiment]

Figure 39:
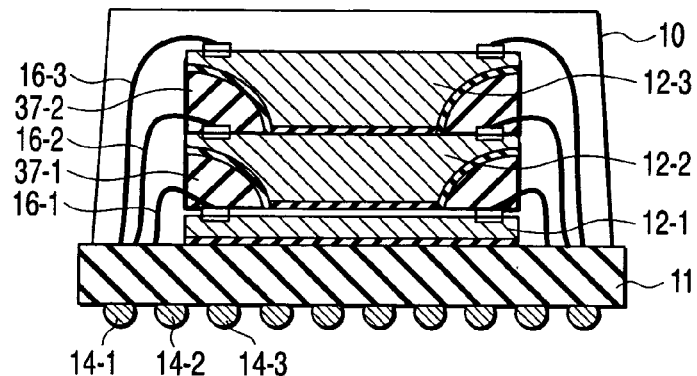
FIG. 39 is a cross sectional view showing a modification 5 of the stacked structure of semiconductor chips in the stack MCP, for illustrating a semiconductor device according to another embodiment of this invention.

In an example shown in FIG. 39, the spaces formed between the main surface of the chip 12-1 and the overhung portions of the chip 12-2 are filled with insulating members 37-1 formed of polyimide-series or epoxy-series resin in the stack MCP shown in FIG. 1. Further, the spaces formed between the main surface of the chip 12-2 and the overhung portions of the chip 12-3 are filled with insulating members 37-2 formed of polyimide-series or epoxy-series resin.

Penetration of water into the bonding portions can be more effectively prevented by use of the insulating members 37-1, 37-2 and thus the reliability can be enhanced. Further, since the bonding connection margin of the upper-stage chip can be enhanced by filling the spaces lying under the overhung portions with the insulating members 37-1, the chip can be made thin.

[A Modification 6 of the Stacked Structure of the Semiconductor Chips in the First Embodiment]

In the example shown in FIG. 39, the chip 12-2 is mounted on the chip 12-1 and the chip 12-3 is mounted on the chip 12-2 with the DAFs respectively disposed therebetween. However, in an example shown in FIG. 40, the chip 12-2 is affixed and mounted on the chip 12-1 by use of insulating members 37-1 filled into spaces between the main surface of the chip 12-1 and the overhung portions of the chip 12-2 and the chip 12-3 is affixed and mounted on the chip 12-2 by use of insulating members 37-2 filled into spaces between the main surface of the chip 12-2 and the overhung portions of the chip 12-3.

Thus, the chips can adhered to each other by use of the insulating members 37-1, 37-2 filled into the spaces instead of the DAFs.

[A Modification 7 of the Stacked Structure of the Semiconductor Chips in the First Embodiment]

Figure 41:
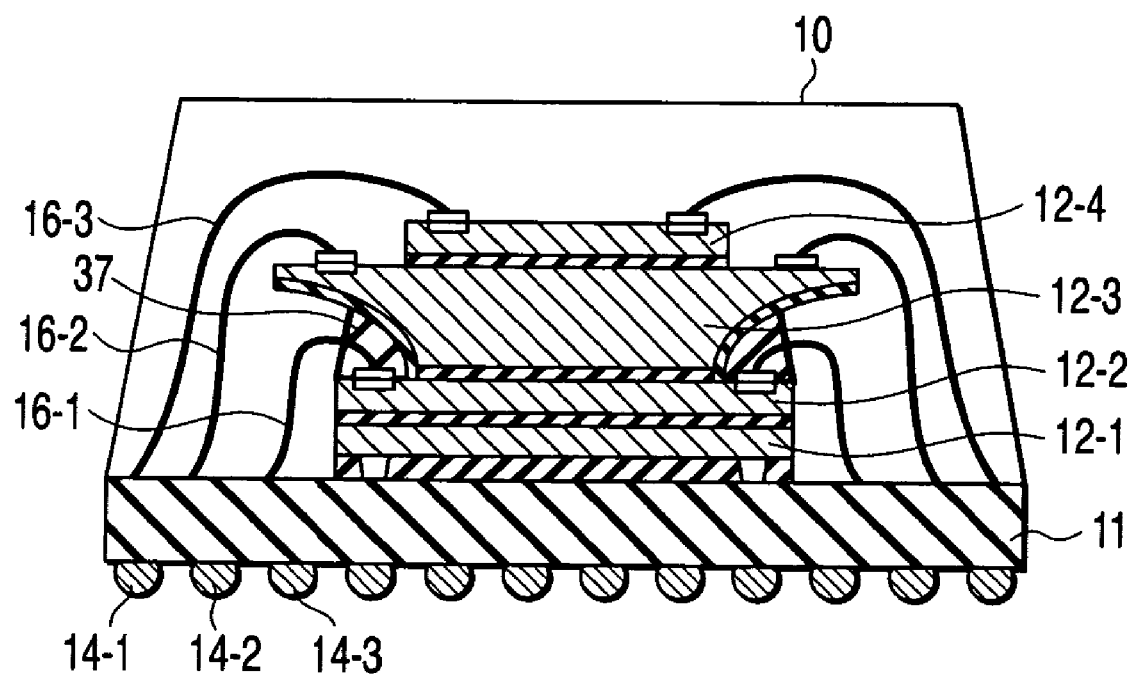
FIG. 41 is a cross sectional view showing a modification 7 of the stacked structure of semiconductor chips in the stack MCP, for illustrating a semiconductor device according to another embodiment of this invention.

In an example shown in FIG. 41, the spaces formed between the main surface of the chip 12-2 and the overhung portions of the chip 12-3 are filled with insulating members 37 formed of polyimide-series or epoxy-series resin in the stack MCP shown in FIG. 37.

Penetration of water into the bonding portions can be more effectively prevented by the presence of the insulating members 37 and thus the reliability can be enhanced.

Further, like the case of the stacked structure shown in FIGS. 35, 36 and 38, it is possible to fill the spaces between the main surface of the lower-stage chip and the overhung portions of the upper-stage chip with the insulating members formed of polyimide-series or epoxy-series resin.

Figure 40:
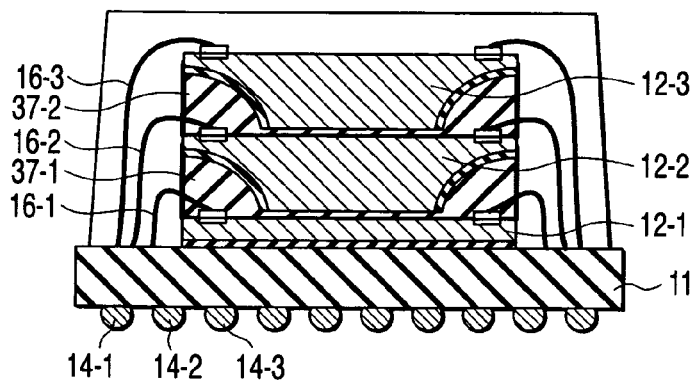
FIG. 40 is a cross sectional view showing a modification 6 of the stacked structure of semiconductor chips in the stack MCP, for illustrating a semiconductor device according to another embodiment of this invention.

In this case, as shown in FIG. 40, insulating members can be used for bonding between the chips instead of the DAFs.

Next, various modifications of the manufacturing process are explained.

[A Modification 1 of the Manufacturing Process in the First Embodiment]

FIGS. 42A, 42B to FIGS. 50A, 50B are shown to explain another manufacturing process (modification 1) of the stack MCP, FIGS. 42A to 50A are perspective views and FIGS. 42B to 50B are cross sectional views of FIGS. 42A to 50A.

The manufacturing process in the modification 1 is different from the process shown in FIGS. 4A, 4B to FIGS. 11A, 11B in that the backside of a semiconductor wafer is ground in the backside grinding step shown in FIGS. 44A, 44B and then the ground surface is mirror-finished by performing the plasma etching, wet etching, dry polishing, gas etching, CMP, buffing process or the like. In FIGS. 45A, 45B, a mirror-finishing step by use of a polishing device 38 is shown.

Since other basic manufacturing steps are the same as those shown in FIGS. 4A, 4B to FIGS. 11A, 11B, the same portions are denoted by the same reference symbols and the detail explanation thereof is omitted.

According to the above manufacturing method, occurrence of cracks or breakage at the pickup time can be suppressed by making flat the backside of the chip. Further, concentration of stress caused by pressure applied at the ball bonding time can be prevented by making flat the inner walls of the grooves 25-1, 25-2, . . . .

[A Modification 2 of the Manufacturing Process in the First Embodiment]

FIGS. 51A, 51B to FIGS. 58A, 58B are shown to explain another manufacturing process (modification 2) of the stack MCP, FIGS. 51A to 58A are perspective views and FIGS. 51B to 58B are cross sectional views of FIGS. 51A to 58A.

The manufacturing process in the modification 2 is different from the process shown in FIGS. 4A, 4B to FIGS. 11A, 11B in that the forming step of the second grooves 25-1, 25-2, . . . is performed after the backside grinding process of the semiconductor wafer.

Since other basic manufacturing steps are the same as those shown in FIGS. 4A, 4B to FIGS. 11A, 11B, the same portions are denoted by the same reference symbols and the detail explanation thereof is omitted.

With the above manufacturing method, the operation and effect which are basically the same as those of the method shown in FIGS. 4A, 4B to FIGS. 11A, 11B can be attained.

[A Modification 3 of the Manufacturing Process in the First Embodiment]

FIGS. 59A, 59B to FIGS. 67A, 67B are shown to explain another manufacturing process (modification 3) of the stack MCP, FIGS. 59A to 67A are perspective views and FIGS. 59B to 67B are cross sectional views of FIGS. 59A to 67A.

The manufacturing process in the modification 3 is a combination of the modifications 1 and 2 and performs a second groove forming step after the backside grinding step of the semiconductor wafer and then performs a mirror-finishing process by performing the plasma etching, wet etching, dry polishing, gas etching, CMP, buffing process or the like. FIGS. 62A, 62B representatively show the polishing process.

Since other basic manufacturing steps are the same as those of the modifications 1 and 2, the same portions are denoted by the same reference symbols and the detail explanation thereof is omitted.

With the above manufacturing method, the operation and effect which are basically the same as those of the method shown in FIGS. 4A, 4B to FIGS. 11A, 11B and the modifications 1 and 2 can be attained.

[A Modification 4 of the Manufacturing Process in the First Embodiment]

FIGS. 68A, 68B to FIGS. 76A, 76B are shown to explain another manufacturing process (modification 4) of the stack MCP, FIGS. 68A to 76A are perspective views and FIGS. 68B to 76B are cross sectional views of FIGS. 68A to 76A.

In the first embodiment and the modifications 1 to 3, the DAF 27 and dicing tape 28 are simultaneously affixed to the semiconductor wafer. However, in the manufacturing process of the modification 4, the DAF 27 and dicing tape 28 are affixed to the semiconductor wafer in different steps.

That is, first, semiconductor elements are formed on the main surface of the semiconductor wafer and then bonding pads electrically connected to the semiconductor elements are formed by a known manufacturing process.

Next, as shown in FIGS. 68A, 68B, first grooves 22-1, 22-2, 22-3, . . . are formed along dicing lines or chip dividing lines in the main surface of the semiconductor wafer 20 by use of a diamond blade 21 or the like (half-cut dicing).

Next, as shown in FIGS. 69A, 69B, a BSG tape (surface protection tape) 23 is affixed to the main surface of the semiconductor wafer 20 and the backside portion of the semiconductor wafer is ground by use of a grinding stone 26 or the like so as to set the semiconductor wafer to desired thickness. As a result, the semiconductor wafer 20 is discretely divided to form semiconductor chips 12, 12, . . . .

Next, as shown in FIGS. 70A, 70B, the ground surface is mirror-finished by performing the plasma etching, wet etching, dry polishing, gas etching, CMP, buffing process or the like. In FIGS. 70A, 70B, the polishing process is shown as a representative.

After this, the wafer 20 is placed on a stage 31 and a DAF (or a bonding agent) 27 is affixed to the mirror-finished backside by use of a roller 29 or the like.

Next, the DAF 27 is cut apart along the dicing lines or chip dividing lines on the backside of the semiconductor wafer 20 by use of a blade 24 to form second grooves 25-1, 25-2, . . . used to form overhung portions along the two or four opposite sides of the chips (in this example, a case wherein the second grooves are formed along the four sides).

On the surfaces of the overhung portions thus formed, insulating layers 18 are formed as shown in FIG. 16. As the insulating layer 18, for example, a silicon oxide film or an organic material such as polyimide can be used. Further, by forming the insulating layers 18 not only on the surfaces of the overhung portions but also on the side walls of the chips 12 as shown in FIG. 17, occurrence of a short circuit or leak due to contact with the bonding wire can be effectively prevented.

After this, as shown in FIGS. 73A, 73B, the semiconductor chips 12, 12, . . . with the cut-apart DAFs 27 are placed on the stage 31, then a dicing tape 28 is affixed to the DAFs 27 by use of a roller 29 and thus the wafer is mounted on a wafer ring 30.

Then, as shown in FIGS. 74A, 74B, the surface protection tape 23 is separated.

Next, as shown in FIGS. 75A, 75B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be brought into direct contact with the backside of the chip 12 and are further pushed upwardly to separate the chip 12 from the dicing tape 28. At this time, as shown in FIG. 18, the pickup needles 33 are brought into contact with the thick portions of the chip 12 and pushed upward to separate the chip from the dicing tape 28. The DAF 27 is adhered to the backside of the thus separated chip 12 and the chip is fed in this state while the chip surface is attracted by a collet 34.

Next, the chips 12 thus fed by the collet 34 are stacked and mounted on the circuit board 11 having external connection electrodes 14-1, 14-2, . . . and stacked in a multi-layered form by electrically connecting semiconductor elements formed on the main surface of each semiconductor chip with printed wirings of the circuit board 11 by wire bonding each time the semiconductor chip is mounted.

In FIGS. 76A, 76B, a case wherein the first-stage chip 12-1 has uniform and small thickness is taken as an example and a wire bonded state is shown. The semiconductor chip 12-2 formed in the step described above is stacked and mounted on the chip 12-1 with the DAF 27 disposed therebetween and then a wire bonding process is performed to electrically connect the bonding pads of the chip 12-2 to printed wirings formed on the surface of the circuit board 11. When the chip 12-2 is stacked and mounted on the chip 12-1, the overhung portions are arranged in positions corresponding to the ball bonding portions of the semiconductor chip arranged in the lower stage. Thus, spaces to accommodate the ball bonding portions are formed between the chip 12-2 and the main surface of the chip 12-1 arranged in the lower stage.

After this, the process of stacking a plurality of semiconductor chips and the wire bonding process are repeatedly performed according to the package structure.

Then, the stacked semiconductor chips and wire bonding portions are covered with sealing resin (mold resin) (or molded).

[A Modification 5 of the Manufacturing Process in the First Embodiment]

FIGS. 77A, 77B to FIGS. 85A, 85B are shown to explain still another manufacturing process (modification 5) of the above stack MCP, FIGS. 77A to 85A are perspective views and FIGS. 77B to 85B are cross sectional views of FIGS. 77A to 85A.

As shown in FIGS. 78A, 78B, the manufacturing process of the modification 5 is to form the ground surface of the semiconductor wafer to depth so as not to reach the first grooves 22-1, 22-2, 22-3, . . . when the backside of the semiconductor wafer is ground. Therefore, the wafer 20 is not discretely divided in the backside grinding step and is discretely divided when second grooves 25-1, 25-2, . . . . are formed along the dicing lines or chip dividing lines in a step shown in FIGS. 81A, 81B.

In this modification, since it is necessary to form the second grooves 25-1, 25-2, . . . along all of the dicing lines or chip dividing lines when the first grooves 22-1, 22-2, 22-3, . . . are formed with the same depth, overhung portions are formed along the four sides of the chips.

Of course, if portions of two opposite sides of the chip in which overhung portions are to be formed are made shallow and portions of the other two sides are made deep at the time of formation of the first grooves 22-1, 22-2, 22-3, . . . and the backside is ground to reach the deep grooves formed along the other two sides at the backside grinding time, the semiconductor wafer can be discretely divided into individual chips at the time of formation of the second grooves 25-1, 25-2, . . . .

The other basic manufacturing steps are the same as those of the modification 4 and, therefore, the same portions are denoted by the same reference symbols and the detail explanation thereof is omitted.

With the above manufacturing method, the same operation and effect as those of the modification 4 can be basically attained.

[A Modification 6 of the Manufacturing Process in the First Embodiment]

FIGS. 86A, 86B to FIGS. 92A, 92B illustrate another manufacturing process (modification 6) of the stack MCP, FIGS. 86A to 92A are perspective views and 86B to 92B are cross sectional views of FIGS. 86A to 92A.

The manufacturing process of the modification 6 is different from those of the above first embodiment and the modifications 1 to 5 in that first grooves 22-1, 22-2, 22-3, . . . which discretely divide the wafer are formed after second grooves 25-1, 25-2, . . . to form overhung portions are formed.

That is, first, semiconductor elements are formed on the main surface of the semiconductor wafer and then bonding pads electrically connected to the semiconductor elements are formed by a known manufacturing process.

Next, as shown in FIGS. 86A, 86B, the backside portion of the semiconductor wafer 20 is ground by use of a grinding stone 26 or the like to desired thickness.

Then, as shown in FIGS. 87A, 87B, a BSG tape (surface protection tape) 23 is affixed to the main surface of the semiconductor wafer 20 and the ground surface is mirror-finished by performing the plasma etching, wet etching, dry polishing, gas etching, CMP, buffing process or the like. In FIGS. 87A, 87B, the polishing process is shown as a representative.

After this, as shown in FIGS. 88A, 88B, second grooves 25-1, 25-2, . . . are formed along the dicing lines or chip dividing lines in the backside of the semiconductor wafer 20 by use of a blade 24.

Insulating layers 18 are formed on the internal surfaces of the second grooves 25-1, 25-2, . . . thus formed as shown in FIG. 16. As the insulating layer 18, for example, a silicon oxide film or organic material such as polyimide can be used. Further, as shown in FIG. 17, if insulating layers 18 are formed not only on the surface of the overhung portion but also on the side wall of the chip, a short circuit or leak due to contact with a bonding wire can be effectively prevented.

Next, as shown in FIGS. 89A, 89B, the wafer 20 is placed on a stage 31, a DAF (or a bonding agent) 27 and dicing tape 28 are affixed to the mirror-finished backside by use of a roller 29 and then the wafer is mounted on a wafer ring 30.

Figure 90A:
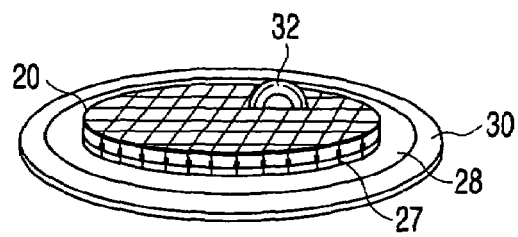
Figure 90B:
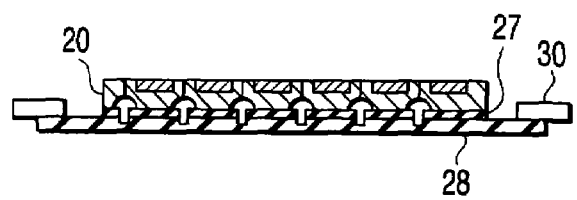

After this, as shown in FIGS. 90A, 90B, the semiconductor wafer 20 is diced (full-cut dicing) along the dicing lines or chip dividing lines of the wafer on the main surface of the wafer by use of a diamond blade 32 or the like. Thus, the semiconductor wafer 20 is discretely divided to form semiconductor chips 12, 12, . . . .

Figure 91A:
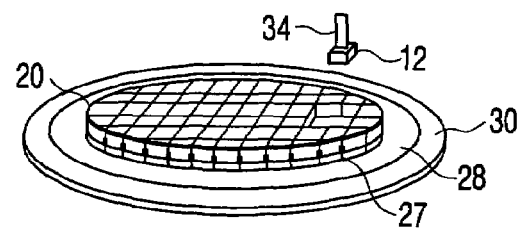
Figure 91B:
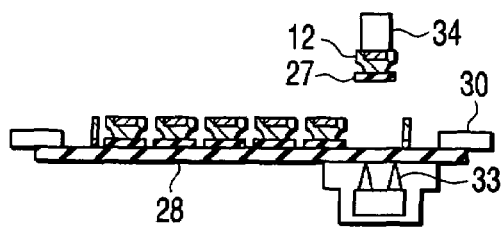

Next, as shown in FIGS. 91A, 91B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be directly brought into contact with the backside of the chip 12 and are further pushed upwardly to separate the chip 12 from the dicing tape 28. At this time, as shown in FIG. 18, the pickup needles 33 are brought into contact with the thick portions of the chip 12 and pushed upward to separate the chip from the dicing tape 28. The DAF 27 is adhered to the backside of the thus separated chip 12 and the chip is fed in this state while the chip surface is attracted by a collet 34.

Figure 92A:
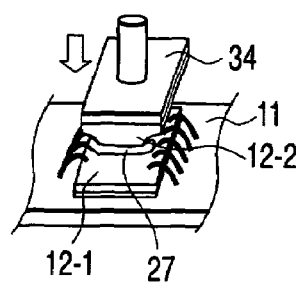
Figure 92B:
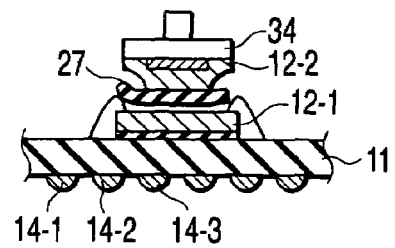

After this, as shown in FIGS. 92A, 92B, the chips 12 thus fed by the collet 34 are stacked and mounted on the circuit board 11 having the external connection electrodes 14-1, 14-2, . . . and stacked in a multi-layered form by electrically connecting semiconductor elements formed on the main surface of each semiconductor chip to printed wirings of the circuit board by wire bonding each time the semiconductor chip is mounted.

In FIGS. 92A, 92B, a case wherein the first-stage chip 12-1 has uniform and small thickness is taken as an example and a state in which it is subjected to wire bonding is shown. The semiconductor chip 12-2 formed in the step described above is stacked and mounted on the chip 12-1 with the DAF 27 disposed therebetween and then a wire bonding process is performed to electrically connect the bonding pads of the chip 12-2 to printed wirings formed on the surface of the circuit board 11. When the chip 12-2 is stacked and mounted on the chip 12-1, the overhung portions are arranged to correspond in position to the ball bonding portions of the semiconductor chip arranged in the lower stage. Thus, spaces which accommodate the ball bonding portions are formed between the overhung portions and the main surface of the chip 12-1 arranged in the lower stage.

After this, the process of stacking a plurality of semiconductor chips and the wire bonding process are repeatedly performed according to the package structure.

Then, the stacked semiconductor chips and wire bonding portions are covered with sealing resin (mold resin) (or molded).

[A Modification 7 of the Manufacturing Process in the First Embodiment]

FIGS. 93A, 93B to FIGS. 100A, 100B illustrate another manufacturing process (modification 7) of the stack MCP, FIGS. 93A to 100A are perspective views and 93B to 100B are cross sectional views of FIGS. 93A to 100A.

The manufacturing process of the modification 7 is different from the modification 6 in that a DAF is affixed to the backside of the semiconductor wafer after the backside thereof is mirror-finished.

That is, the backside of the wafer is mirror-finished as shown in FIGS. 94A, 94B and then a DAF 27 is affixed to the backside of the wafer 20 as shown in FIGS. 95A, 95B to form second grooves 25-1, 25-2, . . . as shown in FIGS. 96A, 96B. After this, a dicing tape 28 is affixed to the DAF 27 by use of a roller 29 or the like as shown in FIGS. 97A, 97B and thus the wafer is mounted on a wafer ring 30. Then, as shown in FIGS. 98A, 98B, the wafer 20 is discretely divided to form semiconductor chips 12 by use of a diamond blade 32 or the like.

The other manufacturing steps are the same as those of the modification 6, and therefore, the detail explanation thereof is omitted.

[A Modification 8 of the Manufacturing Process in the First Embodiment]

FIGS. 101A, 101B to FIGS. 107A, 107B illustrate another manufacturing process (modification 8) of the stack MCP, FIGS. 101A to 107A are perspective views and 101B to 107B are cross sectional views of FIGS. 101A to 107A.

In the manufacturing process of the modification 8, the chips are bonded together without using a DAF to form the structure as shown in FIG. 40.

That is, first, semiconductor elements are formed on the main surface of the semiconductor wafer and then bonding pads electrically connected to the semiconductor elements are formed by a known manufacturing process.

Then, as shown in FIGS. 101A, 101B, first grooves 22-1, 22-2, 22-3, . . . are formed along dicing lines or chip dividing lines in the main surface of the semiconductor wafer 20 by use of a diamond blade 21 or the like (half-cut dicing).

Next, as shown in FIGS. 102A, 102B, a BSG tape (surface protection tape) 23 is affixed to the main surface of the semiconductor wafer 20 and second grooves 25-1, 25-2, . . . used to form the overhung portions are formed along the dicing lines or chip dividing lines in the backside of the semiconductor wafer 20 by use of a diamond blade 24. The second grooves 25-1, 25-2, . . . are formed in positions corresponding to the two or four opposite sides of each semiconductor chip 12 as shown in FIGS. 12A, 12B. The second grooves 25-1, 25-2, . . . are formed to have opening portions which are formed wider than regions between bonding pads of the adjacent semiconductor chips in portions of the backside corresponding to the bonding pads between the adjacent semiconductor chips and formed to depths to reach at least the first grooves 22-1, 22-2, 22-3, . . . .

As shown in FIG. 16, insulating layers 18 are formed on the surfaces of the overhung portions thus formed. As the insulating layer 18, for example, a silicon oxide film or organic material such as polyimide can be used. Further, as shown in FIG. 17, if insulating layers 18 are formed not only on the surface of the overhung portion but also on the side wall of the chip 12, a short circuit or leak due to contact with a bonding wire can be effectively prevented.

After this, as shown in FIGS. 103A, 103B, the backside portion of the semiconductor wafer 20 is ground and finished to desired thickness by use of a grinding stone 26 or the like. As a result, the semiconductor wafer 20 is discretely divided to form semiconductor chips 12, 12, Next, as shown in FIGS. 104A, 104B, the discretely divided semiconductor chips 12, 12, . . . are placed on a stage 31 and a dicing tape 28 is affixed to the backside by use of a roller 29 and the wafer is mounted on a wafer ring 30.

Then, as shown in FIGS. 105A, 105B, the surface protection tape 23 is separated.

Next, as shown in FIGS. 106A, 106B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be brought into direct contact with the backside of the chip 12 and are further pushed upwardly to separate the chip 12 from the dicing tape 28. At this time, as shown in FIG. 18, the pickup needles 33 are brought into contact with the thick portions of the chip 12 and pushed upward to separate the chip from the dicing tape 28. The thus separated chip is fed while the chip surface is attracted by a collet 34.

Next, the chips 12 thus fed by the collet 34 are stacked and mounted on the circuit board 11 having external connection electrodes 14-1, 14-2, . . . and stacked in a multi-layered form by electrically connecting semiconductor elements formed on the main surface of each semiconductor chip to printed wirings of the circuit board 11 by wire bonding each time the semiconductor chip is mounted.

In FIGS. 107A, 107B, a case wherein the first-stage chip 12-1 has uniform and small thickness is taken as an example and a wire bonded state is shown. Next, a bonding agent (insulating member) 37 formed of resin or the like is coated on the chip 12-1, the semiconductor chip 12-2 formed in the step described above is stacked and mounted on the chip 12-1 with the bonding agent 37 disposed therebetween and then a wire bonding process is performed to electrically connect the bonding pads of the chip 12-2 to printed wirings formed on the surface of the circuit board 11. When the chip 12-2 is stacked and mounted on the chip 12-1, the overhung portions are arranged to correspond in position to the ball bonding portions of the semiconductor chip arranged in the lower stage. At this time, spaces which accommodate the ball bonding portions are formed between the overhung portions and the main surface of the chip 12-1, the bonding agent 37 flows into each space and the wire bonding portions of the chip 12-1 and bonding wires are embedded in the bonding agent 37.

After this, the process of stacking a plurality of semiconductor chips and the wire bonding process are repeatedly performed according to the package structure.

Then, the stacked semiconductor chips and wire bonding portions are covered with sealing resin (mold resin) (or molded).

[A Modification 9 of the Manufacturing Process in the First Embodiment]

FIGS. 108A, 108B to FIGS. 116A, 116B are shown to explain another manufacturing process (modification 9) of the above stack MCP, FIGS. 108A to 116A are perspective views and FIGS. 108B to 116B are cross sectional views of FIGS. 108A to 116A.

The manufacturing process of the modification 9 is basically the same as that of the modification 4 shown in FIGS. 68A, 68B to FIGS. 76A, 76B, but is different in that the wire bonding portions and bonding wires are directly sealed by use of an insulating member such as a bonding agent. The manufacturing method is adequate to form the structure shown in FIG. 39.

In FIGS. 108A, 108B to FIGS. 116A, 116B, the same structures and the same steps as those in FIGS. 68A, 68B to FIGS. 76A, 76B are denoted by the same reference symbols and the detail explanation thereof is omitted.

That is, as shown in FIGS. 116A, 116B, a bonding agent (insulating member 37) formed of resin or the like is coated on the wire bonding portions of the chip 12-1 and the chip 12-2 is stacked and mounted on the chip 12-2 with the DAF 27 disposed therebetween so that the overhung portions will correspond in position to the ball bonding portions of the semiconductor chip 12-1 arranged in the lower stage. At this time, spaces which accommodate the ball bonding portions are formed between the overhung portions and the main surface of the chip 12-1 arranged in the lower stage. The bonding agents 37 flow into the spaces so that the bonding wires and the wire bonding portions of the chip 12-1 may be embedded in the bonding agents. After this, the wire bonding process is performed to electrically connect the bonding pads of the chip 12-2 to the printed wirings formed on the surface of the circuit board 11.

[A Modification 10 of the Manufacturing Process in the First Embodiment]

In the manufacturing process of the modification 8, the voids can be prevented from being formed between the chips in the die bonding step shown in FIGS. 107A, 107B by forming air vent grooves in the backside of the chip after the backside grinding step of FIGS. 103A, 103B. Thus, a short circuit and leak between the chips can be prevented.

Further, since the adhesive area between the chip and the dicing tape 27 is made smaller and the adhesive strength becomes weaker if the air vent grooves are formed in the backside of the chip, occurrence of cracks of the chip in the pickup step shown in FIGS. 106A, 106B can be reduced.

[A Modification 11 of the Manufacturing Process in the First Embodiment]

In the manufacturing process in the first embodiment and the modifications 1 to 10, the blade system is used when the first and second grooves are formed, but a laser system (grooves and improvement of the interior quality), a cutter, etching (such as RIE) process or wire scribing process can be used and a combination of a plurality of methods can be used.

[A Modification 12 of the Manufacturing Process in the First Embodiment]

As the DAF in the manufacturing process of the first embodiment and the modifications 1 to 7, 9 and 10, polyimide-series or epoxy-series resin can be used. Further, a material of a component which is not etched can be used.

[A Modification 13 of the Manufacturing Process in the First Embodiment]

An example in which the DAF is cut apart by use of the blade system is shown, but the DAF can be cut apart by use of a laser system (grooves and improvement of the interior quality), a cutter, etching process or wire scribing process, for example.

[A Modification 14 of the Manufacturing Process in the First Embodiment]

An example in which the pin system is performed in the pickup step is explained, but various methods such as a pinless system, ultrasonic system and tapeless system can be applied.

[A Modification 15 of the Manufacturing Process in the First Embodiment]

The wire bonding system can be applied to either the positive bonding (including the reverse bonding like positive bonding) or the reverse bonding.

[A Modification 16 of the Manufacturing Process in the First Embodiment]

The sealing step into the package 10 is not limited to the mold (resin sealing) system, but can be applied to a film sealing system or a potting system of sealing by dropping liquid resin.

Next, various manufacturing methods of fixing and sealing the bonding portions and bonding wires with the insulating members 37 are explained with reference to FIGS. 117A, 117B to FIGS. 121A, 121B.

[A Step Example 1 of Fixing and Sealing Ball Bonding Portions by Use of an Insulating Member]

FIGS. 117A, 117B show a step example of fixing and sealing the bonding portions shown in FIGS. 107A, 107B and FIGS. 116A, 116B by use of the insulating member 37. The step shown in FIGS. 117A, 117B shows a state obtained after the first-stage chip 12-1 is placed on the circuit board 11, wire-bonded and mounted thereon. The insulating member 37 such as a insulating bonding agent or sealing agent is supplied from a dispenser nozzle 36 onto the ball bonding portions of the chip 12-1. The bonding pads of the chip 12-2 are electrically connected to printed wirings formed on the surface of the circuit board 11 by wire bonding after the semiconductor chip 12-2 formed in the step as described above was stacked and mounted on the chip 12-1. When the chip 12-2 is stacked and mounted on the chip 12-1, the overhung portions are arranged to correspond in position to the ball bonding portions of the chip 12-1 arranged in the lower stage. A space formed between the main surface of the chip 12-1 arranged in the lower stage and the overhung portion of the chip 12-2 mounted thereon is filled with the insulating member 37.

[A Step Example 2 of Fixing and Sealing Ball Bonding Portions by Use of an Insulating Member]

In the step example 1, the insulating member is formed in a region in which the bonding wires and the bonding portions formed on the two opposite sides of the chip 12-1 are formed, but as shown in FIGS. 118A, 118B, an insulating member 37 can be coated on a region along the four sides of the chip 12-1.

[A Step Example 3 of Fixing and Sealing Ball Bonding Portions by Use of Insulating Members]

As shown in FIGS. 119A, 119B, insulating members 37 such as resin can be dropped from a dispenser nozzle 36 onto the chip 12-1. In this case, the ball bonding portions and bonding wires are embedded in the resin pushed out from under the chip 12-2 into the peripheral portion when the chip 12-2 is mounted on the chip 12-1.

[A Step Example 4 of Fixing and Sealing Ball Bonding Portions by Use of an Insulating Member]

As shown in FIGS. 120A, 120B, an insulating member 37 such as resin can be emitted from a dispenser nozzle 36 onto the chip 12-1 and is coated to cover the surface thereof. Also, in this case, the ball bonding portions and bonding wires are embedded in the resin pushed out from under the chip 12-2 into the peripheral portion when the chip 12-2 is mounted on the chip 12-1.

[A Step Example 5 of Fixing and Sealing Ball Bonding Portions by Use of an Insulating Member]

An insulating member 37 such as resin can be coated on the overhung portions of the chip 12-2 as shown in FIG. 121A and the ball bonding portions and bonding wires can be embedded in the insulating member when the chip 12-2 is mounted on the chip 12-1.

Figure 122:
FIG. 122 is a photomicrograph obtained when a plurality of semiconductor chips having overhung portions formed therein are stacked, the spaces are filled with insulating members and resin is used as the insulating member.
Figure 123:
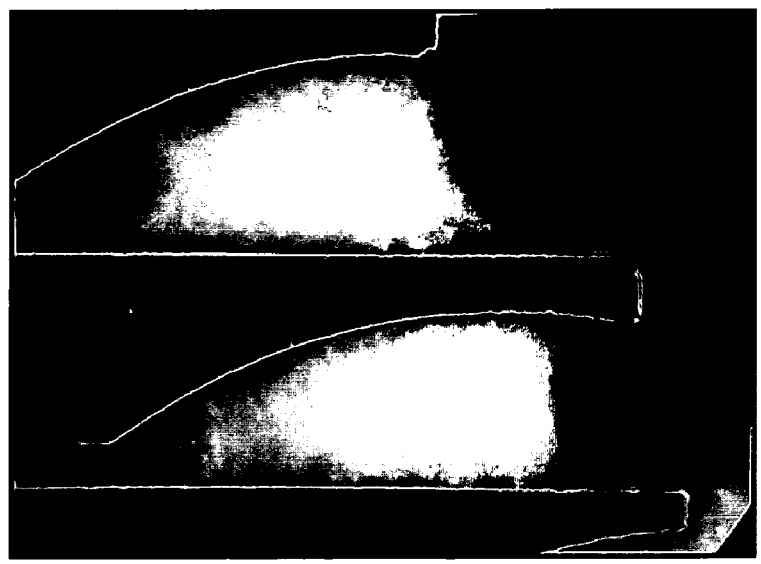
FIG. 123 is a photomicrograph obtained when a plurality of semiconductor chips having overhung portions formed therein are stacked, the spaces are filled with insulating members and insulating paste is used as the insulating member.

FIGS. 122 and 123 are photomicrographs obtained when semiconductor chips having overhung portions formed therein are stacked and spaces are filled with insulating members. FIG. 122 shows a case wherein resin is used as the insulating member and FIG. 123 shows a case wherein insulating paste is used as the insulating member.

[A Step Example 6 of Fixing and Sealing Ball Bonding Portions by Use of Insulating Members]

In the step examples 1 to 5, the one-point nozzle system is explained, but a multi-point nozzle system or a system of scanning by use of a one-point nozzle system (a single stroke of the nozzle) can be used. Further, the chip can be dipped into a tray in which resin is contained and the resin can be adhered to the backside of the chip. In addition, a transfer system can be used and various combinations of the transfer systems of transfer to the central portion of the main surface of the lower-stage chip, transfer onto the ball bonding portions and transfer to the chip central portion and onto the ball bonding portions can be used.

[A Step Example 7 of Fixing and Sealing Ball Bonding Portions by Use of Insulating Members]

As the insulating member, various insulating type members such as a DAF material (die attach film), insulating paste, under-fill material, liquid resin, potting resin and B-stage resin (epoxy resin) can be used.

Therefore, according to the first embodiment and the modifications thereof, a semiconductor device can be provided in which the package can be made thin without causing defective portions due to cracks in the semiconductor chip and occurrence of leak or contact between the bonding wires of the semiconductor chip and the backside of the upper-stage chip.

Further, since the spacer and the DAF used to adhere the spacer to the chip become unnecessary, a manufacturing method of the semiconductor device in which the manufacturing cost is lowered and the productivity is enhanced can be attained.

Second Embodiment

Figure 124:
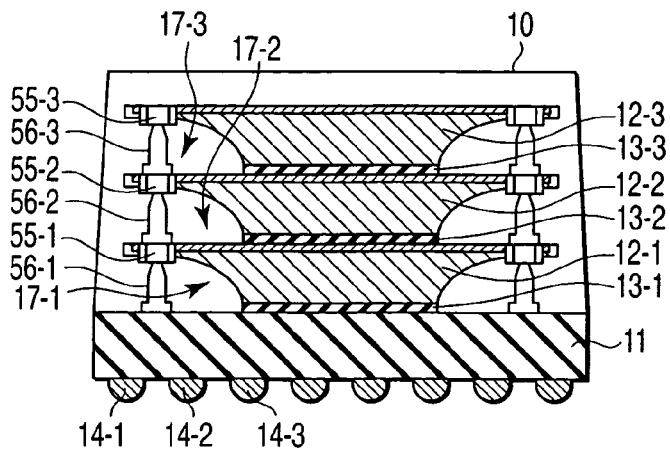
FIG. 124 is a cross sectional view showing an example of a COC package type semiconductor device having three semiconductor chips with the same size stacked, for illustrating a semiconductor device according to a second embodiment of this invention.

FIG. 124 is a cross sectional view of a semiconductor device according to a second embodiment of this invention. In this case, a COC package type semiconductor device having three semiconductor chips with the same size stacked is taken as an example. Three semiconductor chips 12-1, 12-2, 12-3 with the same size are stacked and mounted on a circuit board 11 with DAFs (die attach films) 13-1, 13-2, 13-3 disposed therebetween, respectively. For example, the circuit board 11 has a multi-layered wiring structure. Electrode pads on which stud bumps 56-1 are formed are provided on the chip mounting surface of the circuit board 11 and external connection electrodes 14-1, 14-2, 14-3, . . . such as solder balls and pins are arranged in an array form on the backside of the chip to form a so-called ball grid array or pin grid array.

Through electrodes 55-1, 55-2, 55-3 formed of copper (Cu), gold (Au), tungsten (W) or polysilicon are provided along the two (or four) opposite sides of the respective semiconductor chips 12-1, 12-2, 12-3. The through electrodes 55-1, 55-2, 55-3 and the electrode pads formed on the chip mounting surface of the circuit board 11 are respectively connected together via Au stud bumps 56-1, 56-2, 56-3.

The through electrodes 55-1, 55-2, 55-3 are formed in through holes which are respectively formed to penetrate through the semiconductor chips 12-1, 12-2, 12-3 while insulating films each formed of a silicon oxide film or organic material of polyimide, for example, are disposed therebetween. The through electrodes are electrically connected to semiconductor elements formed on the main surface of the respective semiconductor chips 12-1, 12-2, 12-3.

The electrode pads formed on the chip mounting surface of the circuit board 11 are connected to the external connection electrodes 14-1, 14-2, 14-3, . . . via the multi-layered wiring structure formed in the circuit board 11. Thus, the semiconductor chips 12-1, 12-2, 12-3 are electrically connected to the external connection electrodes 14-1, 14-2, 14-3, . . . .

The semiconductor chip 12-1 is formed to have overhung portions 17-1 on two (or four) opposite sides corresponding in position to the electrode pads formed on the chip mounting surface of the circuit board 11. The semiconductor chips 12-2, 12-3 are formed to have overhung portions 17-2, 17-3 on two (or four) opposite sides corresponding in position to the through electrodes of the lower-stage chips 12-1, 12-2 of the backsides thereof, respectively. The overhung portions 17-1, 17-2, 17-3 form spaces (accommodating portions) to accommodate the stud bumps 56-1 to 56-3 between the respective overhung portions and the chip mounting surface of the circuit board 11 and the main surfaces of the semiconductor chips 12-1, 12-2 arranged in the lower stages, respectively.

The semiconductor chips 12-1, 12-2, 12-3, stud bumps 56-1, 56-2, 56-3 and the chip mounting surface of the circuit board 11 are sealed into a package 10 formed of resin or the like.

Figure 125:
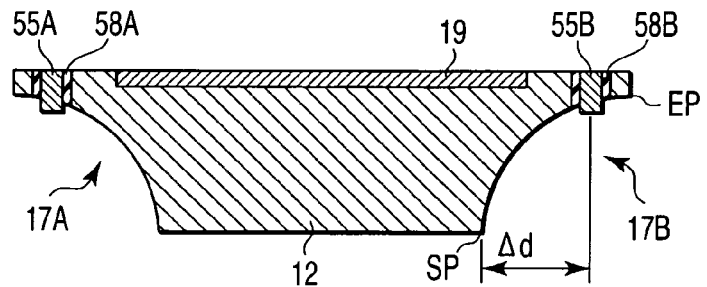
FIG. 125 is a view schematically showing a cross section of the semiconductor chip shown in FIG. 124.
Figure 126:
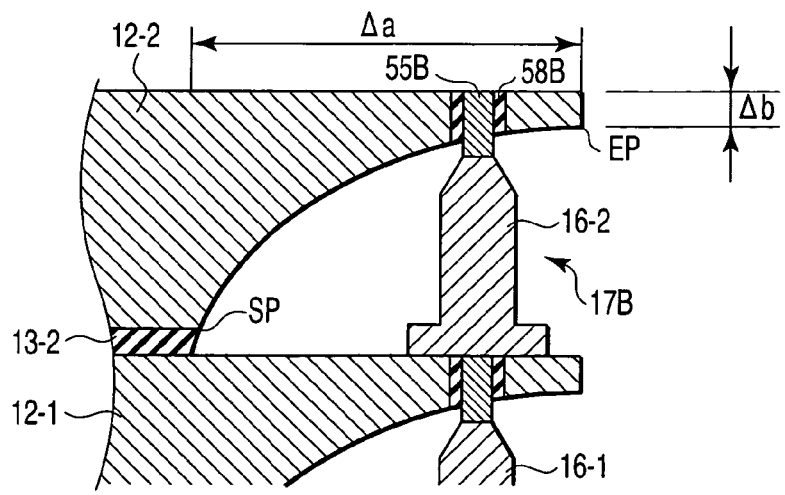
FIG. 126 is an enlarged cross sectional view showing a portion near through electrodes and stud bump portions of the first-stage and second-stage semiconductor chips shown in FIG. 124.

FIG. 125 schematically shows a cross section of the semiconductor chip 12 (12-1 to 12-3). FIG. 126 is an enlarged cross sectional view showing a portion near the stud bumps and through electrodes of the first-stage and second-stage semiconductor chips 12-1, 12-2 (or the second-stage and third-stage semiconductor chips 12-2, 12-3) shown in FIG. 124.

As shown in FIG. 125, a semiconductor element 19 is formed on the main surface of the semiconductor chip 12 and through electrodes 55A, 55B are arranged along the two (or four) opposite sides of the chip 12. The through electrodes 55A, 55B are respectively formed in the through holes formed through the semiconductor chip 12 with insulating layers 58A, 58B disposed therebetween and electrically connected to the semiconductor element 19 formed on the main surface of the semiconductor chip 12.

Overhung portions 17A, 17B are formed on the two (or four) opposite sides of the backside of the semiconductor chip 12 corresponding in position to the through electrodes 55A, 55B. The overhung portions 17A, 17B are so formed that the chip thicknesses thereof are gradually increased in a direction from the outer peripheral portion toward the inner portion.

More specifically, the overhung portion has a curved surface portion which has a start point SP in a position at a distance $\Delta d$ (=0.05 mm to 1.3 mm) from the center of the through electrode 55B, becomes thinner toward the outer periphery and has an end point EP reaching the side wall of the chip 12. In this example, the curved surfaces of the overhung portions 17A, 17B each have the radius of curvature of 0.05 mm to 2.5 mm. The degree of roughness of the curved surface of the overhung portions 17A, 17B is preferably set to #2000 or less in order to prevent concentration of the stress caused when stud bumps 56-1, 56-2, 56-3 are formed and the concentration of the stress can be effectively suppressed if the surface is mirror-finished.

As shown in FIG. 126, an accommodating portion to accommodate the stud bump 56-2 is formed between the overhung portion 17B and the main surface of the lower-stage chip 12-1. It is necessary to set the thickness $\Delta b$ of the side wall of the chip 12-2 to approximately 10 to 50 μm and set the thickness of the overhung portion of the chip 12-2 to approximately 70 μm in the case of normal stud bumps or ball bumps although they are different depending on the shape and size of the connection electrodes. Further, it is preferable that the distance La from the outer periphery of the chip (end point EP) to the start point SP do not exceed 5 mm and it is preferable to set the distance in a range of 200 μm to 1.3 mm.

Next, the manufacturing method of the COC package type semiconductor device shown in FIG. 124 is explained in detail with reference to FIGS. 127A, 127B to FIGS. 134A, 134B. FIGS. 127A to 134A are perspective views and FIGS. 127B to 134B are cross sectional views of FIGS. 127A to 134A.

First, semiconductor elements are formed on the main surface of the semiconductor wafer and through electrodes electrically connected to the semiconductor elements are formed by a known manufacturing process. The through electrodes may be formed through the semiconductor wafer, but if they are formed to shallow depth so as to be exposed in the later backside grinding step, the formation step thereof can be made easy and the manufacturing cost can be lowered.

Then, as shown in FIGS. 127A, 127B, first grooves 22-1, 22-2, 22-3, . . . are formed along dicing lines or chip dividing lines in the main surface of the semiconductor wafer 20 by use of a diamond blade 21 or the like (half-cut dicing).

Next, as shown in FIGS. 128A, 128B, a BSG tape (surface protection tape) 23 is affixed to the main surface (the element formation surface) of the semiconductor wafer 20 and the backside portion thereof is ground and finished to desired thickness by a grinding stone 26 or the like. As a result, the semiconductor wafer 20 is discretely divided so as to form semiconductor chips 12, 12, . . . . The ground surface is etched as required after the backside grinding step.

Figures 135A, 135B:
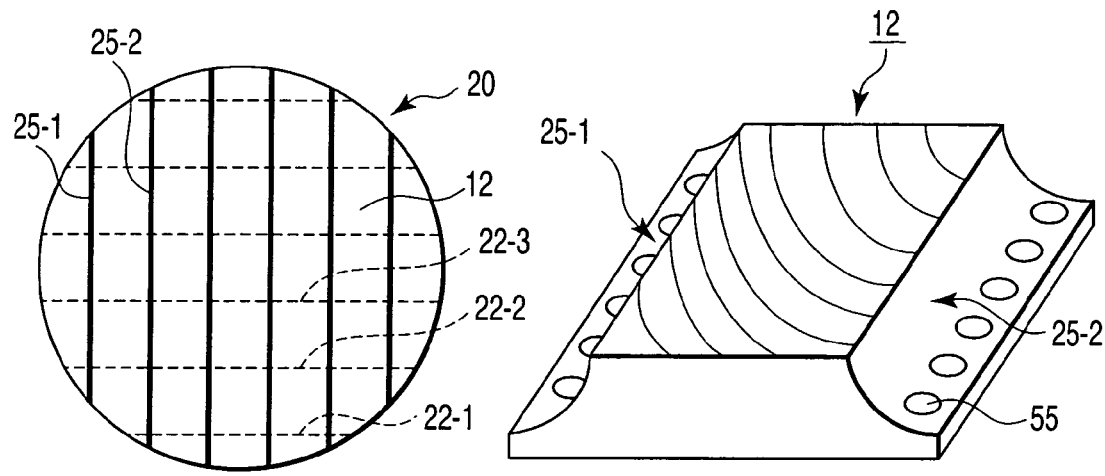
FIG. 135A is a plan view of a semiconductor wafer, for illustrating the forming position of second grooves.
FIG. 135B is a perspective view of a semiconductor chip, for illustrating the forming position of the second grooves.

Next, as shown in FIGS. 129A, 129B, second grooves 25-1, 25-2, . . . used to form the overhung portions are formed along the dicing lines or chip dividing lines on the backside of the semiconductor wafer 20 by use of a diamond blade 24. The second grooves 25-1, 25-2, . . . are formed in positions corresponding to the two opposite sides of the semiconductor chip 12 as shown in FIGS. 135A, 135B or formed in positions corresponding to the four opposite sides of the semiconductor chip 12 as shown in FIGS. 144A, 144B. In FIGS. 129A, 129B, a case wherein they are formed on the four sides is shown as an example. The second grooves 25-1, 25-2, . . . are formed to have opening portions which are wider than regions between the through electrodes 55 of adjacent semiconductor chips 12 on the backside thereof corresponding in position to the through electrodes between the adjacent semiconductor chips 12.

Figure 136:
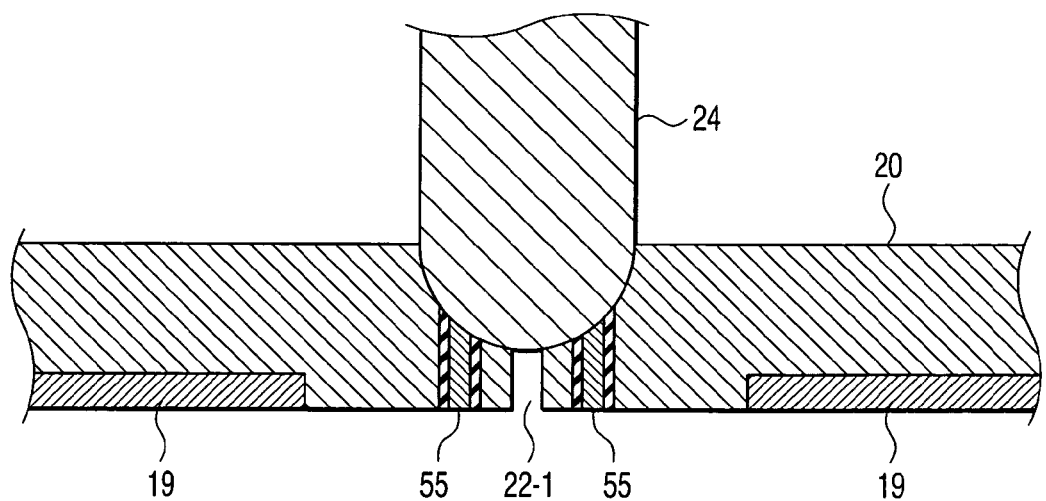
FIG. 136 is an enlarged cross sectional view of a groove forming region, for illustrating a second groove forming step.

At the time of formation of the second grooves 25-1, 25-2, . . . , for example, as shown in FIG. 136, a blade having a tip portion whose cross section is a curved surface is used. As shown in FIG. 14, if the tip portion is formed in a semicircular form with the radius R (R=ZZ/2), an overhung portion with the width ZZ and the curvature of the radius R can be formed.

Next, as shown in FIGS. 130A, 130B, the backside of the semiconductor wafer 20 (discretely divided semiconductor chips 12, 12, . . . ) is subjected to the plasma etching, wet etching or CMP process so as to protrude the through electrodes 55 from the backside. In FIGS. 130A, 130B, the working process by a CMP polishing device 38 is shown as a representative.

After this, as shown in FIGS. 131A, 131B, the semiconductor wafer 20 is placed on a stage 31, a DAF (or a bonding agent) 27 and dicing tape 28 are affixed to the backside by use of a roller 29 and thus the wafer is mounted on a wafer ring 30. In this case, the DAF 27 and dicing tape 28 are affixed in an integral form, but there occurs no problem even if discretely divided DAFs and dicing tapes are affixed.

Then, as shown in FIGS. 132A, 132B, the surface protection tape 23 is separated.

Next, as shown in FIGS. 133A, 133B, a diamond blade 32 with the width smaller than a gap between the discretely divided semiconductor chips 12 is used to perform a dicing process again to cut apart the DAF 27.

After this, as shown in FIGS. 134A, 134B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be brought into direct contact with the backside of the chip 12 and are further pushed upwardly to separate the chip 12 from the dicing tape 28. At this time, the pickup needles 33 are brought into contact with the thick portions of the chip 12 and pushed upward to separate the chip from the dicing tape 28. The DAF 27 is adhered to the backside of the thus separated chip and the chip is fed while the chip surface is attracted by a tool called a collet 34.

Next, the chips 12 thus fed by the collet 34 are pressed against (thermocompression bonded by heating as required) and mounted on the circuit board 11 having external connection electrodes 14-1, 14-2, . . . by die bonding with stud bumps disposed therebetween. When the chip is mounted, the chip is stacked while the overhung portions thereof are set to correspond in position to the stud bumps formed on the circuit board 11 or the stud bumps formed on the through electrodes of the semiconductor chip arranged in the lower stage. Thus, accommodating portions which accommodate the through electrodes are formed between the overhung portions and the chip mounting surface of the circuit board 11 or the main surface of the chip arranged in the lower stage. When the chip is die-bonded, the connection between the stud bump and the through electrode can be made more effective and stronger by application of ultrasonic waves.

Then, the stacked semiconductor chips, stud bumps and the chip mounting surface of the circuit board 11 are covered with resin mold or the like to form a package 10.

With the above structure, the chips can be stacked with the stud bumps 56-1, 56-2, 56-3 accommodated in the overhung portions 17-1, 17-2, 17-3, and therefore, the thickness of the structure can be reduced by the thickness of the connection electrodes and the package can be made thin.

Further, with the above manufacturing method, since the semiconductor wafer is subjected to the half-cut dicing process while the semiconductor wafer is thick and then it is divided by grinding and etching, occurrence of chippings on the backside of the chip can be suppressed.

Since the central portion of the semiconductor chip is thick and the peripheral portion thereof is thin, the warp can be made small in comparison with a case wherein the whole portion is made thin and it becomes easy to deal with the semiconductor chip. Thus, occurrence of a recognition error at the time of position detection performed by using an optical system such as a TV camera when the chip is mounted can be reduced.

Occurrence of chip cracks can be reduced by applying pressure to the thick portion of the chip by use of pickup needles when each semiconductor chip is picked up from the dicing tape after the semiconductor wafer is discretely divided. Further, the deflection (bending) of the semiconductor chip when it is attracted by the collet is reduced and occurrence of voids in the adhering and pressure-bonding process for die bonding can be suppressed.

Since the chip can be suppressed from being bent at the die-bonding time, the bonding characteristic can be enhanced and occurrence of chip cracks can be suppressed. According to the simulation by the inventor of this application, it is confirmed that the degree of element bending can be improved by approximately 4% to 55% in comparison with the conventional case in the above condition.

Thus, since faults due to occurrence of chippings and cracks of the semiconductor wafer and due to occurrence of the warp and bending of the semiconductor chip can be reduced, the manufacturing cost can be lowered and the productivity can be enhanced.

This invention is not limited to the second embodiment and can be variously modified. Next, various modifications are explained.

[Modifications 1, 2 of the Overhung Shape of the Semiconductor Chip in the Second Embodiment and the Manufacturing Method thereof]

FIGS. 137A, 137B and FIGS. 38A, 138B show other examples of the overhung shape of the semiconductor chip 12. The semiconductor chip 12 shown in FIGS. 137A, 137B has a curved surface in a region extending from a start point SP to a portion under the through electrode 55A, 55B and a plane in a region extending from the portion under the through electrode 55A, 55B to the chip end portion (terminal end EP). The radius of curvature of the above curved surface is 0.01 mm to 2.5 mm and the distance Δe of the plane is 80 µm. That is, the semiconductor chip 12 has the overhung portions 17A, 17B which are each formed of a combination of the curved surface and one plane.

In the semiconductor chip 12 shown in FIGS. 138A, 138B, regions extending from the start points SP are vertical planes with respect to the main surface of the chip 12, regions ranging from the intermediate portions of the vertical planes to portions under the connection electrodes 55A, 55B are curved surfaces and regions ranging from the portions under the connection electrodes 55A, 55B to the chip end portions (terminal ends EP) are planes. The radius of curvature of the above curved surface is 0.01 mm to 2.5 mm and the distance Δe of the vertical plane and horizontal plane is 80 µm. That is, the semiconductor chip 12 has the overhung portions 17A, 17B which are each formed of a combination of the curved surface and two planes.

A blade 24 having a cross sectional shape as shown in FIG. 23 is used in order to form the overhung portions 17A, 17B shown in FIGS. 137A, 137B and FIGS. 138A, 138B. That is, if a portion with the radius R of curvature of the blade 24 having the front end corner portions with the radius of curvature R is used to form the grooves 25, the overhung portions 17A, 17B as shown in FIGS. 17A, 17B can be formed. If the grooves 25 are formed by use of a portion deeper than the portion with the radius R of curvature of the blade 24, the overhung portions 17A, 17B as shown in FIGS. 138A, 138B can be formed.

As shown in FIG. 139, the overhung portions 17A, 17B with the same shape can be formed by forming a plurality of grooves 25 by use of the blade 24 in which the cross section of the front end portion is the curved surface as shown in FIG. 136 while shifting the position of the blade as indicated by an arrow.

[A Modification 3 of the Overhung Shape of the Semiconductor Chip in the Second Embodiment and the manufacturing method thereof]

In the second embodiment and the modifications 1, 2, a case wherein the curved surface which forms the overhung shape of the semiconductor chip or a portion thereof is a convex surface having the constant radius of curvature is explained, but the radius of curvature is not necessarily set constant.

For example, the cross section of the overhung shape may be a convex surface of a shape corresponding to a parabola.

[Modifications 4, 5 of the Overhung Shape of the Semiconductor Chip in the Second Embodiment and the Manufacturing Method thereof]

FIGS. 140A, 140B and FIGS. 141A, 141B show still other examples of the structure of the overhung shape of the semiconductor chip 12. In the semiconductor chip 12 shown in FIGS. 140A, 140B, regions extending from the start points SP are vertical planes with respect to the main surface of the chip 12, regions extending from the intermediate portions of the vertical planes to portions under the connection electrodes 55A, 55B are planes having large inclination angles and regions extending from the portions under the connection electrodes 55A, 55B to the chip end portions (terminal ends EP) are planes parallel to the main surface of the circuit board. The distance $\Delta e1$ of the plane is 40 µm, the distance $\Delta e2$ of the plane is 60 µm and the distance $\Delta e3$ of the plane is 100 µm. The planes contact with one another with angles $\Delta f1$, $\Delta f2$ between 90 degrees and 180 degrees. That is, the overhung portions 17A, 17B of the semiconductor chip 12 are each formed of a combination of three planes having different inclination angles (combined planes).

Figures 141A, 141B:
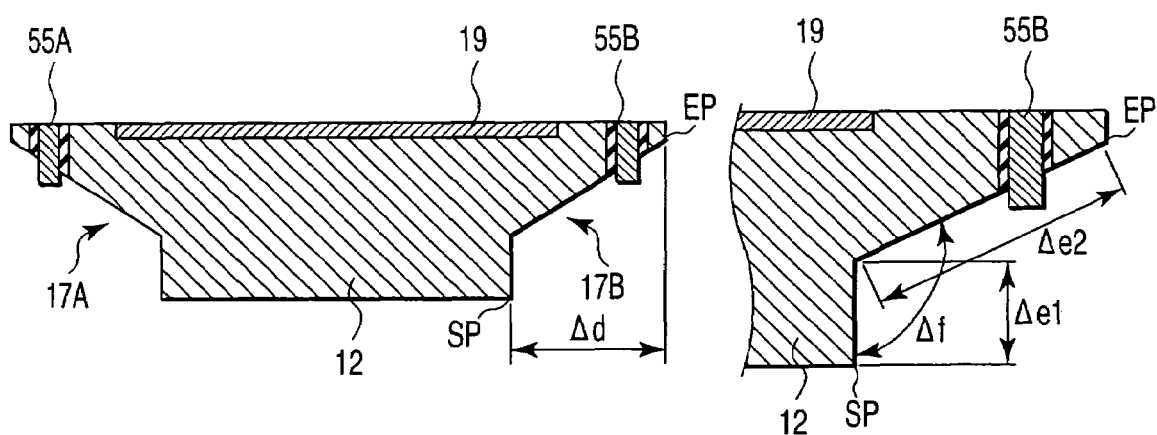
FIG. 141A is a cross sectional view of a semiconductor chip, for illustrating still another example of the overhung shape of the semiconductor chip.
FIG. 141B is an enlarged cross sectional view of an overhung portion, for illustrating still another example of the overhung shape of the semiconductor chip.

In the semiconductor chip 12 shown in FIGS. 141A, 141B, regions extending from the start points SP are vertical planes with respect to the main surface of the chip 12 and regions extending from the intermediate portions of the vertical planes to the chip side walls (terminal ends EP) are planes having constant inclination angles. The distance $\Delta e1$ of the plane is 40 µm and the distance $\Delta e2$ of the plane is 330 µm. The planes are set in contact with each other with an angle $\Delta f$ between 90 degrees and 180 degrees. That is, the overhung portions 17A, 17B of the semiconductor chip 12 are each formed of a combination of two planes.

Of course, the region extending from the start point SP to the chip side wall (end point EP) may be formed of one plane which makes the thickness of the overhung portion smaller in a direction towards the outer periphery and has a constant inclination angle.

Figures 140A, 140B:
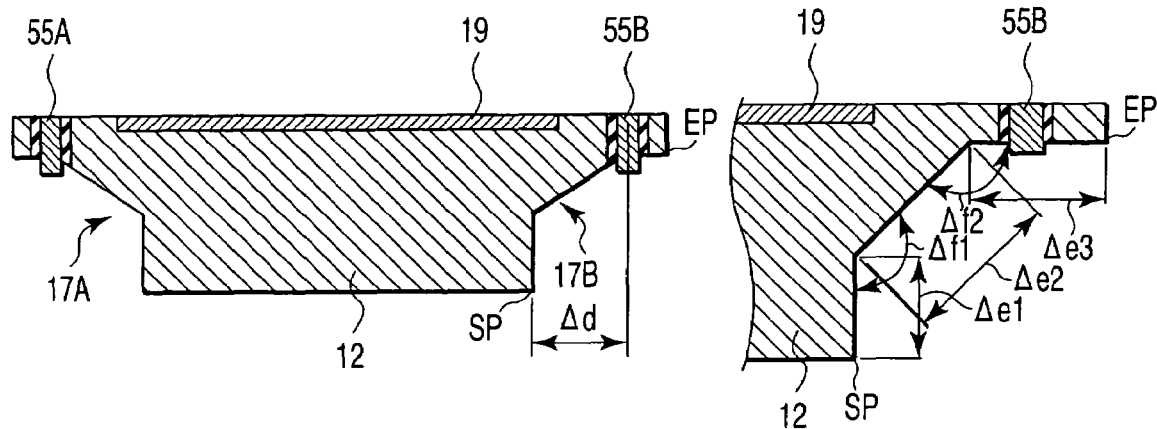
FIG. 140A is a cross sectional view of a semiconductor chip, for illustrating another example of the overhung shape of the semiconductor chip.
FIG. 140B is an enlarged cross sectional view of an overhung portion, for illustrating another example of the overhung shape of the semiconductor chip.

In order to form the overhung portions 17A, 17B shown in FIGS. 140A, 140B, the blade 24 of the cross section as shown in FIG. 31 can be used. As shown in the drawing, the front end corner portions have inclination angles corresponding to the angles $\Delta f1$, $\Delta f2$. If the grooves 25 are formed by use of the blade 24, the overhung portions 17A, 17B shown in FIGS. 140A, 140B can be formed.

Further, if the inclination angle of the blade 24 is set to an inclination angle corresponding to the angle Δf as shown by broken lines, the overhung portions 17A, 17B as shown in FIGS. 141A, 141B can be formed.

As shown in FIG. 32, if a blade having corner portions of planes with inclination angles and a tip portion of a curved surface is used, overhung portions having curved surfaces which extend from portions lying under the connection electrodes 55A, 55B to the end points EP can be formed.

[A Modification 1 of the Forming Position of Grooves Used to Form the Overhung Portions in the Second Embodiment]

As shown in FIGS. 135A, 135B, in the second embodiment, a case wherein the overhung portions are formed in one direction along the dicing lines or chip dividing lines of the semiconductor wafer (along the two opposite sides of the chip) and a case wherein the overhung portions are formed along the four sides of the chip as shown in FIGS. 144A, 144B are explained.

The forming positions of the overhung portions are not necessarily determined according to the arrangement of the through electrodes of the chip arranged in the lower stage. When the through electrodes of the chip arranged in the lower stage are formed on one side of the chip, the overhung portions can be formed along the two opposite sides as shown in FIGS. 135A, 135B. Further, when they are formed on one side, two sides or three sides of the chip, the overhung portions can be formed along all of the dicing lines or chip dividing lines of the semiconductor wafer (along the four opposite sides of the chip) as shown in FIGS. 144A, 144B.

[A Modification 2 of the Forming Position of Grooves Used to Form the Overhung Portions in the Second Embodiment]

The forming positions of the overhung portions are not necessarily limited to the two or four sides (of course, one side or three sides can be used) of the semiconductor chip. However, when the through electrodes 55 are linearly arranged in the central portion of the chip 12, the overhung portions can be linearly arranged along the two opposite sides and a central portion in parallel to the two sides (in this example, they are referred to as grooves 43-1, 43-2, . . . ) as shown in FIGS. 142A, 142B. Further, the grooves 43-1, 43-2, . . . can be linearly arranged along the four sides and central portion of the chip as shown in FIGS. 145A, 145B. In addition, the overhung portions can be arranged along the four sides of the chip and grooves 43-1, 43-2, . . . and 44-1, 44-2, . . . can be arranged in a cross-shaped form in the central portion as shown in FIGS. 146A, 146B or grooves 45 can be arranged in an array form in the four sides and central portion of the chip as shown in FIGS. 147A, 147B.

[A Modification 3 of the Formation Position of the Grooves Used to Form the Overhung Portions in the Second Embodiment]

The overhung portions can be formed by cutting away only portions corresponding to the stud bumps to form grooves 46 as shown in FIGS. 143A, 143B, and in this case, the same operation and effect as described above can be attained.

In FIGS. 143A, 143B, the grooves 46 are formed along the two opposite sides of the chip, but it is of course possible to form the grooves along the four sides of the chip.

Next, various modifications of the stacked structure of the semiconductor chip shown in FIG. 124 are explained with reference to FIGS. 148 to 172.

[A Modification of the Overhung Portions in the Second Embodiment]

Like the case of the first embodiment, the insulating layer 18 can be formed on the surface of each overhung portion. As the insulating layer 18, a silicon oxide film or an organic material such as polyimide can be used, for example. Further, the insulating layers can be formed not only on the surface of the overhung portion but also on the side walls of the groove 22 (the side walls of the chip 12).

[A Modification 1 of the Stacked Structure of the Semiconductor Chips in the Second Embodiment]

Figure 148:
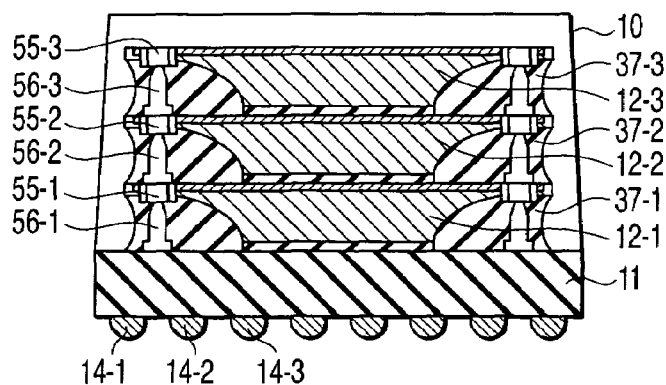
FIG. 148 is a cross sectional view showing a modification 1 of the stacked structure of semiconductor chips in a COC package type semiconductor device, for illustrating a semiconductor device according to another embodiment of this invention.

FIG. 148 shows another example of the stacked structure of the semiconductor chips in the COC package type semiconductor device. In this example, spaces (accommodating portions) formed between the chip mounting surface of the circuit board 11 and the overhung portions of the first-stage semiconductor chip 12-1 shown in FIG. 124, spaces (accommodating portions) formed between the main surface of the first-stage semiconductor chip 12-1 and the overhung portions of the second-stage semiconductor chip 12-2 and spaces (accommodating portions) formed between the main surface of the second-stage semiconductor chip 12-2 and the overhung portions of the third-stage semiconductor chip 12-3 are respectively filled with insulating members 37-1, 37-2 and 37-3. As the insulating members 37-1, 37-2, 37-3, polyimide-series or epoxy-series resin is used, for example.

Since the other basic structure is the same as that of FIG. 124, the same portions are denoted by the same reference symbols and the explanation thereof is omitted.

With the above structure, entrance of water into the connection electrodes can be effectively prevented by use of the insulating members 37-1, 37-2, 37-3 and the reliability can be enhanced. Further, since the bonding margin can be increased by embedding the overhung portions with the insulating members 37-1, 37-2, 37-3, the chip can be made thin.

[A Modification 2 of the Stacked Structure of the Semiconductor Chips in the Second Embodiment]

Figure 149:
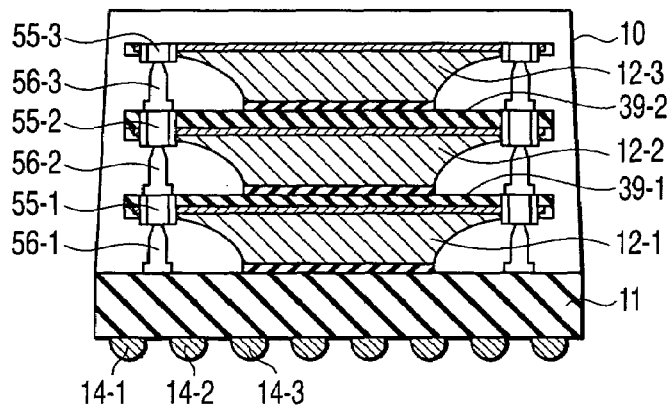
FIG. 149 is a cross sectional view showing a modification 2 of the stacked structure of semiconductor chips in a COC package type semiconductor device, for illustrating a semiconductor device according to another embodiment of this invention.

In an example shown in FIG. 149, spacers 39-1, 39-2 are respectively disposed between the main surface of the first-stage semiconductor chip 12-1 and the backside of the second-stage semiconductor chip 12-2 and between the main surface of the second-stage semiconductor chip 12-2 and the backside of the third-stage semiconductor chip 12-3. Wirings are made on the front and backsides of the spacers 39-1, 39-2 to electrically connect the lower-stage semiconductor chip with the upper-stage semiconductor chip.

A semiconductor chip having the front and backsides on which re-wirings are made by use of a circuit board or re-wiring process can be used instead of the spacers 39-1, 39-2 on which wirings are made.

The semiconductor chip on which the re-wirings are made is a semiconductor chip in which an insulating film is formed in portions other than the electrodes of the front and backsides, wiring layers are formed on the insulating film, then an insulating film is formed and electrodes are formed in positions corresponding to the upper-stage chip.

[A Modification 3 of the Stacked Structure of the Semiconductor Chips in the Second Embodiment]

Figure 150:
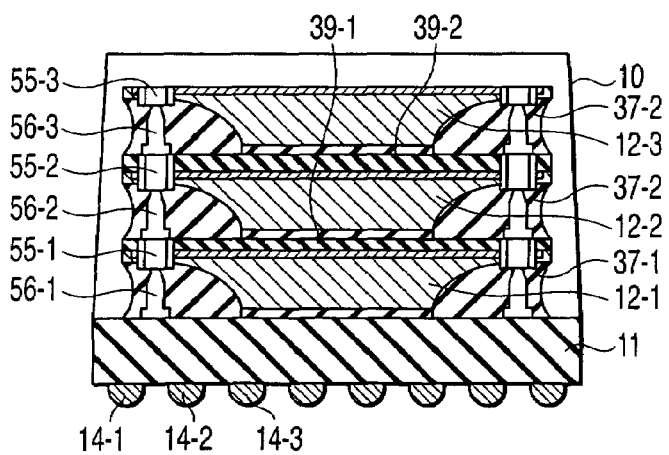
FIG. 150 is a cross sectional view showing a modification 3 of the stacked structure of semiconductor chips in a COC package type semiconductor device, for illustrating a semiconductor device according to another embodiment of this invention.

In an example shown in FIG. 150, insulating members 37-1, 37-2, 37-3 are respectively disposed between the circuit board 11 and the backside of the first-stage semiconductor chip 12-1, between the spacer 39-1 and the backside of the second-stage semiconductor chip 12-2 and between the spacer 39-2 and the backside of the third-stage semiconductor chip 12-3 without using DAFs in the structure shown in FIG. 149. Then, spaces formed between the chip mounting surface of the circuit board 11 and the overhung portions of the first-stage semiconductor chip 12-1, between the spacer 39-1 and the overhung portions of the second-stage semiconductor chip 12-2 and between the spacer 39-2 and the overhung portions of the third-stage semiconductor chip 12-3 are respectively filled with the insulating members 37-1, 37-2 and 37-3.

Of course, like the structure shown in FIG. 149, a semiconductor chip having the front and backsides on which re-wirings are made by use of a circuit board or re-wiring process can be used instead of the spacers 39-1, 39-2 on which wirings are made.

[A Modification 4 of the Stacked Structure of the Semiconductor Chips in the Second Embodiment]

Figure 151:
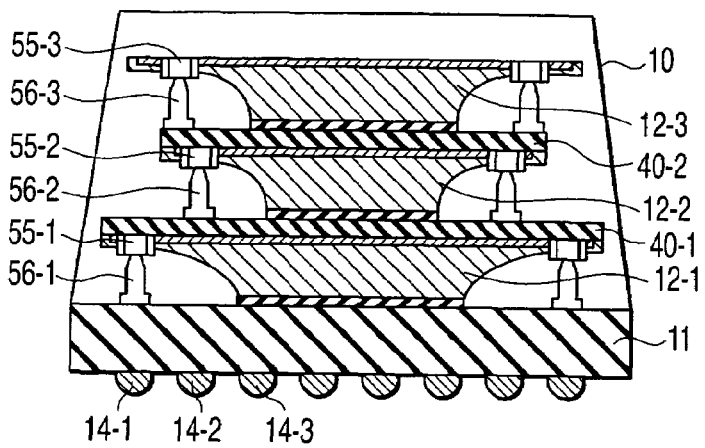
FIG. 151 is a cross sectional view showing a modification 4 of the stacked structure of semiconductor chips in a COC package type semiconductor device, for illustrating a semiconductor device according to another embodiment of this invention.

In the second embodiment and the modifications thereof, the chips of the same chip size are stacked, but in an example shown in FIG. 151, chips of different sizes are stacked. That is, circuit boards 40-1, 40-2 are respectively disposed between the main surface of the first-stage semiconductor chip 12-1 and the backside of the second-stage semiconductor chip 12-2 and between the main surface of the second-stage semiconductor chip 12-2 and the backside of the third-stage semiconductor chip 12-3. Further, stud bumps 56-2, 56-3 are formed on electrode pads formed on the circuit boards 40-1, 40-2. Connection of the through electrode 55-1 of the chip 12-1 with the stud bump 56-2 is made by use of a printed wiring formed on the circuit board 40-1, connection of the through electrode 55-2 of the chip 12-2 with the stud bump 56-3 is made by use of a printed wiring formed on the circuit board 40-2 and thus wirings are made by use of a re-wiring process.

With the above structure, not only the chips of the same size or the same products but also the chips of different sizes (the positions of the through electrodes are different) of different products can be stacked and mounted by disposing the circuit boards 40-1, 40-2 between the chips.

The same operation and effect can be attained by using a semiconductor chip having the front and backsides on which re-wirings are made by use of a re-wiring process or wired spacers instead of the circuit boards 40-1, 40-2.

Figure 152:
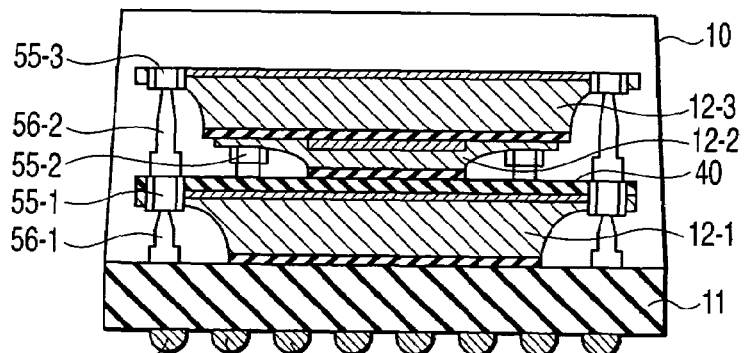
FIG. 152 is a cross sectional view showing a modification 5 of the stacked structure of semiconductor chips in a COC package type semiconductor device, for illustrating a semiconductor device according to another embodiment of this invention.

A Modification 5 of the Stacked Structure of the Semiconductor Chips in the Second Embodiment In the second embodiment and the modifications thereof, the through electrodes of the lower-stage chips and the through electrodes of the upper-stage chips are sequentially connected, but in an example shown in FIG. 152, the through electrodes 55-1 of the first-stage semiconductor chip 12-1 are connected to the through electrodes 55-3 of the third-stage semiconductor chip 12-3 via the stud bumps 56-2. Further, the through electrodes 55-2 of the second-stage semiconductor chip 12-2 are connected to the through electrodes 55-1 of the first-stage semiconductor chip 12-1 and the through electrodes 55-3 of the third-stage semiconductor chip 12-3 via printed wirings formed on the circuit board 40.

It is possible to use a semiconductor chip having the front and backsides on which re-wirings are made by use of a re-wiring process or wired spacers instead of the circuit boards 40.

Figure 153:
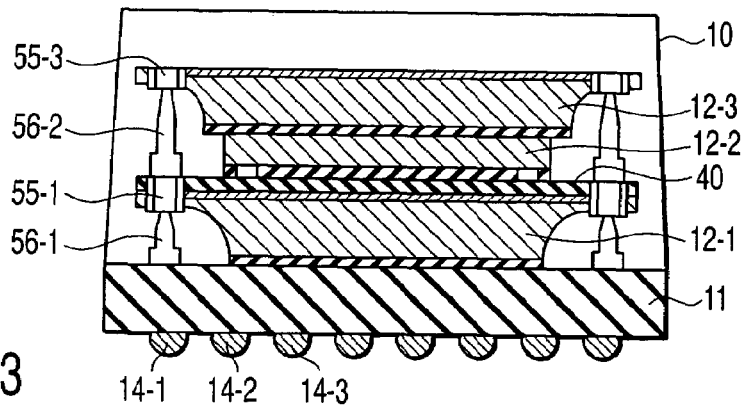
FIG. 153 is a cross sectional view showing a modification 6 of the stacked structure of semiconductor chips in a COC package type semiconductor device, for illustrating a semiconductor device according to another embodiment of this invention.

A Modification 6 of the Stacked Structure of the Semiconductor Chips in the Second Embodiment In an example shown in FIG. 153, the second-stage semiconductor chip 12-2 of FIG. 152 is mounted on the circuit board 40 by use of flip chip connection. The third-stage semiconductor chip 12-3 is mounted on the backside of the second-stage semiconductor chip 12-2.

In the modification 6, it is possible to use a semiconductor chip having the front and backsides on which re-wirings are made by use of a re-wiring process or wired spacers instead of the circuit board 40.

Figure 154:
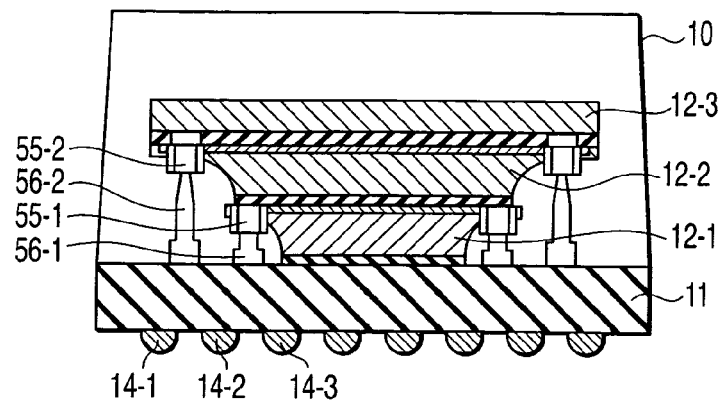
FIG. 154 is a cross sectional view showing a modification 7 of the stacked structure of semiconductor chips in a COC package type semiconductor device, for illustrating a semiconductor device according to another embodiment of this invention.

A Modification 7 of the Stacked Structure of the Semiconductor Chips in the Second Embodiment In an example shown in FIG. 154, the first-stage semiconductor chip 12-1 and the second-stage semiconductor chip 12-2 of larger size than the chip 12-1 are mounted on the circuit board 11 by use of stud bumps 56-1, 56-2 and electrode pads of the third-stage semiconductor chip 12-3 are mounted in positions corresponding to the through electrodes 55-2 of the second-stage semiconductor chip 12-2 by use of a flip chip or the like.

Figure 155:
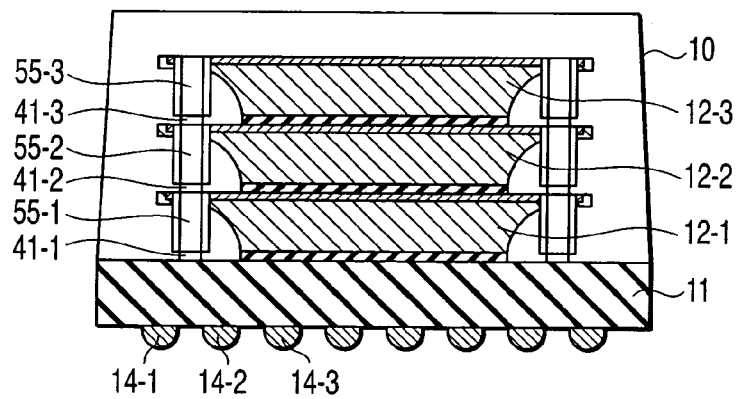
FIG. 155 is a cross sectional view showing a modification 8 of the stacked structure of semiconductor chips in a COC package type semiconductor device, for illustrating a semiconductor device according to another embodiment of this invention.

A Modification 8 of the Stacked Structure of the Semiconductor Chips in the Second Embodiment In the second embodiment and the modifications thereof, a case wherein the stud bumps are used is explained as an example, but in an example shown in FIG. 155, through electrodes 55-1, 55-2, 55-3 are formed to protrude from the chips 12-1, 12-2, 12-4 to large extents and portions between the through electrodes 55-1, 55-2 and 55-3 are connected together via plated bumps 41-1, 41-2, 41-3.

The other basic structures are the same as those shown in FIG. 124, and therefore, the same portions are denoted by the same reference symbols and the detail explanation thereof is omitted.

Figure 156:
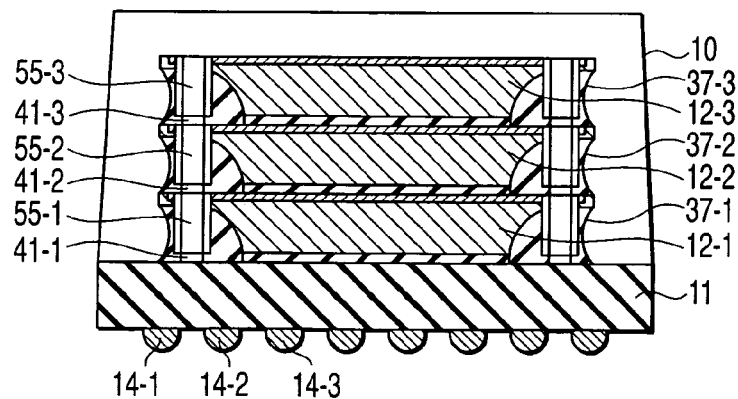
FIG. 156 is a cross sectional view showing a modification 9 of the stacked structure of semiconductor chips in a COC package type semiconductor device, for illustrating a semiconductor device according to another embodiment of this invention.

A Modification 9 of the Stacked Structure of the Semiconductor Chips in the Second Embodiment In an example shown in FIG. 156, insulating members 37-1, 37-2, 37-3 are respectively disposed between the chip mounting surface of the circuit board 11 and the backside of the first-stage semiconductor chip 12-1, between the main surface of the chip 12-1 and the backside of the second-stage semiconductor chip 12-2 and between the main surface of the chip 12-2 and the backside of the third-stage semiconductor chip 12-3 without using DAFs in the structure shown in FIG. 155. Further, spaces formed between the chip mounting surface of the circuit board 11 and the overhung portions of the first-stage semiconductor chip 12-1, between the main surface of the first-stage semiconductor chip 12-1 and the overhung portions of the second-stage semiconductor chip 12-2 and between the main surface of the second-stage semiconductor chip 12-2 and the overhung portions of the third-stage semiconductor chip 12-3 are respectively filled with the insulating members 37-1, 37-2, 37-3.

Figure 157:
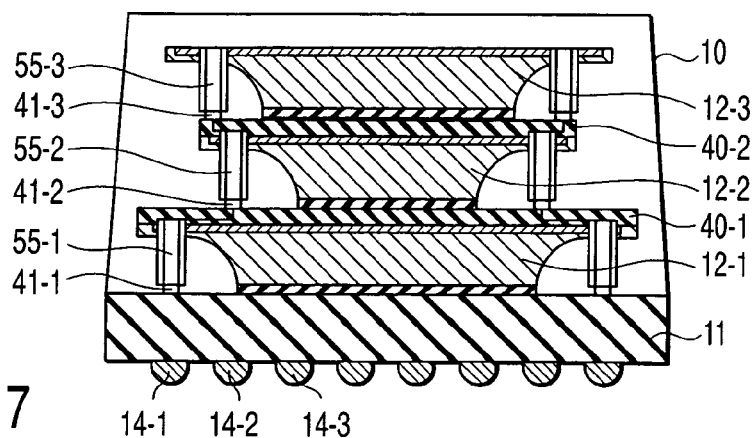
FIG. 157 is a cross sectional view showing a modification 10 of the stacked structure of semiconductor chips in a COC package type semiconductor device, for illustrating a semiconductor device according to another embodiment of this invention.

A Modification 10 of the Stacked Structure of the Semiconductor Chips in the Second Embodiment In an example shown in FIG. 157, chips with different sizes are stacked and circuit boards 40-1, 40-2 are respectively disposed between the main surface of the first-stage semiconductor chip 12-1 and the backside of the second-stage semiconductor chip 12-2 and between the main surface of the second-stage semiconductor chip 12-2 and the backside of the third-stage semiconductor chip 12-3. The through electrodes 55-1 of the chip 12-1 are connected to the through electrodes 55-2 of the chip 12-2 via printed wirings formed on the circuit board 40-1 and the through electrodes 55-2 of the chip 12-2 are connected to the through electrodes 55-3 of the chip 12-3 via printed wirings formed on the circuit board 40-2.

The same operation and effect can be attained by using a semiconductor chip having the front and backsides on which wirings are made by use of a re-wiring process or wired spacers instead of the circuit boards 40-1, 40-2.

Figure 158:
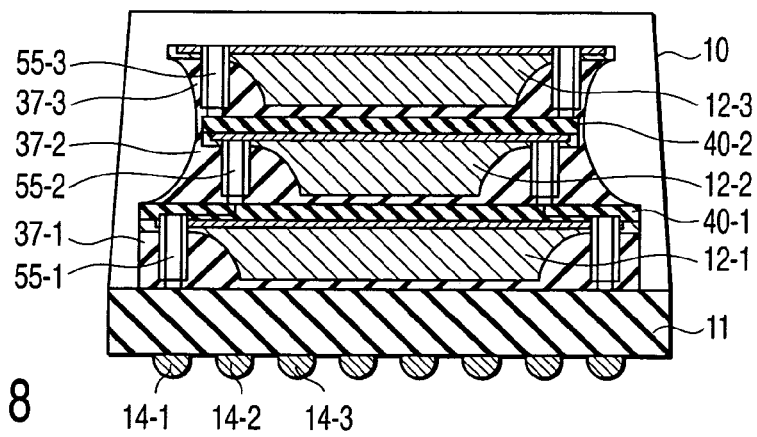
FIG. 158 is a cross sectional view showing a modification 11 of the stacked structure of semiconductor chips in a COC package type semiconductor device, for illustrating a semiconductor device according to another embodiment of this invention.

A Modification 11 of the Stacked Structure of the Semiconductor Chips in the Second Embodiment In an example shown in FIG. 158, insulating members 37-1, 37-2, 37-3 are respectively disposed between the chip mounting surface of the circuit board 11 and the backside of the first-stage semiconductor chip 12-1, between the circuit board 40-1 and the backside of the second-stage semiconductor chip 12-2 and between the circuit board 40-2 and the backside of the third-stage semiconductor chip 12-3 without using DAFs in the structure shown in FIG. 157. Further, spaces formed between the chip mounting surface of the circuit board 11 and the overhung portions of the first-stage semiconductor chip 12-1, between the circuit board 40-1 and the overhung portions of the second-stage semiconductor chip 12-2 and between the circuit board 40-2 and the overhung portions of the third-stage semiconductor chip 12-3 are respectively filled with the insulating members 37-1, 37-2, 37-3.

Figure 159:
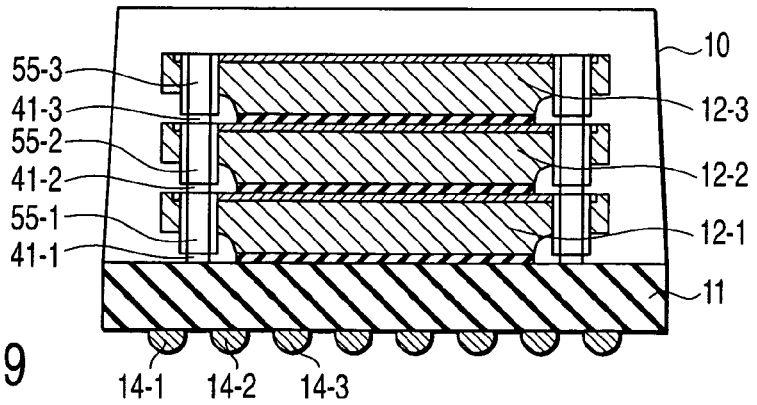
FIG. 159 is a cross sectional view showing a modification 12 of the stacked structure of semiconductor chips in a COC package type semiconductor device, for illustrating a semiconductor device according to another embodiment of this invention.
Figure 160:
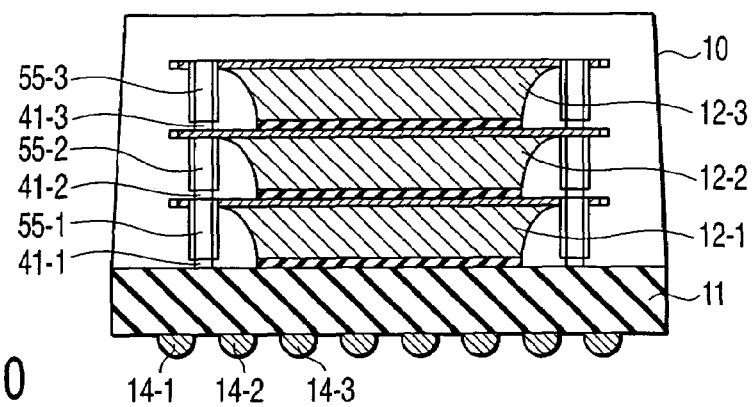
FIG. 160 is a cross sectional view showing a modification 13 of the stacked structure of semiconductor chips in a COC package type semiconductor device, for illustrating a semiconductor device according to another embodiment of this invention.

A Modification 11 of the Stacked Structure of the Semiconductor Chips in the Second Embodiment The overhung portions of FIG. 155 can be made smaller in an example shown in FIG. 159 and the overhung portions of FIG. 155 can be made larger in an example shown in FIG. 160. The size of the overhung portion can be freely set according to the size and height of the connection electrode and the projection amount of the through electrode.

Figure 161:
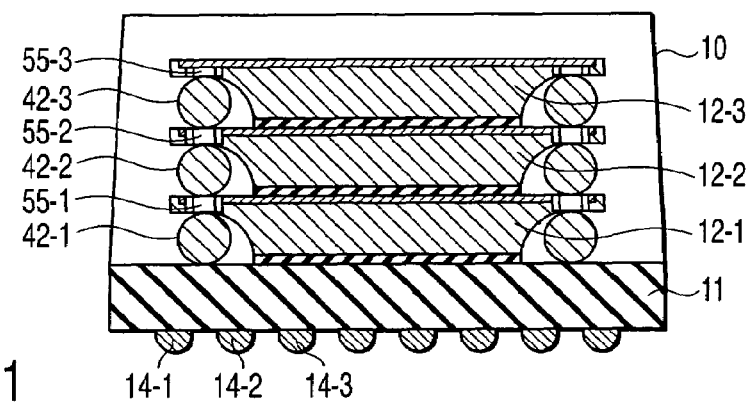
FIG. 161 is a cross sectional view showing a modification 14 of the stacked structure of semiconductor chips in a COC package type semiconductor device, for illustrating a semiconductor device according to another embodiment of this invention.

A Modification 12 of the Stacked Structure of the Semiconductor Chips in the Second Embodiment In an example shown in FIG. 161, connections between the through electrodes 55-1, 55-2, 55-3 are made by use of ball bumps (solder balls) 42-1, 42-2, 42-3.

The other basic structures are the same as those shown in FIG. 124, and therefore, the same portions are denoted by the same reference symbols and the detail explanation thereof is omitted.

Figure 162:
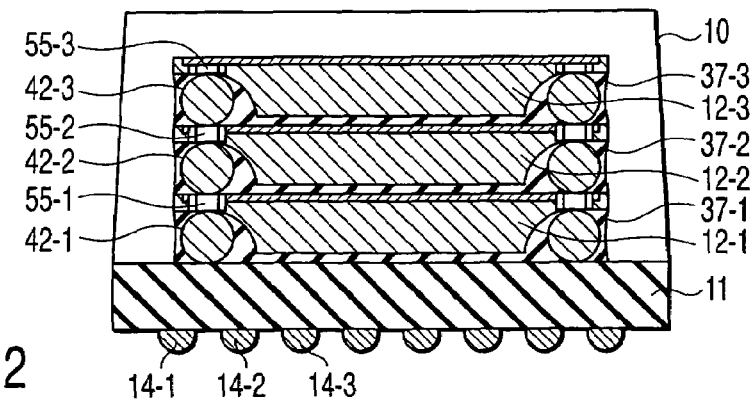
FIG. 162 is a cross sectional view showing a modification 15 of the stacked structure of semiconductor chips in a COC package type semiconductor device, for illustrating a semiconductor device according to another embodiment of this invention.

A Modification 13 of the Stacked Structure of the Semiconductor Chips in the Second Embodiment In an example shown in FIG. 162, insulating members 37-1, 37-2, 37-3 are respectively disposed between the chip mounting surface of the circuit board 11 and the backside of the first-stage semiconductor chip 12-1, between the main surface of the chip 12-1 and the backside of the second-stage semiconductor chip 12-2 and between the main surface of the chip 12-2 and the backside of the third-stage semiconductor chip 12-3 without using DAFs in the structure shown in FIG. 161. Further, spaces formed between the chip mounting surface of the circuit board 11 and the overhung portions of the first-stage semiconductor chip 12-1, between the main surface of the first-stage semiconductor chip 12-1 and the overhung portions of the second-stage semiconductor chip 12-2 and between the main surface of the second-stage semiconductor chip 12-2 and the overhung portions of the third-stage semiconductor chip 12-3 are respectively filled with the insulating members 37-1, 37-2, 37-3.

Figure 163:
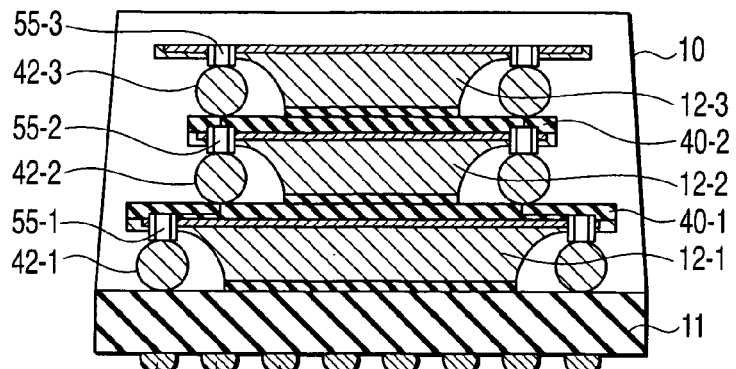
FIG. 163 is a cross sectional view showing a modification 16 of the stacked structure of semiconductor chips in a COC package type semiconductor device, for illustrating a semiconductor device according to another embodiment of this invention.

A Modification 14 of the Stacked Structure of the Semiconductor Chips in the Second Embodiment In an example shown in FIG. 163, chips with different sizes are stacked and circuit boards 40-1, 40-2 are respectively disposed between the main surface of the first-stage semiconductor chip 12-1 and the backside of the second-stage semiconductor chip 12-2 and between the main surface of the second-stage semiconductor chip 12-2 and the backside of the third-stage semiconductor chip 12-3. The through electrodes 55-1 of the chip 12-1 are connected to ball bumps 42-2 via printed wirings formed on the circuit board 40-1 and the through electrodes 55-2 of the chip 12-2 are connected to ball bumps 42-3 via printed wirings formed on the circuit board 40-2.

The same operation and effect can be attained by using a semiconductor chip having the front and backsides on which wirings are made by use of a re-wiring process or wired spacers instead of the circuit boards 40-1, 40-2.

Figure 164:
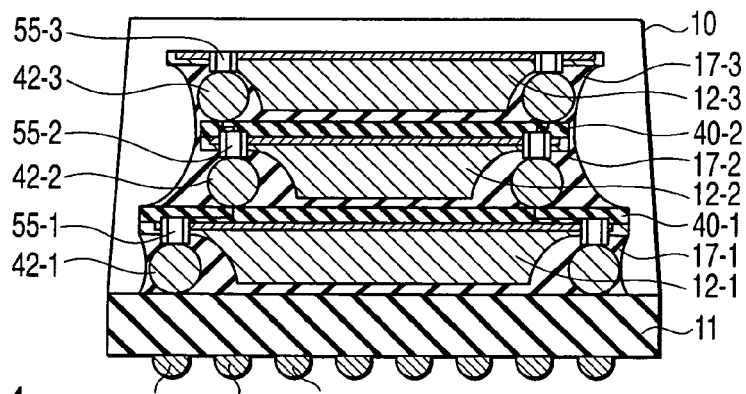

A Modification 15 of the Stacked Structure of the Semiconductor Chips in the Second Embodiment In an example shown in FIG. 164, insulating members 37-1, 37-2, 37-3 are respectively disposed between the chip mounting surface of the circuit board 11 and the backside of the first-stage semiconductor chip 12-1, between the circuit board 40-1 and the backside of the second-stage semiconductor chip 12-2 and between the circuit board 40-2 and the backside of the third-stage semiconductor chip 12-3 without using DAFs in the structure shown in FIG. 163. Further, spaces formed between the chip mounting surface of the circuit board 11 and the overhung portions of the first-stage semiconductor chip 12-1, between the circuit board 40-1 and the overhung portions of the second-stage semiconductor chip 12-2 and between the circuit board 40-2 and the overhung portions of the third-stage semiconductor chip 12-3 are respectively filled with the insulating members 37-1, 37-2, 37-3.

Like the modification 14, in the modification 15, a semiconductor chip having the front and backsides on which wirings are made by use of a re-wiring process or wired spacers can be used instead of the circuit boards 40-1, 40-2.

Figure 165:
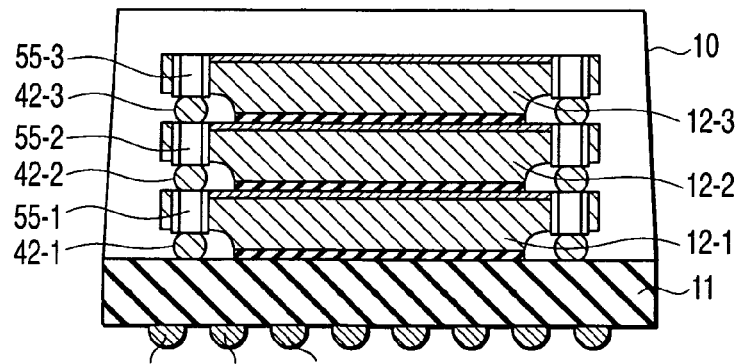
Figure 166:
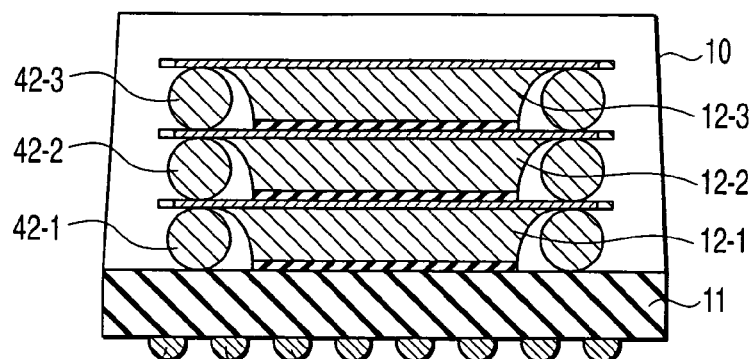

A Modification 16 of the Stacked Structure of the Semiconductor Chips in the Second Embodiment The overhung portions of FIG. 161 are made smaller in an example shown in FIG. 165 and the overhung portions of FIG. 161 are made larger in an example shown in FIG. 166. The size of the overhung portion can be freely set according to the size of the ball bumps and the projection amount of the through electrode.

Further, if the end portions of the chips 12-1, 12-2, 12-3 are made sufficiently thin as shown in FIG. 166, connection directly from the backside of the chip to the semiconductor elements can be made.

A Modification 17 of the Stacked Structure of the Semiconductor Chips in the Second Embodiment In the second embodiment and the modifications thereof, a case wherein connection electrodes such as the stud bumps, through electrodes and ball bumps are formed and mounted on the two or four opposite sides of the chip is explained as an example. However, in an example shown in FIG. 167, grooves 47-1, 47-2, 47-3 and through electrodes 55-1, 55-2, 55-3 are formed in the central portions of the chips 12-1, 12-2, 12-3 and the chips are mounted on the circuit board 11 with the connection electrodes (in this example, the stud bumps 56-1, 56-2, 56-3 are shown as an example) disposed therebetween.

The other basic structures are the same as those shown in FIG. 124, and therefore, the same portions are denoted by the same reference symbols and the detail explanation thereof is omitted.

Figure 167:
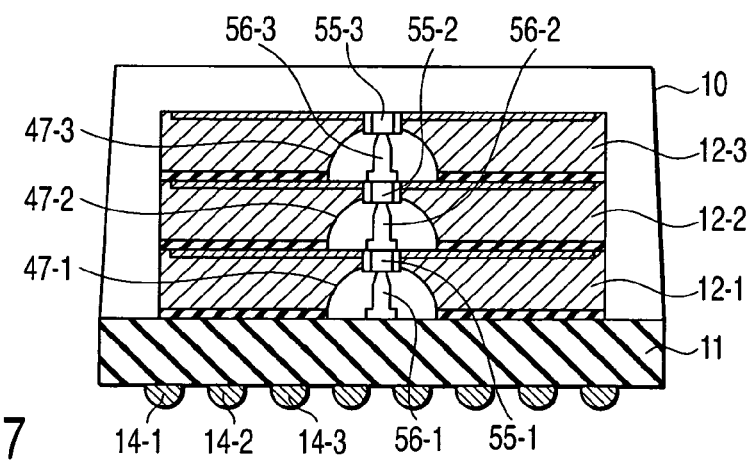
Figure 168:
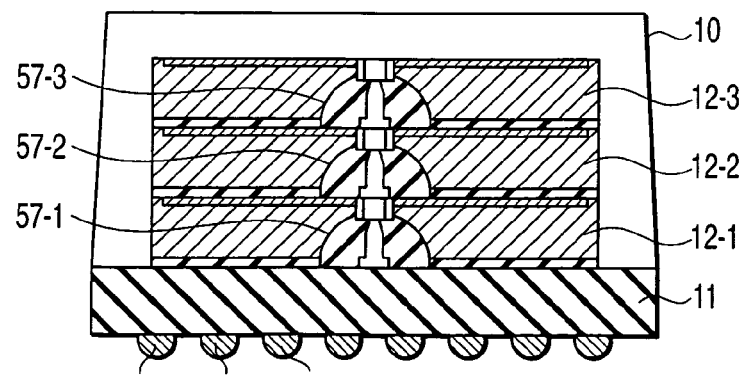

A Modification 18 of the Stacked Structure of the Semiconductor Chips in the Second Embodiment In an example shown in FIG. 168, spaces formed between the chip mounting surface of the circuit board 11 and the groove 47-1 of the first-stage semiconductor chip 12-1, between the main surface of the first-stage semiconductor chip 12-1 and the groove 47-2 of the second-stage semiconductor chip 12-2 and between the main surface of the second-stage semiconductor chip 12-2 and the groove 47-3 of the third-stage semiconductor chip 12-3 are respectively filled with insulating members 57-1, 57-2, 57-3 in the structure shown in FIG. 167.

Figure 169:
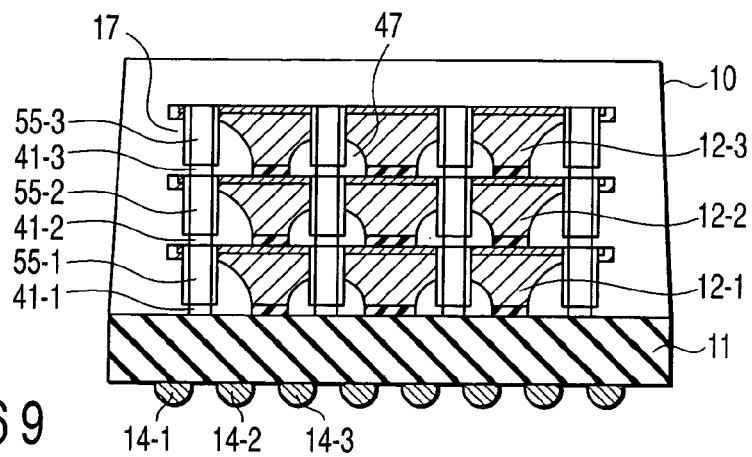

A Modification 19 of the Stacked Structure of the Semiconductor Chips in the Second Embodiment In an example shown in FIG. 169, overhung portions 17 are formed along the two or four opposite sides of the chip and grooves 47 are formed in the central portion thereof. Through electrodes 55-1, 55-2, 55-3 are formed in positions corresponding to the overhung portions 17 and grooves 47 and the chips are mounted on the circuit board 11 with plated bumps 41-1, 41-2, 41-3 disposed therebetween, respectively. The grooves 47 can be formed in desired positions corresponding to positions in which the plated bumps 41-1, 41-2, 41-3 of the lower-stage semiconductor chips are formed.

The overhung portions 17 and grooves 47 have different radii of curvature and different depths. The radii of curvature and depths of the overhung portions 17 and grooves 47 are set according to the thickness of the plated bumps 41-1, 41-2, 41-3 and the height of the through electrodes 55-1, 55-2, 55-3 of the lower-stage semiconductor chips, for example.

The other basic structures are the same as those shown in FIG. 155, and therefore, the same portions are denoted by the same reference symbols and the detail explanation thereof is omitted.

Figure 170:
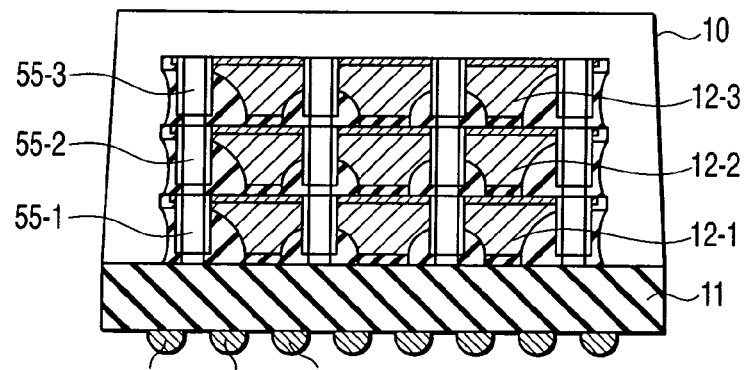

A Modification 20 of the Stacked Structure of the Semiconductor Chips in the Second Embodiment In an example shown in FIG. 170, spaces formed between the chip mounting surface of the circuit board 11 and the overhung portions and grooves of the first-stage semiconductor chip 12-1, between the main surface of the first-stage semiconductor chip 12-1 and the overhung portions and grooves of the second-stage semiconductor chip 12-2 and between the main surface of the second-stage semiconductor chip 12-2 and the overhung portions and grooves of the third-stage semiconductor chip 12-3 are respectively filled with insulating members 57-1, 57-2, 57-3 in the structure shown in FIG. 169.

The other basic structures are the same as those shown in FIG. 169 and the radii of curvature and depths of the overhung portions 17 and grooves 47 and the arrangement of the grooves 47 can be freely set according to the thickness of the plated bumps 41-1, 41-2, 41-3 and the height of the through electrodes 55-1, 55-2, 55-3 of the lower-stage semiconductor chips, positions in which the plated bumps 41-1, 41-2, 41-3 of the lower-stage semiconductor chips are formed and the like.

Figure 171:
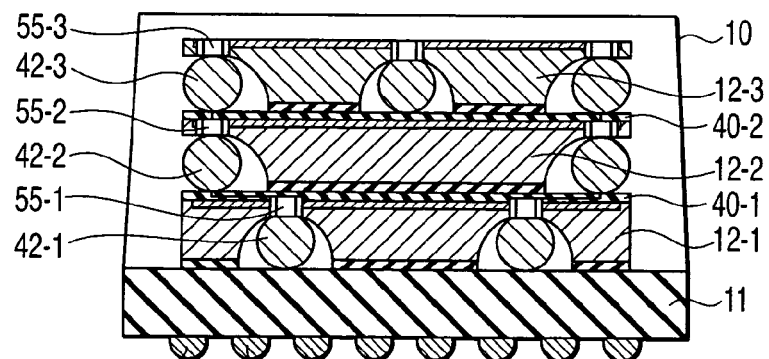

A Modification 21 of the Stacked Structure of the Semiconductor Chips in the Second Embodiment In an example shown in FIG. 171, various chips in which the forming positions of overhung portions and grooves are different are stacked. Circuit boards 40-1, 40-2 are respectively disposed between the main surface of the first-stage semiconductor chip 12-1 and the backside of the second-stage semiconductor chip 12-2 and between the main surface of the second-stage semiconductor chip 12-2 and the backside of the third-stage semiconductor chip 12-3. Further, the through electrodes 55-1 of the chip 12-1 are connected to the through electrodes 55-2 of the chip 12-2 via ball bumps 42-2 and printed wirings formed on the circuit board 40-1 and the through electrodes 55-2 of the chip 12-2 are connected to the through electrodes 55-3 of the chip 12-3 via ball bumps 42-3 and printed wirings formed on the circuit board 40-2.

Of course, the same operation and effect can be attained by using a semiconductor chip having the front and backsides on which wirings are made by use of a re-wiring process or wired spacers instead of the circuit boards 40-1, 40-2.

Further, the radii of curvature and depths of the overhung portions 17 and grooves 47 and the arrangement of the grooves 47 can be freely set according to the thickness of the plated bumps 41-1, 41-2, 41-3 and the height of the through electrodes 55-1, 55-2, 55-3 of the lower-stage semiconductor chips, positions in which the plated bumps 41-1, 41-2, 41-3 of the lower-stage semiconductor chips are formed and the like.

Figure 172:
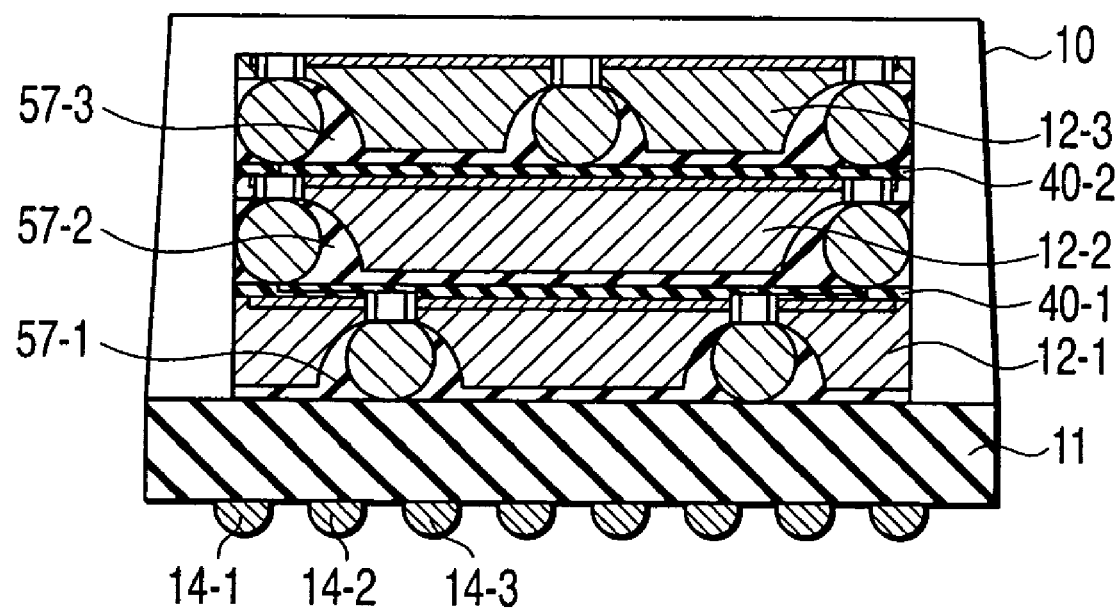

A Modification 22 of the Stacked Structure of the Semiconductor Chips in the Second Embodiment In an example shown in FIG. 172, the chips are stacked without using DAFs by respectively disposing insulating members 57-1, 57-2, 57-3 between the chip mounting surface of the circuit board 11 and the backside of the first-stage semiconductor chip 12-1, between the circuit board 40-1 and the backside of the second-stage semiconductor chip 12-2 and between the circuit board 40-2 and the backside of the third-stage semiconductor chip 12-3 in the structure shown in FIG. 171. Further, spaces formed between the chip mounting surface of the circuit board 11 and the grooves of the first-stage semiconductor chip 12-1, between the circuit board 40-1 and the overhung portions of the second-stage semiconductor chip 12-2 and between the circuit board 40-2 and the overhung portions and groove of the third-stage semiconductor chip 12-3 are respectively filled with the insulating members 57-1, 57-2, 57-3.

Like the modification 21, in the modification 22, a semiconductor chip having the front and backsides on which re-wirings are made by use of a re-wiring process or wired spacers can be used instead of the circuit boards 40-1, 40-2.

A Modification 23 of the Stacked Structure of the Semiconductor Chips in the Second Embodiment In the second embodiment and the modifications 1 to 22, a case wherein the DAF has substantially the same size as the bottom surface of the semiconductor chip is shown. However, if the semiconductor chips are formed by the manufacturing steps shown in FIGS. 127A, 127B to 134A, 134B, for example, the size of the DAF becomes equal to the size of the main surface of each semiconductor chip.

Even if the chips to which the DAFs each having the same size as the main surface of the semiconductor chip are attached are stacked in the same manner as in the second embodiment and the modifications 1 to 22 thereof, substantially the same operation and effect can be attained.

Next, modifications of the manufacturing process are explained with reference to FIGS. 173A, 173B to 179A, 179B.

A Modification 1 of the Manufacturing Process in the Second Embodiment

FIGS. 173A, 173B to FIGS. 179A, 179B illustrate another manufacturing process of the COC package type semiconductor device, FIGS. 173A to 179A are perspective views and FIGS. 173B to 179B are cross sectional views of FIGS. 173A to 179A.

First, semiconductor elements are formed on the main surface of the semiconductor wafer and then through electrodes electrically connected to the semiconductor elements are formed by a known manufacturing process. The through electrodes can be formed to penetrate through the semiconductor wafer, but if they are formed to shallow depth so as to be exposed in the later backside grinding step, they can be easily formed and the manufacturing cost can be lowered.

Next, as shown in FIGS. 173A, 173B, first grooves 22-1, 22-2, 22-3, . . . are formed along dicing lines or chip dividing lines in the main surface of the semiconductor wafer 20 by use of a diamond blade 21 or the like (half-cut dicing).

Next, as shown in FIGS. 174A, 174B, a BSG tape (surface protection tape) 23 is attached to the main surface (element forming surface) of the semiconductor wafer 20 and second grooves 25-1, 25-2, . . . used to form the overhung portions are formed along the dicing lines or chip dividing lines in the backside of the semiconductor wafer 20 by use of a diamond blade 24. The second grooves 25-1, 25-2, . . . are formed in positions corresponding to the two opposite sides of each semiconductor chip 12 as shown in FIGS. 135A, 135B or formed in positions corresponding to the four opposite sides of each semiconductor chip 12 as shown in FIGS. 144A, 144B. In the case of FIGS. 174A, 174B, an example in which the grooves are formed in positions corresponding to the four opposite sides is shown. The second grooves 25-1, 25-2, ... are formed in positions on the backside corresponding to connection electrodes between adjacent semiconductor chips to have openings which are wider than regions between the connection electrodes of the adjacent semiconductor chips and are formed to depth to reach at least the first grooves 22-1, 22-2, 22-3 ....

Next, as shown in FIGS. 175A, 175B, the backside of the semiconductor wafer is ground by use of a grinding stone 26 or the like so as to finish the wafer to desired thickness. As a result, the semiconductor wafer 20 is discretely divided to form semiconductor chips 12, 12, ....

Next, as shown in FIGS. 176A, 176B, the backside of the semiconductor wafer 20 (discretely divided semiconductor chips 12, 12, ...) is subjected to a plasma etching, wet etching or CMP process and thus the through electrodes 55 are protruded from the backside. In FIGS. 176A, 176B, the working process by a polishing device 38 for the CMP process is shown as a representative.

After this, as shown in FIGS. 177A, 177B, the semiconductor wafer 20 is placed on a stage 31, a dicing tape 28 is attached to the backside by use of a roller 29 or the like and thus the semiconductor wafer is mounted on a wafer ring 30.

Next, as shown in FIGS. 178A, 178B, the surface protection tape 23 is separated.

Then, as shown in FIGS. 179A, 179B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be brought into direct contact with the backside of the chip 12 and are further pushed upwardly to separate the chip 12 from the dicing tape 28. At this time, the pickup needles 33 are brought into contact with the thick portions of the chip 12 and pushed upward to separate the chip from the dicing tape 28. The chip is fed with the chip surface attracted by a collet 34.

Next, the chips 12 thus fed by the collet 34 are sequentially stacked on a circuit board 11 having external connection electrodes 14-1, 14-2, ... by die bonding and mounted thereon with connection electrodes such as stud bumps, through electrodes or ball bumps disposed therebetween. When the chips are mounted, the chips are stacked so as to set the overhung portions in positions corresponding to the connection electrodes formed on the circuit board 11 or the connection electrodes formed on the through electrodes of the semiconductor chip arranged in the lower stage. Thus, spaces to accommodate the through electrodes are formed between the overhung portions and the surface of the circuit board 11 or the main surface of the chip 12 arranged in the lower stage. When the chip 12 is die-bonded, connection between the connection electrodes can be made stronger by application of ultrasonic waves.

Then, the stacked semiconductor chips, connection electrodes and the chip mounting surface of the circuit board 11 are covered with resin mold or the like to form a package 10.

A Modification 2 of the Manufacturing Process in the Second Embodiment

FIGS. 180A, 180B to FIGS. 187A, 187B illustrate still another manufacturing process of the COC package type semiconductor device, FIGS. 180A to 187A are perspective views and FIGS. 180B to 187B are cross sectional views of FIGS. 180A to 187A.

First, semiconductor elements are formed on the main surface of the semiconductor wafer and then through electrodes electrically connected to the semiconductor elements are formed by a known manufacturing process. The through electrodes can be formed to penetrate through the semiconductor wafer, but if they are formed to shallow depth so as to be exposed in the later backside grinding step, they can be easily formed and the manufacturing cost can be lowered.

Next, as shown in FIGS. 180A, 180B, first grooves 22-1, 22-2, 22-3, ... are formed along dicing lines or chip dividing lines in the main surface of the semiconductor wafer 20 by use of a diamond blade 21 or the like (half-cut dicing). The depth of the first grooves 22-1, 22-2, 22-3, ... is made smaller than the thickness of the finally obtained chips.

After this, as shown in FIGS. 181A, 181B, a BSG tape (surface protection tape) 23 is attached to the main surface (element forming surface) of the semiconductor wafer 20 and the backside of the wafer is ground so as to finish the wafer to desired thickness by use of a grinding stone 26 or the like. At this time, the backside of the wafer is so ground that the ground surface will not reach the first grooves 22-1, 22-2, 22-3, ....

Then, as shown in FIGS. 182A, 182B, the backside of the semiconductor wafer 20 is subjected to a plasma etching, wet etching or CMP process and thus the through electrodes 55 are protruded from the backside of the wafer. In FIGS. 182A, 182B, the working process by a polishing device 38 for the CMP process is shown as a representative.

Next, as shown in FIGS. 183A, 183B, the semiconductor wafer 20 is placed on a stage 31 and a DAF 27 is attached to the backside by use of a roller 29 or the like.

After this, as shown in FIGS. 184A, 184B, second grooves 25-1, 25-2, ... used to form the overhung portions are formed along the dicing lines or chip dividing lines in the backside of the semiconductor wafer 20 by use of a diamond blade 24. At this time, the DAF 27 is also cut apart for each chip. The second grooves 25-1, 25-2, ... are formed in positions corresponding to the two opposite sides of each semiconductor chip 12 as shown in FIGS. 135A, 135B or formed in positions corresponding to the four opposite sides of each semiconductor chip 12 as shown in FIGS. 144A, 144B. In the case of FIGS. 184A, 184B, an example in which the grooves are formed in positions corresponding to the four opposite sides is shown. The second grooves 25-1, 25-2, ... are formed in positions on the backside corresponding to connection electrodes between adjacent semiconductor chips to have openings which are wider than regions between the connection electrodes of the adjacent semiconductor chips and are formed to depth to reach at least the first grooves 22-1, 22-2, 22-3 .... Thus, the semiconductor wafer 20 is discretely divided to form semiconductor chips 12, 12, ....

Next, as shown in FIGS. 185A, 185B, the semiconductor wafer 20 is placed on a stage 31, a dicing tape 28 is attached to the backside by use of a roller 29 or the like and thus the semiconductor wafer is mounted on a wafer ring 30.

Next, as shown in FIGS. 186A, 186B, the surface protection tape 23 is separated.

Then, as shown in FIGS. 187A, 187B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be brought into direct contact with the backside of the chip 12 and are further pushed upwardly to separate the chip 12 from the dicing tape 28. At this time, the pickup needles 33 are brought into contact with the thick portions of the chip 12 and pushed upward to separate the chip from the dicing tape 28. The separated chip is fed with the chip surface attracted by a collet 34.

Next, the chips 12 thus fed by the collet 34 are sequentially stacked on a circuit board 11 having external connection electrodes 14-1, 14-2, ... by die bonding and mounted thereon with connection electrodes such as stud bumps, through electrodes or ball bumps disposed therebetween. When the chips are mounted, the chips are stacked so as to set the overhung portions in positions corresponding to the connection electrodes formed on the circuit board 11 or the connection electrodes formed on the through electrodes of the semiconductor chip arranged in the lower stage. Thus, spaces to accommodate the through electrodes are formed between the overhung portions and the surface of the circuit board 11 or the main surface of the chip 12 arranged in the lower stage. When the chip 12 is die-bonded, connection between the connection electrodes can be made stronger by application of ultrasonic waves.

Then, the stacked semiconductor chips, connection electrodes and the chip mounting surface of the circuit board 11 are covered with resin mold or the like to form a package 10.

A Modification 3 of the Manufacturing Process in the Second Embodiment

FIGS. 188A, 188B to FIGS. 195A, 195B illustrate still another manufacturing process of the COC package type semiconductor device, FIGS. 188A to 195A are perspective views and FIGS. 188B to 195B are cross sectional views of FIGS. 188A to 195A.

First, semiconductor elements are formed on the main surface of the semiconductor wafer and then through electrodes electrically connected to the semiconductor elements are formed by a known manufacturing process. The through electrodes can be formed to penetrate through the semiconductor wafer, but if they are formed to shallow depth so as to be exposed in the later backside grinding step, they can be easily formed and the manufacturing cost can be lowered.

Next, as shown in FIGS. 188A, 188B, first grooves 22-1, 22-2, 22-3, . . . are formed along dicing lines or chip dividing lines in the main surface of the semiconductor wafer 20 by use of a diamond blade 21 or the like (half-cut dicing). The depth of the first grooves 22-1, 22-2, 22-3, . . . is made smaller than the thickness of the finally obtained chips.

After this, as shown in FIGS. 189A, 189B, a BSG tape (surface protection tape) 23 is attached to the main surface (element forming surface) of the semiconductor wafer 20 and the backside thereof is ground to finish the wafer to desired thickness by use of a grinding stone 26 or the like. At this time, the backside of the wafer is ground so that the ground surface will not reach the first grooves 22-1, 22-2, 22-3, . . . .

Then, as shown in FIGS. 190A, 190B, the semiconductor wafer 20 is placed on a stage 31 and a DAF 27 is affixed to the backside thereof by use of a roller 29 or the like.

Next, as shown in FIGS. 191A, 191B, second grooves 25-1, 25-2, . . . used to form the overhung portions are formed along the dicing lines or chip dividing lines in the backside of the semiconductor wafer 20 by use of a diamond blade 24. At this time, the DAF 27 is also cut apart for each chip. The second grooves 25-1, 25-2, are formed in positions corresponding to the two opposite sides of each semiconductor chip 12 as shown in FIGS. 135A, 135B or formed in positions corresponding to the four opposite sides of each semiconductor chip 12 as shown in FIGS. 144A, 144B. In the case of FIGS. 191A, 191B, an example in which the grooves are formed in positions corresponding to the four opposite sides is shown. The second grooves 25-1, 25-2, . . . are formed in position on the backside corresponding to connection electrodes between adjacent semiconductor chips to have openings which are wider than regions between the connection electrodes of the adjacent semiconductor chips and are formed to depth to reach at least the first grooves 22-1, 22-2, 22-3 . . . .

Thus, the semiconductor wafer 20 is discretely divided to form semiconductor chips 12, 12, . . . .

Figure 192A:
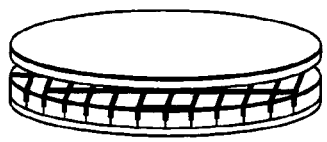
Figure 192B:
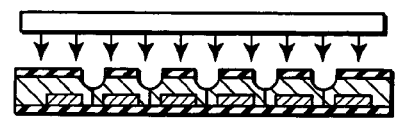

After this, as shown in FIGS. 192A, 192B, the backside of the semiconductor wafer 20 is subjected to a plasma etching, wet etching or CMP process to remove working distortions such as grinding distortions or grinding scratches by etching the side walls of the second grooves 25-1, 25-2, . . . and protrude the through electrodes 55 from the backside of the wafer. In FIGS. 192A, 192B, the working process by the plasma etching process is shown as a representative. When the plasma etching or wet etching process is performed, a material which is not melted or removed by the etching process, for example, a dry film or resist film is used as the DAF 27.

Figure 193A:
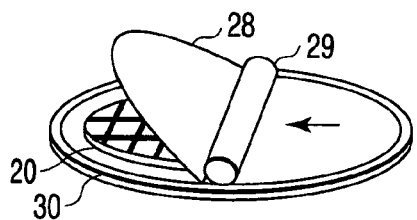
Figure 193B:
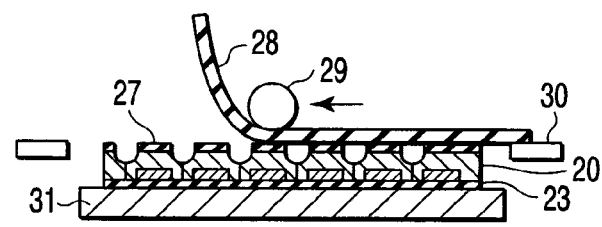

Next, as shown in FIGS. 193A, 193B, the semiconductor wafer 20 is placed on a stage 31, a dicing tape 28 is attached to the backside thereof by use of a roller 29 or the like and thus the semiconductor wafer is mounted on a wafer ring 30.

Figure 194A:
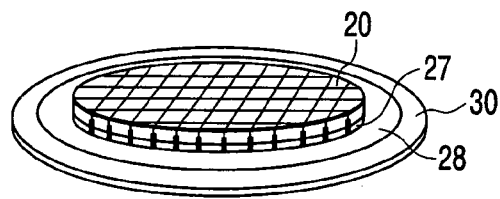
Figure 194B:
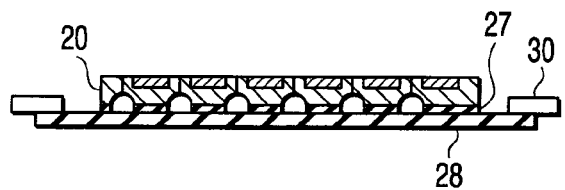

Next, as shown in FIGS. 194A, 194B, the surface protection tape 23 is separated.

Figure 195A:
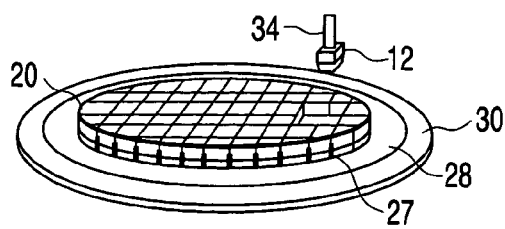
Figure 195B:
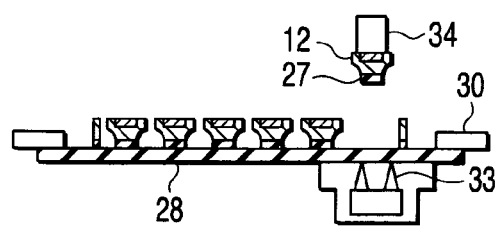

Then, as shown in FIGS. 195A, 195B, the chips (good chips) are separated from the dicing tape 28 and picked up for each chip. In the pickup step, the backside of the dicing tape 28 is pushed up for each chip 12 by use of pickup needles 33 and the needles penetrate through the dicing tape 28 so as to be brought into direct contact with the backside of the chip 12 and are further pushed upwardly to separate the chip 12 from the dicing tape 28. At this time, the pickup needles 33 are brought into contact with the thick portions of the chip 12 and pushed upward to separate the chip from the dicing tape 28. The separated chip is fed with the chip surface attracted by a collet 34.

Next, the chips 12 thus fed by the collet 34 are sequentially stacked on a circuit board 11 having external connection electrodes 14-1, 14-2, . . . by die bonding and mounted thereon with connection electrodes such as stud bumps, through electrodes or ball bumps disposed therebetween. When the chips are mounted, the chips are stacked so as to set the overhung portions in positions corresponding to the connection electrodes formed on the circuit board 11 or the connection electrodes formed on the through electrodes of the semiconductor chip arranged in the lower stage. Thus, spaces to accommodate the through electrodes are formed between the overhung portions and the surface of the circuit board 11 or the main surface of the chip 12 arranged in the lower stage. When the chip 12 is die-bonded, connection between the connection electrodes can be made stronger by application of ultrasonic waves.

Then, the stacked semiconductor chips, connection electrodes and the chip mounting surface of the circuit board 11 are covered with resin mold or the like to form a package 10.

A Modification 4 of the Manufacturing Process in the Second Embodiment

In the second embodiment, grooves 25-1, 25-2, . . . may be formed in the backside of the semiconductor wafer 20 before the half-cutting process. After this, the backside may be ground and etched, a dicing tape 28 may be attached to the backside of the semiconductor chip 20 and the semiconductor wafer can be diced from the main surface to form chips 12.

A Modification 5 of the Manufacturing Process in the Second Embodiment

In the second embodiment and the modifications thereof, a blade system is used when the first and second grooves are formed, but it is possible to use a laser system (grooves and the improvement of the interior quality), cutter, etching (RIE, for example) process or wire scribing process, for example, and a combination of a plurality of methods can be used.

A Modification 6 of the Manufacturing Process in the Second Embodiment

As the DAF in the second embodiment and the modifications thereof, polyimide-series or epoxy-series resin can be used. Further, a material of a component which is not etched can be used.

A Modification 7 of the Manufacturing Process in the Second Embodiment

A case wherein the DAF is cut apart by use of the blade system is shown as an example, but the DAF can be cut apart by use of a laser system (grooves and the improvement of the interior quality), cutter, etching process or wire scribing process.

A Modification 8 of the Manufacturing Process in the Second Embodiment

A case wherein the pickup step is performed by use of the pin system is explained, but various systems such as the pinless system, ultrasonic wave system and tepeless system can be used.

A Modification 9 of the Manufacturing Process in the Second Embodiment

The wire bonding system can be applied to either the positive bonding (including the reverse bonding like positive bonding) or the reverse bonding.

A Modification 10 of the Manufacturing Process in the Second Embodiment

The sealing step into the package 10 is not limited to the mold (resin sealing) system, but a film sealing system or a potting system of dropping liquid resin and sealing can be applied.

Next, various manufacturing methods for filling spaces with insulating members or adhering chips by use of insulating members and filling spaces with the insulating members are explained with reference to FIGS. 196A, 196B to 200A, 200B.

An Example 1 of the Process of Filling Spaces with Insulating Members

FIGS. 196A, 196B show an example of the process of filling spaces under the overhung portions with insulating members. The process shown in FIGS. 196A, 196B is to mount a chip by use of a DAF and fill spaces with insulating members and shows a state in which a first-stage chip 12-1 is mounted on a circuit board 11. An insulating material such as an insulating bonding agent or sealing resin is supplied from a dispenser nozzle 36 onto connection electrodes (in this example, ball bumps 42-2 are shown as an example) of the chip 12-1. A semiconductor chip 12-2 formed in the above process is stacked and mounted on the chip 12-1 with a DAF disposed therebetween. When the chip 12-2 is stacked and mounted on the chip 12-1, the overhung portions thereof are set to correspond in position to the ball bumps 42-2 of the chip 12-1 arranged in the lower stage. Thus, spaces formed between the main surface of the chip 12-1 arranged in the lower stage and the overhung portions of the chip 12-2 to be stacked are filled with insulating members 57-2.

An Example 2 of the Process of Filling Spaces with Insulating Members

In the example 1 of the process, the insulating member 57-1 is supplied to a region in which the ball bumps and through electrodes formed on the two opposite sides of the chip 12-1 are formed. However, when the ball bumps and through electrodes are formed along the four sides of the chip 12-2, an insulating member 57-2 is formed along the four sides as shown in FIGS. 197A, 197B.

Of course, it is possible to form the insulating member along the four sides of the chip when the through electrodes and ball bumps are formed only on the two sides of the chip.

An Example 3 of the Process of Filling Spaces with Insulating Members

As shown in FIGS. 198A, 198B, an insulating member such as resin may be dropped from a dispenser nozzle 36 onto the chip 12-1. The manufacturing method is adequately applied to the structure in which the chips are stacked and mounted without using DAFs. When the chip 12-2 is mounted on the chip 12-1, spaces are filled with the insulating member 57-2 pushed out from under the backside of the chip 12-2 to the peripheral portion thereof.

An Example 4 of the Process of Filling Spaces with Insulating Members

As shown in FIGS. 199A, 199B, an insulating member 57-2 such as resin may be caused to flow out from a dispenser nozzle 36 onto the chip 12-1 and may be coated to cover the surface of the chip 12-1. Also, the manufacturing method is adequately applied to the structure in which the chips are stacked and mounted without using DAFs. When the chip 12-2 is mounted on the chip 12-1, spaces are filled with the insulating member 57-2 pushed out from under the backside of the chip 12-2 to the peripheral portion thereof.

An Example 5 of the Process of Filling Spaces with Insulating Members

As shown in FIG. 200A, an insulating member such as resin can be formed on the overhung portions of the chip 12-2, and as shown in FIG. 200B, spaces can be filled with the insulating member when the chip 12-2 is mounted.

An Example 6 of the Process of Filling Voids with Insulating Members

In the examples 1 to 5 of the process, a one-point nozzle system is explained, but a multi-point nozzle system, a system for scanning by use of the one-point nozzle system (a single stroke of the nozzle) can be used. Further, the chip can be dipped into a tray in which resin is contained so as to adhere the resin to the backside of the chip. In addition, a transfer system can be used and various combinations of the transfer systems of transfer to the central portion of the main surface of the lower-stage chip, transfer onto the connection electrodes and transfer onto the chip central portion and connection electrodes can be used.

An Example 7 of the Process of Filling Spaces with Insulating Members

As the insulating member, various types of insulating materials such as a DAF material (die attach film), insulating paste, under-fill material, liquid resin, potting resin, B-stage resin (epoxy-series) and the like can be used.

Therefore, with the structures according to the second embodiment of this invention and the modifications thereof, the package can be made thin since the connection electrodes are accommodated into the accommodating portions formed by the overhung portions and grooves of the semiconductor chip and the chips are stacked in a multi-layered form. If the package thickness is kept unchanged, the number of stacked stages of the chips can be increased.

According to the manufacturing method of the second embodiment of this invention and the modifications thereof, occurrence of chippings can be reduced since the semiconductor wafer is discretely divided by grinding the backside. Further, since the thickness of the central portion of the chip can be increased, the warping amount of the chip can be reduced and it becomes easy to deal with the chip. In addition, occurrence of a recognition error at the time of position detection performed by using an optical system such as a TV camera can be reduced. Also, occurrence of chip cracks at the pickup time can be suppressed and formation of voids at the die-bonding time can be suppressed. As a result, the manufacturing cost can be lowered and the productivity can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a circuit board having external connection electrodes; and
   a plurality of semiconductor chips which are stacked and mounted on the circuit board and each of which is mounted on the circuit board by means of wire bonding,
   wherein at least one of the semiconductor chips stacked on the circuit board includes:
   bonding pads which are arranged on a main surface thereof along at least one side of the semiconductor chip and electrically connected to semiconductor elements,
   overhung portions formed in positions of a backside of the semiconductor chip corresponding to the bonding pads, each having a start point inside the bonding pad, formed to have a surface which becomes thinner in a direction toward an outer periphery to an end point which reaches a side wall thereof, and forming a space to accommodate ball bonding portions between at least one of the overhung portions and a main surface of a semiconductor chip arranged in a lower stage, and
   insulating layers which are formed to cover the overhung portions and prevent contact with bonding wires of the semiconductor chip arranged in the lower stage,
   the semiconductor device further comprising:
   insulating members which fill gaps defined by the overhung portions between the stacked semiconductor chips, and also fix and seal the ball bonding portions; and
   a package which seals the stacked semiconductor chips, the insulating members, the bonding wires, and a mounting surface side of the circuit board,
   wherein the surface of each of the overhung portions is mirror-finished.

2. The semiconductor device according to claim 1, wherein the external connection electrodes are formed of one of solder balls and pins arranged in an array form on the circuit board.

3. The semiconductor device according to claim 1, wherein the overhung portion is formed to have one of a curved surface whose radius of curvature is 0.05 mm to 2.5 mm and a compound surface having a plane and a curved surface whose radius of curvature is 0.05 mm to 2.5 mm.

4. The semiconductor device according to claim 1, wherein the overhung portion is formed to have one of a plane having a constant inclination angle and a compound plane having planes whose inclination angles are made smaller in a direction from the start point towards the end point.

5. A semiconductor device comprising:
   a circuit board having external connection electrodes; and
   a plurality of semiconductor chips stacked and mounted on the circuit board, the semiconductor chips being mounted on the circuit board with connection electrodes disposed therebetween,
   wherein at least one of the semiconductor chips includes:
   through electrodes formed in through holes which penetrate through the semiconductor chip with an insulating film disposed therebetween and electrically connected to semiconductor elements, and
   one of overhung portions and grooves formed in positions corresponding to the through electrodes on a backside of the semiconductor chip and forming accommodating portions which accommodate the connection electrodes between one of the overhung portions and grooves and one of the circuit board and a main surface of the semiconductor chip arranged in a lower stage, the one of the overhung portions and grooves being formed to have a curved surface which becomes thinner in a direction toward an outer periphery, wherein the curved surface is mirror-finished,
   the semiconductor device further comprising:
   insulating members which fill accommodating portions defined by the overhung portions or the grooves, and also fix and seal the connection electrodes; and
   a package which seals the stacked semiconductor chips, the insulating members, the connection electrodes, and a mounting surface side of the circuit board.

6. The semiconductor device according to claim 5, wherein the external connection electrodes are formed of one of solder balls and pins arranged in an array form on the circuit board.

7. The semiconductor device according to claim 5, wherein at least one of the overhung portions is formed on at least one side of a backside of the semiconductor chip to have a start point inside the through electrodes, becomes thinner in a direction towards an outer periphery to an end point reaching a side wall and have one of a curved surface with a radius of curvature of 0.05 mm to 2.5 mm, a compound surface having a plane and a curved surface with a radius of curvature of 0.01 mm to 2.5 mm, a plane having a constant inclination angle, and a compound plane having planes whose inclination angles are made smaller in a direction from the start point towards the end point.

8. The semiconductor device according to claim 5, wherein at least one of the grooves is formed on at least one side of a backside of the semiconductor chip to have a start point inside the through electrodes, becomes thinner in a direction towards an outer periphery to an end point reaching a side wall and have one of a curved surface with a radius of curvature is 0.05 mm to 2.5 mm, a compound surface having a plane and a curved surface with a radius of curvature of 0.01 mm to 2.5 mm, a plane having a constant inclination angle, and a compound plane having planes whose inclination angles are made smaller in a direction from the start point towards the end point.

9. The semiconductor device according to claim 5, wherein the connection electrodes are one of stud bumps and ball bumps.

10. The semiconductor device according to claim 1, wherein the insulating members and the insulating layers are made of different materials.

11. The semiconductor device according to claim 5, further comprising insulating layers which are formed to cover the overhung portions and prevent contact with the connection electrodes, wherein the insulating members and the insulating layers are made of different materials.

12. The semiconductor device according to claim 1, wherein a degree of roughness of the surface of each of the overhung portions is #2000 or less.

13. The semiconductor device according to claim 5, wherein a degree of roughness of the surface of each of the overhung portions is #2000 or less.

* * * * *

UNITED STATES PATENT AND TRADEMARK OFFICE
CERTIFICATE OF CORRECTION

PATENT NO. : 7,675,153 B2  Page 1 of 1
APPLICATION NO. : 11/344063
DATED : March 9, 2010
INVENTOR(S) : Kurosawa et al.

It is certified that error appears in the above-identified patent and that said Letters Patent is hereby corrected as shown below:

Claim 7, column 50, line 29, change "have one" to --has one--.

Claim 8, column 50, line 41, change "have one" to --has one--.

Claim 8, column 50, line 42, change "is" to --of--.

Signed and Sealed this

Fourth Day of May, 2010

David J. Kappos
*Director of the United States Patent and Trademark Office*